US012095440B2

(12) United States Patent
Ohshima et al.

(10) Patent No.: US 12,095,440 B2
(45) Date of Patent: Sep. 17, 2024

(54) SEMICONDUCTOR DEVICE

(71) Applicant: Semiconductor Energy Laboratory Co., Ltd., Atsugi (JP)

(72) Inventors: Kazuaki Ohshima, Atsugi (JP); Hitoshi Kunitake, Isehara (JP); Yuto Yakubo, Atsugi (JP); Takayuki Ikeda, Atsugi (JP)

(73) Assignee: Semiconductor Energy Laboratory Co., Ltd., Atsugi (JP)

( * ) Notice: Subject to any disclaimer, the term of this patent is extended or adjusted under 35 U.S.C. 154(b) by 350 days.

(21) Appl. No.: 17/765,046

(22) PCT Filed: Oct. 5, 2020

(86) PCT No.: PCT/IB2020/059313
§ 371 (c)(1),
(2) Date: Mar. 30, 2022

(87) PCT Pub. No.: WO2021/074737
PCT Pub. Date: Apr. 22, 2021

(65) Prior Publication Data
US 2022/0352865 A1 Nov. 3, 2022

(30) Foreign Application Priority Data
Oct. 17, 2019 (JP) .................. 2019-190550

(51) Int. Cl.
*H03H 7/38* (2006.01)
*H01L 21/02* (2006.01)
(Continued)

(52) U.S. Cl.
CPC ......... *H03H 7/38* (2013.01); *H01L 21/02565* (2013.01); *H01L 21/822* (2013.01);
(Continued)

(58) Field of Classification Search
CPC ............... H03H 7/38; H01L 21/02565; H01L 21/822; H01L 27/088; H03F 3/19; H03F 3/60
See application file for complete search history.

(56) References Cited

U.S. PATENT DOCUMENTS 9,349,454 B2   5/2016   Ikeda. et al.
9,590,594 B2   3/2017   Kozuma
(Continued)

FOREIGN PATENT DOCUMENTS

DE   112015001241       11/2016
JP   2015-181081 A      10/2015
(Continued)

OTHER PUBLICATIONS

Yamazaki.S et al., "Properties of crystalline In—Ga—Zn-oxide semiconductor and its transistor characteristics", Jpn. J. Appl. Phys. (Japanese Journal of Applied Physics) , Mar. 31, 2014, vol. 53, No. 4S, pp. 04ED18-1-04ED18-10.
(Continued)

*Primary Examiner* — Stephen E. Jones
(74) *Attorney, Agent, or Firm* — Eric J. Robinson; Robinson Intellectual Property Law Office, P.C.

(57) ABSTRACT

An amplifier is formed in a wiring layer. A semiconductor device includes a second layer over a first layer with a metal oxide therebetween. The first layer includes a first transistor including a first semiconductor layer containing silicon. The second layer includes an impedance matching circuit, and the impedance matching circuit includes a second transistor including a second semiconductor layer containing gallium. The first transistor forms first coupling capacitance between the first transistor and the metal oxide, and the impedance matching circuit forms second coupling capacitance between the impedance matching circuit and the metal oxide. The impedance matching circuit is electrically connected to the metal oxide through the second coupling
(Continued)

capacitance. The metal oxide inhibits the influence of first radiation noise emitted from the impedance matching circuit on the operation of the first transistor.

6 Claims, 29 Drawing Sheets

(51) Int. Cl.
*H01L 21/822* (2006.01)
*H01L 27/088* (2006.01)
*H03F 3/19* (2006.01)
*H03F 3/60* (2006.01)

(52) U.S. Cl.
CPC ............ *H01L 27/088* (2013.01); *H03F 3/19* (2013.01); *H03F 3/60* (2013.01)

(56) References Cited

U.S. PATENT DOCUMENTS

| | | | |
|---|---|---|---|
| 10,002,656 B2 | 6/2018 | Ikeda et al. |
| 10,222,848 B2 | 3/2019 | Kurokawa. et al. |
| 11,137,813 B2 | 10/2021 | Kurokawa. et al. |
| 2002/0130323 A1 | 9/2002 | Miyanaga et al. |
| 2006/0273166 A1 | 12/2006 | Ohshima |
| 2008/0174408 A1 | 7/2008 | Takahashi |
| 2012/0161536 A1 | 6/2012 | Kamata et al. |
| 2012/0187771 A1 | 7/2012 | Kamata et al. |
| 2012/0286143 A1 | 11/2012 | Hirose |
| 2012/0292613 A1 | 11/2012 | Shionoiri et al. |
| 2013/0258746 A1 | 10/2013 | Kurokawa |
| 2013/0285049 A1 | 10/2013 | Ohmaru et al. |
| 2013/0297874 A1 | 11/2013 | Kurokawa |
| 2013/0297889 A1 | 11/2013 | Fujita |
| 2013/0326157 A1 | 12/2013 | Hara |
| 2015/0255157 A1 | 9/2015 | Ikeda et al. |
| 2015/0256157 A1 | 9/2015 | Kozuma |
| 2016/0149573 A1 | 5/2016 | Maehashi. et al. |
| 2016/0284711 A1 | 9/2016 | Takemura |
| 2017/0017285 A1 | 1/2017 | Kurokawa. et al. |
| 2017/0033109 A1 | 2/2017 | Yamazaki |
| 2017/0069596 A1 | 3/2017 | Pillarisetty et al. |

FOREIGN PATENT DOCUMENTS

| | | |
|---|---|---|
| JP | 2015-188209 A | 10/2015 |
| KR | 2015-0104518 A | 9/2015 |
| KR | 2015-0105214 A | 9/2015 |
| KR | 2016-0132895 A | 11/2016 |
| TW | 201539411 | 10/2015 |
| TW | 201543805 | 11/2015 |
| TW | 201547200 | 12/2015 |
| WO | WO-2015/136401 | 9/2015 |
| WO | WO-2015/147835 | 10/2015 |

OTHER PUBLICATIONS

Yamazaki.S et al., "Research, Development, and Application of Crystalline Oxide Semiconductor", SID Digest '12 : SID International Symposium Digest of Technical Papers, Jun. 5, 2012, vol. 43, No. 1, pp. 183-186.
International Search Report (Application No. PCT/IB2020/059313) Dated Jan. 19, 2021.
Written Opinion (Application No. PCT/IB2020/059313) Dated Jan. 19, 2021.

10A

FIG. 11A
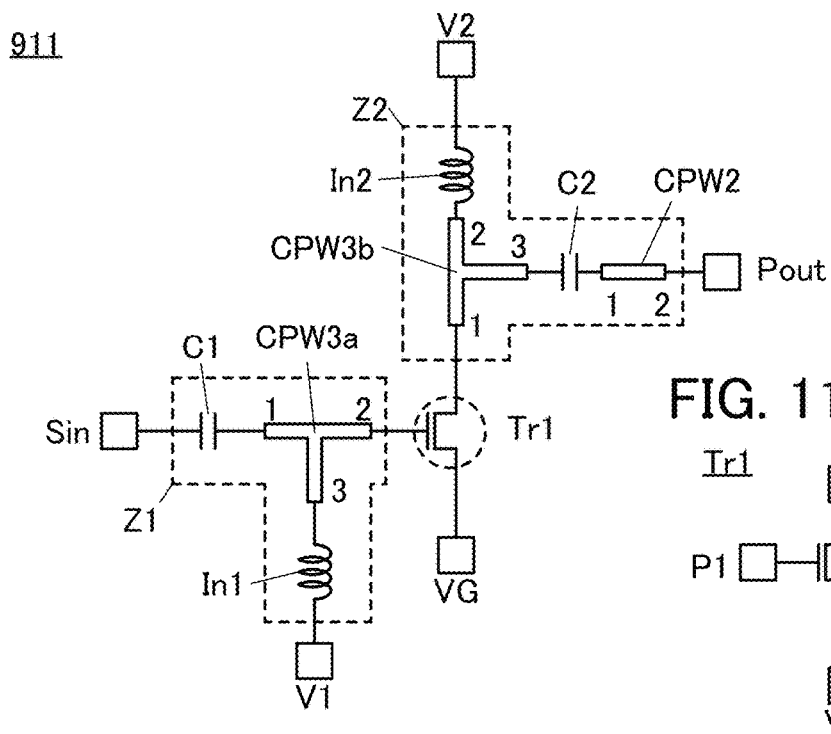
FIG. 11B
FIG. 11C    FIG. 11D
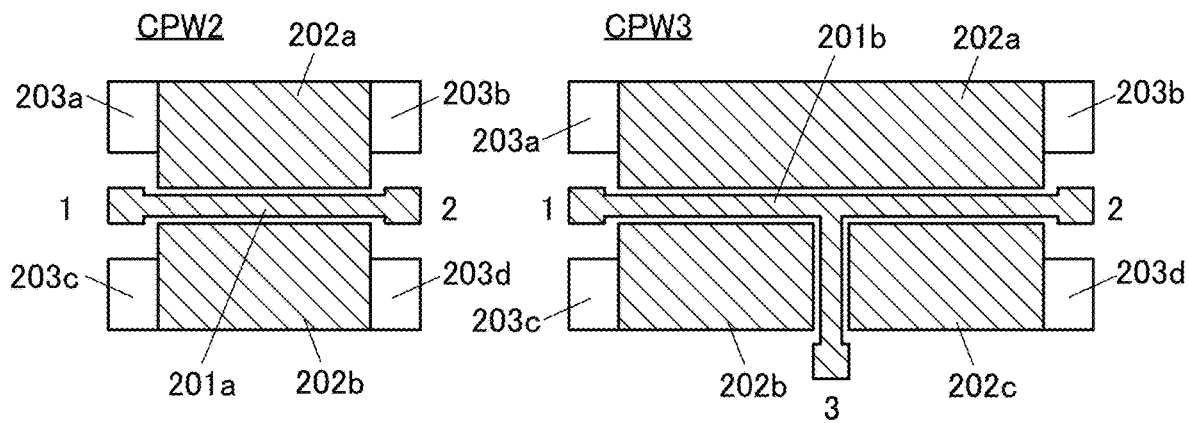

FIG. 21A
Intermediate state
New crystalline phase
| Amorphous | Crystalline | Crystal |
|---|---|---|
| ·completely amorphous | ·CAAC<br>·nc<br>·CAC<br><br>excluding single crystal and poly crystal | ·single crystal<br>·poly crystal |
FIG. 21B
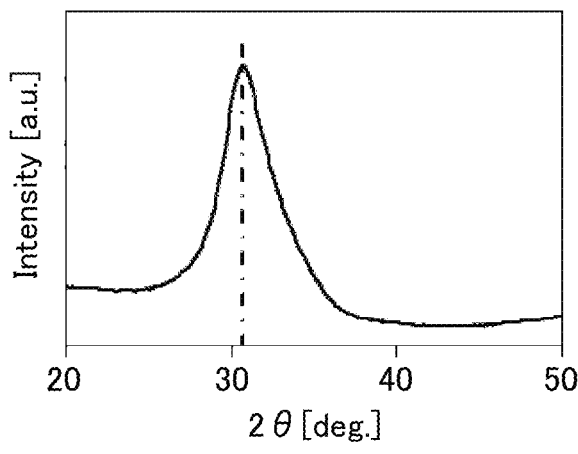
FIG. 21C
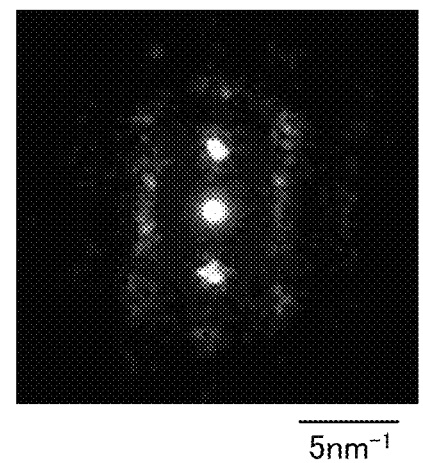

SEMICONDUCTOR DEVICE

TECHNICAL FIELD

One embodiment of the present invention relates to a semiconductor device.

Note that one embodiment of the present invention is not limited to the above technical field. The technical field of the invention disclosed in this specification and the like relates to an object, a method, or a manufacturing method. One embodiment of the present invention relates to a process, a machine, manufacture, or a composition of matter.

In this specification and the like, a semiconductor device generally means a device that can function by utilizing semiconductor characteristics. Thus, a semiconductor element such as a transistor or a diode and a circuit including a semiconductor element are semiconductor devices. A display device, a light-emitting device, a lighting device, an electro-optical device, a communication device, an electronic device, and the like may include a semiconductor element or a semiconductor circuit. Therefore, a display device, a light-emitting device, a lighting device, an electro-optical device, an imaging device, a communication device, an electronic device, and the like are referred to as a semiconductor device in some cases.

BACKGROUND ART

Information terminals that are easy to carry, typified by smartphones, tablet terminals, goggle-type displays (head-mounted displays), and the like, have come into widespread use. With the widespread use of information terminals, various communication standards have been established. For example, the use of an LTE-Advanced standard called the fourth-generation mobile communication system (4G) has started.

Information technology such as IoT (Internet of Things) has been developed recently, where electronic devices (e.g., in-vehicle electronic devices, home electronic appliances, house, buildings, or wearable devices) other than information terminals are connected to the Internet. Thus, the amount of data handled by such electronic devices are increasing. In addition, the transmission speed of electronic devices such as information terminals needs to be improved.

To achieve IoT, the number of electronic devices that are additionally connected to the Internet is increased; thus, the number of electronic devices that can be connected to the Internet at a time needs to be increased. Furthermore, a large number of electronic devices are connected to the Internet at a time, and thus a communication time lag (may be also expressed as a delay) occurs. Thus, in order to be compatible with various kinds of information technology including IoT, a new communication standard called the fifth-generation mobile communication system (5G) that achieves higher transmission speed, more simultaneous connections, and shorter delay time than 4G has been examined. Note that 5G uses communication frequencies of a 3.7 GHz band, a 4.5 GHz band, and a 28 GHz band.

Patent Document 1 discloses a semiconductor device formed by stacking transistors including different semiconductor materials.

A 5G compatible semiconductor device is manufactured using a semiconductor containing one kind of element such as Si as its main component or a compound semiconductor containing a plurality of kinds of elements such as Ga and As as its main components. Furthermore, an oxide semiconductor, which is one kind of metal oxide, has attracted attention.

A CAAC (c-axis aligned crystalline) structure and an nc (nanocrystalline) structure, which are neither single crystal nor amorphous, have been found in an oxide semiconductor (see Non-Patent Document 1 and Non-Patent Document 2).

Non-Patent Document 1 and Non-Patent Document 2 each disclose a technique for forming a transistor with the use of an oxide semiconductor having a CAAC structure.

REFERENCE

Patent Document

[Patent Document 1] PCT International Publication No. 2015-147835

Non-Patent Document

[Non-Patent Document 1] S. Yamazaki et al., "SID Symposium Digest of Technical Papers", 2012, volume 43, issue 1, pp. 183-186

[Non-Patent Document 2] S. Yamazaki et al., "Japanese Journal of Applied Physics", 2014, volume 53, Number 4S, pp. 04ED18-1-04ED18-10

SUMMARY OF THE INVENTION

Problems to be Solved by the Invention

A semiconductor device for transmitting a signal at high speed needs to be provided with an impedance matching circuit for adjusting characteristic impedance of input and output. However, the impedance matching circuit includes a transmission path and a plurality of passive elements, and there is a problem in that the transmission path and the passive elements need a large area. Furthermore, the impedance matching circuit has a problem of emitting radiation noise. An object of one embodiment of the present invention is to provide a semiconductor device or the like with a novel structure. Another object is to provide a small semiconductor device or the like. Another object is to provide a semiconductor device or the like with high productivity.

Note that the description of these objects does not preclude the existence of other objects. One embodiment of the present invention does not necessarily achieve all of these objects. Note that other objects will be apparent from the descriptions of the specification, the drawings, the claims, and the like, and other objects can be derived from the descriptions of the specification, the drawings, the claims, and the like.

Means for Solving the Problems

One embodiment of the present invention is a semiconductor device including a second layer over a first layer with a metal oxide therebetween. The first layer includes a first transistor including a first semiconductor layer containing silicon. The second layer includes an impedance matching circuit, and the impedance matching circuit includes a second transistor including a second semiconductor layer containing gallium. The first transistor forms first coupling capacitance between the first transistor and the metal oxide, and the impedance matching circuit forms second coupling capacitance between the impedance matching circuit and the metal oxide. The impedance matching circuit is electrically connected to the metal oxide through the second coupling capacitance. The metal oxide inhibits the influence of first radiation noise emitted from the impedance matching circuit on the operation of the first transistor. The first coupling capacitance and the second coupling capacitance can form combined capacitance, and the combined capacitance can attenuate second radiation noise emitted by the operation of the first transistor.

In the above structure, the metal oxide preferably contains oxygen and at least one of hafnium, aluminum, and tantalum.

In the above structure, it is preferable that the impedance matching circuit include a transmission path and the transmission path include a coplanar waveguide.

In the above structure, it is preferable that an inductor be formed above the second transistor and an antenna be formed further above the inductor.

In the above structure, the second transistor included in an amplifier is preferably placed in a position not overlapping with the first transistor.

One embodiment of the present invention is a semiconductor device including a first layer, a second layer, and a third layer. A first transistor included in the first layer includes a first semiconductor layer containing silicon (Si). A second transistor included in the second layer includes a second semiconductor layer containing gallium (Ga). A third transistor included in the third layer includes a third semiconductor layer containing at least one of indium (In) and zinc (Zn). The first to third transistors are formed over a substrate containing silicon (Si). The first semiconductor layer of the first transistor is formed in the substrate. The second semiconductor layer of the second transistor is formed in a crystal obtained by crystal growth over the substrate. The third semiconductor layer of the third transistor is formed above the first semiconductor layer and the second semiconductor layer.

In the above structure, the third transistor is preferably placed in a position including a region overlapping with the first transistor.

In the above structure, the third transistor is preferably placed in a position including a region overlapping with the second transistor.

In the above structure, the semiconductor device further includes a fourth layer. A fourth transistor included in the fourth layer contains at least one of In and Zn in a fourth semiconductor layer. The fourth transistor is placed in a position including a region overlapping with the third transistor.

In the above structure, a sensor module is preferably placed on an opposite side of the metal oxide with the first layer therebetween.

Effect of the Invention

According to one embodiment of the present invention, when an impedance matching circuit included in a power amplifier is formed in a wiring layer of a silicon transistor, a semiconductor device in which an increase in an area required for a transmission path and a plurality of passive elements is inhibited can be provided. A semiconductor device in which the influence of radiation noise emitted from the impedance matching circuit is inhibited can be provided. Alternatively, a semiconductor device or the like with a novel structure can be provided. A small semiconductor device or the like can be provided. Alternatively, a semiconductor device or the like with high productivity can be provided.

Note that the description of these effects does not preclude the existence of other effects. One embodiment of the present invention does not need to have all these effects. Other effects will be apparent from the descriptions of the specification, the drawings, the claims, and the like, and other effects can be derived from the descriptions of the specification, the drawings, the claims, and the like.

BRIEF DESCRIPTION OF THE DRAWINGS

FIG. 11A and FIG. 11B are circuit diagrams illustrating a power amplifier.
FIG. 11C and FIG. 11D are layout diagrams illustrating coplanar waveguides.
FIG. 21A is a diagram showing the classification of crystal structures of IGZO.
FIG. 21B is a diagram showing an XRD spectrum of a CAAC-IGZO film.
FIG. 21C is a diagram showing a nanobeam electron diffraction pattern of the CAAC-IGZO film.

MODE FOR CARRYING OUT THE INVENTION

Figure 1:
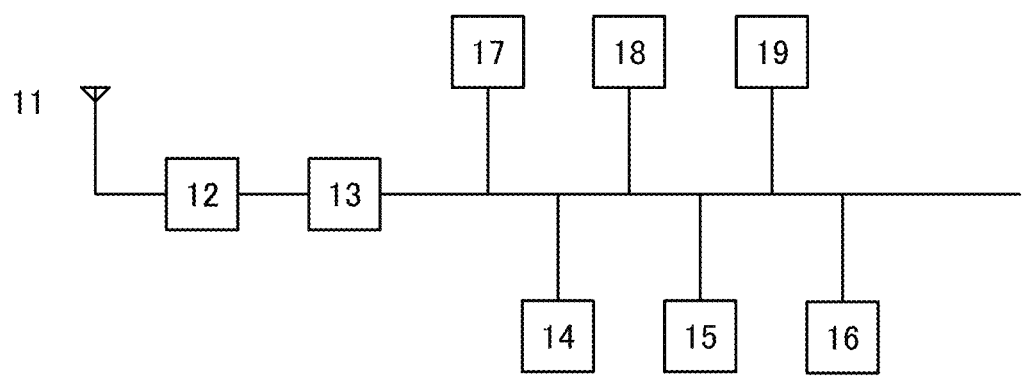
FIG. 1 is a diagram illustrating a semiconductor device.

Embodiments will be described in detail with reference to the drawings. However, the present invention is not limited to the following description, and it is readily appreciated by those skilled in the art that modes and details can be modified in various ways without departing from the spirit and the scope of the present invention. Therefore, the present invention should not be construed as being limited to the description in the following embodiments. Note that in the structures of the invention described below, the same portions or portions having similar functions are denoted by the same reference numerals in different drawings, and description thereof is not repeated.

The position, size, range, and the like of each component illustrated in the drawings and the like do not represent the actual position, size, range, and the like in some cases for easy understanding of the invention. Therefore, the disclosed invention is not necessarily limited to the position, size, range, and the like disclosed in the drawings and the like. For example, in the actual manufacturing process, a resist mask or the like might be unintentionally reduced in size by treatment such as etching, which is not illustrated in some cases for easy understanding.

Furthermore, in a top view (also referred to as a "plan view"), a perspective view, or the like, the description of some components might be omitted for easy understanding of the drawings.

In this specification and the like, the term such as "electrode" or "wiring" does not limit the function of a component. For example, an "electrode" is used as part of a "wiring" in some cases, and vice versa. Furthermore, the term "electrode" or "wiring" also includes the case where a plurality of "electrodes" or "wirings" are formed in an integrated manner, for example.

In this specification and the like, the resistance value of a "resistor" is sometimes determined depending on the length of a wiring. Alternatively, the resistance value is sometimes determined by connection of a conductive layer used for a wiring to a conductive layer with resistivity different from that of the conductive layer. Alternatively, the resistance value is sometimes determined by impurity doping in a semiconductor layer.

In this specification and the like, a "terminal" in an electric circuit refers to a portion that inputs or outputs a current, inputs or outputs a voltage, or receives or transmits a signal. Accordingly, part of a wiring or an electrode functions as a terminal in some cases.

Note that the term "over", "above", "under", or "below" in this specification and the like does not necessarily mean that a component is placed directly over and in contact with or directly under and in contact with another component. For example, the expression "electrode B over insulating layer A" does not necessarily mean that the electrode B is formed over and in direct contact with the insulating layer A, and does not exclude the case where another component is provided between the insulating layer A and the electrode B. Additionally, the expression "conductive layer D above conductive layer C" does not necessarily mean that the conductive layer D is formed over and in direct contact with the conductive layer C, and does not exclude the case where another component is provided between the conductive layer C and the conductive layer D. The term "above" or "below" does not exclude the case where a component is placed in an oblique direction.

Furthermore, functions of a source and a drain might be switched depending on operation conditions, for example, when a transistor of opposite polarity is employed or a direction of current flow is changed in circuit operation; therefore, it is difficult to define which is a source or a drain. Thus, the terms "source" and "drain" can be interchanged with each other in this specification.

In this specification and the like, the expression "electrically connected" includes the case where components are directly connected to each other and the case where components are connected through an "object having any electric function". Here, there is no particular limitation on the "object having any electric function" as long as electric signals can be transmitted and received between components that are connected through the object. Thus, even when the expression "electrically connected" is used, there is a case where no physical connection is made and a wiring just extends in an actual circuit. Furthermore, the expression "directly connected" includes the case where wirings formed of different conductive layers are connected through a contact to function as one wiring. Thus, a wiring may be formed of conductive layers that contain one or more of the same elements or may be formed of conductive layers that contain different elements.

Furthermore, in this specification and the like, "parallel" indicates a state where two straight lines are placed at an angle of greater than or equal to −10° and less than or equal to 10°, for example. Accordingly, the case where the angle is greater than or equal to −5° and less than or equal to 5° is also included. Moreover, "perpendicular" and "orthogonal" indicate a state where two straight lines are placed at an angle of greater than or equal to 800 and less than or equal to 100°, for example. Accordingly, the case where the angle is greater than or equal to 850 and less than or equal to 950 is also included.

In this specification and the like, "identical", "the same", "equal", "uniform", and the like used in describing calculation values and actual measurement values allow for a margin of error of ±20% unless otherwise specified.

Voltage refers to a potential difference between a given potential and a reference potential (e.g., a ground potential or a source potential) in many cases. Therefore, the terms "voltage" and "potential" can be replaced with each other in many cases. In this specification and the like, "voltage" and "potential" can be replaced with each other unless otherwise specified.

Note that a "semiconductor" has characteristics of an "insulator" when the conductivity is sufficiently low, for example. Thus, a "semiconductor" and an "insulator" can be replaced with each other. In that case, a "semiconductor" and an "insulator" cannot be strictly distinguished from each other because a border therebetween is not clear. Accordingly, a "semiconductor" and an "insulator" in this specification can be replaced with each other in some cases.

Furthermore, a "semiconductor" has characteristics of a "conductor" when the conductivity is sufficiently high, for example. Thus, a "semiconductor" and a "conductor" can be replaced with each other. In that case, a "semiconductor" and a "conductor" cannot be strictly distinguished from each other because a border therebetween is not clear. Accordingly, a "semiconductor" and a "conductor" in this specification can be replaced with each other in some cases.

Note that ordinal numbers such as "first" and "second" in this specification and the like are used in order to avoid confusion among components and do not denote the priority or the order such as the order of steps or the stacking order. A term without an ordinal number in this specification and the like might be provided with an ordinal number in the scope of claims in order to avoid confusion among components. Furthermore, a term with an ordinal number in this specification and the like might be provided with a different ordinal number in the scope of claims. Furthermore, even when a term is provided with an ordinal number in this specification and the like, the ordinal number might be omitted in the scope of claims and the like.

Note that in this specification and the like, an "on state" of a transistor refers to a state in which a source and a drain of the transistor are electrically short-circuited (also referred to as a "conduction state"). Furthermore, an "off state" of the transistor refers to a state where the source and the drain of the transistor are electrically disconnected (also referred to as a "non-conduction state").

In addition, in this specification and the like, an "on-state current" sometimes refers to a current that flows between a source and a drain when a transistor is in an on state. Furthermore, an "off-state current" sometimes refers to a current that flows between a source and a drain when a transistor is in an off state.

In this specification and the like, a high power supply voltage VDD (hereinafter, also simply referred to as "VDD", "H voltage", or "H") is a power supply voltage higher than a low power supply voltage VSS (hereinafter, also simply referred to as "VSS", "L voltage", or "L"). Furthermore, VSS is a power supply voltage lower than VDD. In addition, a ground voltage (hereinafter, also simply referred to as "GND" or "GND voltage") can be used as VDD or VSS. For example, in the case where a ground voltage is used as VDD, VSS is lower than the ground voltage, and in the case where a ground voltage is used as VSS, VDD is higher than the ground voltage.

In this specification and the like, a gate refers to part or the whole of a gate electrode and a gate wiring. A gate wiring refers to a wiring for electrically connecting at least one gate electrode of a transistor to another electrode or another wiring.

In this specification and the like, a source refers to part or the whole of a source region, a source electrode, and a source wiring. A source region refers to a region in a semiconductor layer, where the resistivity is lower than or equal to a given value. A source electrode refers to part of a conductive layer that is connected to a source region. A source wiring refers to a wiring for electrically connecting at least one source electrode of a transistor to another electrode or another wiring.

In this specification and the like, a drain refers to part or the whole of a drain region, a drain electrode, and a drain wiring. A drain region refers to a region in a semiconductor layer, where the resistivity is lower than or equal to a given value. A drain electrode refers to part of a conductive layer that is connected to a drain region. A drain wiring refers to a wiring for electrically connecting at least one drain electrode of a transistor to another electrode or another wiring.

In the drawings and the like, for easy understanding of the voltage of a wiring, an electrode, or the like, "H" representing an H voltage or "L" representing an L voltage is sometimes written near the wiring, the electrode, or the like. In addition, enclosed "H" or "L" is sometimes written near a wiring, an electrode, or the like whose voltage changes. Moreover, in the case where a transistor is in an off state, a symbol "x" is sometimes written on the transistor.

Embodiment 1

A semiconductor device of one embodiment of the present invention will be described with reference to drawings. FIG. 1 is a block diagram illustrating a structure of a semiconductor device 10 included in an electronic device.

Note that the structure of the semiconductor device exemplified in this specification and the like is an example, and all of the components are not necessarily included. The semiconductor device includes necessary components among the components shown in this specification and the like. A component other than the components shown in this specification and the like may be included.

The semiconductor device 10 includes, for example, an antenna array 11, a transmission/reception control unit 12, a signal processing unit 13, a processor 14, a GPU (Graphics Processing Unit) 15, a power supply control unit 16, a PLD (Programmable Logic Device) 17, a memory device 18, and a display device 19. Note that the transmission/reception control unit 12 will be described in detail with reference to FIG. 7.

Figure 2:
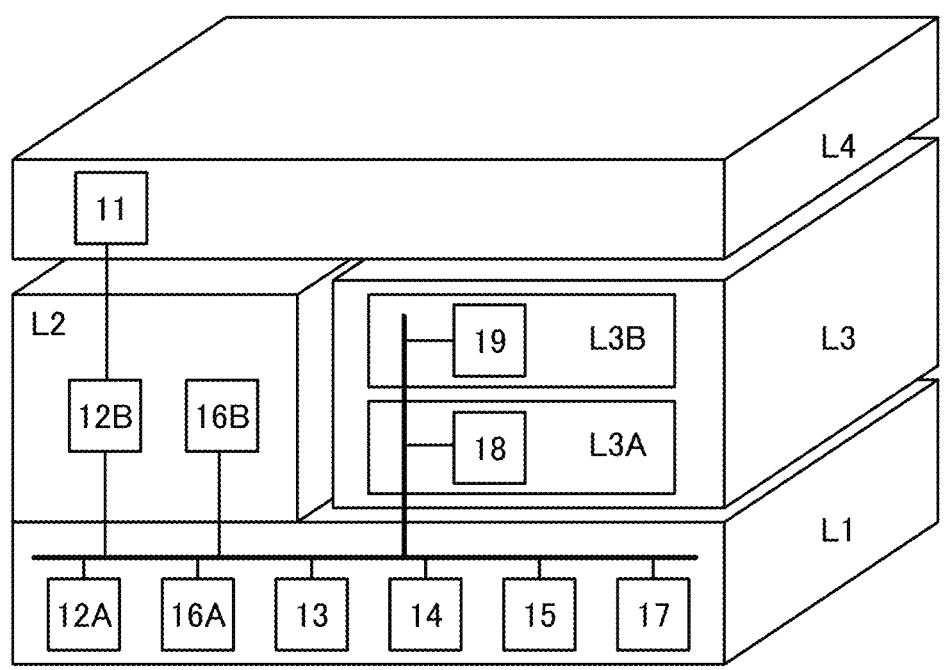
FIG. 2 is a diagram illustrating the semiconductor device.

FIG. 2 is a diagram illustrating the semiconductor device 10. The semiconductor device 10 includes a layer L1, a layer L2, a layer L3, and a layer L4. For example, a first transistor included in the layer L1 includes a first semiconductor layer containing Si. A second transistor included in the layer L2 includes a second semiconductor layer containing Ga. A third transistor included in the layer L3 includes a third semiconductor layer containing at least one of In and Zn. Note that the first to third transistors are formed on a substrate containing Si or over the substrate. Note that the layer L4 is a layer not including a semiconductor layer. Note that the second transistor included in the layer L2 can further contain at least one of In and Zn.

The first semiconductor layer of the first transistor is formed in the substrate. The second semiconductor layer of the second transistor is formed in a crystal obtained by crystal growth over the substrate. The third semiconductor layer of the third transistor is formed above the first semiconductor layer and the second semiconductor layer. Note that the second semiconductor layer of the second transistor may be formed using the same semiconductor layer as the third semiconductor layer.

The transmission/reception control unit 12 includes a transmission/reception control unit 12A and a transmission/reception control unit 12B. The power supply control unit 16 includes a power supply control unit 16A and a power supply control unit 16B. For example, the transmission/reception control unit 12 can have a structure in which the transmission/reception control unit 12A is formed in the layer L1 and the transmission/reception control unit 12B is formed in the layer L2. In addition, the power supply control unit 16 can have a structure in which the power supply control unit 16A is formed in the layer L1 and the power supply control unit 16B is formed in the layer L2.

For the transmission/reception control unit 12 and the power supply control unit 16, a transistor having a high withstand voltage, a high output, a low off-state current, or a high conductance is needed in some cases. In the case where a transistor having characteristics different from those of the first transistor included in the layer L1 is used in the layer L2, a transistor having electrical characteristics such as a high withstand voltage, a high output, a low off-state current, or a high conductance can be used in the layer L2.

A transistor having electrical characteristics such as a high withstand voltage, a high output, or a low off-state current will be described in detail in Embodiment 3.

For example, the transmission/reception control unit 12A, the signal processing unit 13, the processor 14, the GPU 15, the power supply control unit 16A, the PLD 17, and the like are formed in the layer L1. The transmission/reception control unit 12B and the power supply control unit 16B are formed in the layer L2. The memory device 18 and the display device 19 are formed in the layer L3. FIG. 2 illustrates an example where the antenna array 11 for wireless communication is formed in the layer L4.

The memory device 18 formed in the layer L3 can be formed using the third transistor including the third semiconductor layer. The display device 19 can be formed using a third transistor which includes a third semiconductor layer different from that in the memory device 18. Each of the memory device 18 and the display device 19 may be formed by stacking a plurality of third transistors. Note that there is no limitation on the number of the stacked third transistors. For example, two or more third transistors can be stacked for the formation.

Figure 3:
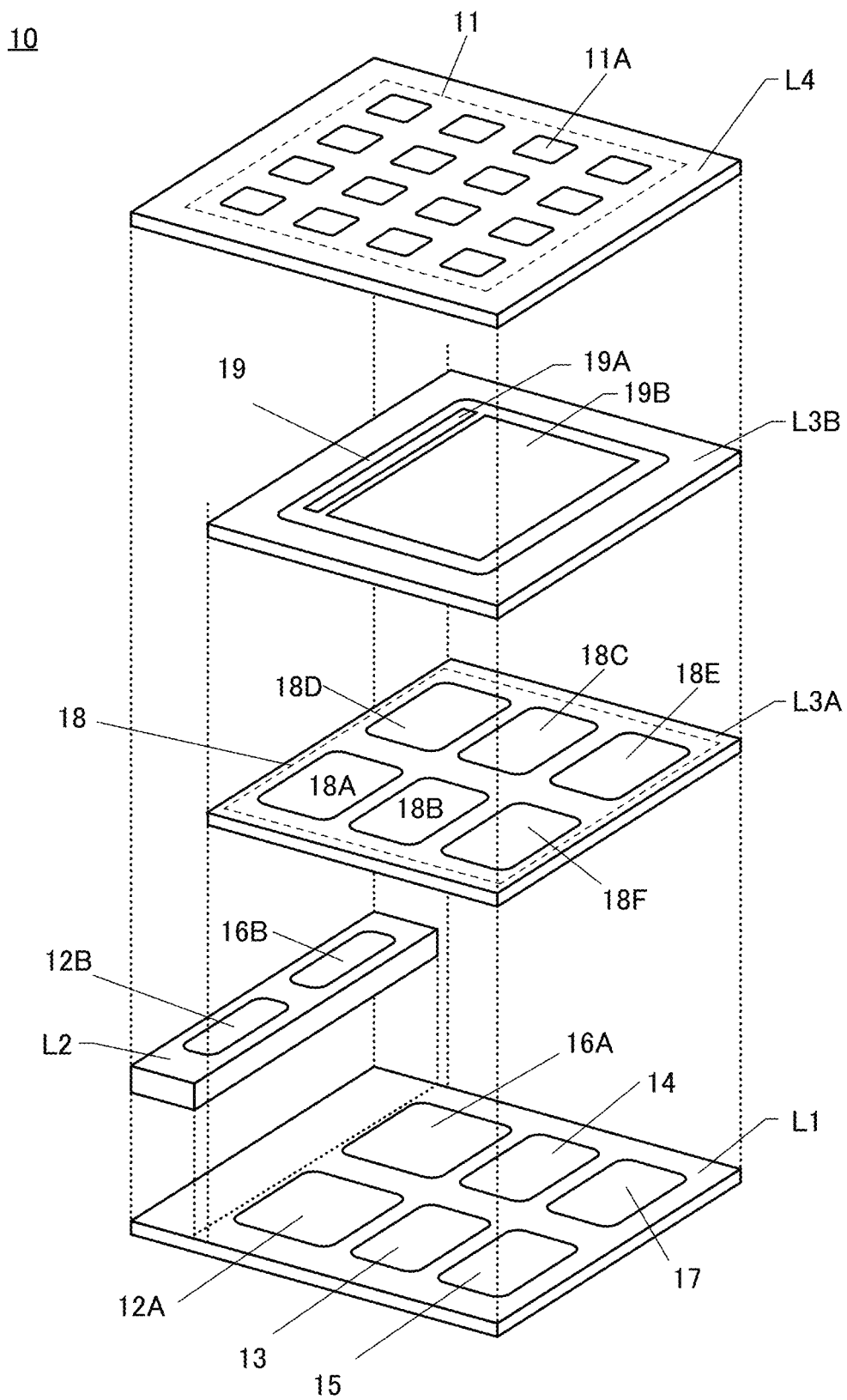
FIG. 3 is a diagram illustrating the semiconductor device.

FIG. 3 is a diagram illustrating the details of the semiconductor device 10. The transmission/reception control unit 12A, the signal processing unit 13, the processor 14, the GPU 15, the power supply control unit 16A, and the PLD 17 are formed in the layer L1. The transmission/reception control unit 12B and the power supply control unit 16B are formed in the layer L2. The memory device 18 is formed in a layer L3A. The memory device 18 includes memory devices 18A to 18F. The display device 19 is formed in a layer L3B. The display device 19 includes agate driver 19A and a display region 19B. The antenna array 11 for wireless communication is formed in the layer L4. The antenna array 11 includes a plurality of antennas 11A.

The transmission/reception control unit 12A formed in the layer L1 has a function of processing a signal which is transmitted and received through the antenna 11A. The transmission/reception control unit 12B formed in the layer L2 includes any one of a transistor and a diode that is capable of supplying a sufficient electric power instantaneously consumed by the transmission/reception control unit 12A.

The signal processing unit 13 can supply a control signal to the gate driver 19A through the layer L3A, and can further supply image data to the display region 19B. Thus, the signal processing unit 13 can have a function of an image processing unit. Note that the signal processing unit 13 can perform extended conversion of image data by utilizing the GPU 15.

The processor 14 controls the semiconductor device 10. In learning or inference by artificial intelligence (AI) to be processed in the signal processing unit 13 or the like, the GPU 15 can rapidly process part of arithmetic operation. For example, matrix operation using a neural network is often performed for the inference by artificial intelligence. The matrix operation can be processed efficiently and rapidly with the use of the GPU 15.

The power supply control unit 16A formed in the layer L1 can control power supply to the transmission/reception control unit 12, the signal processing unit 13, the processor 14, the GPU 15, the PLD 17, the memory device 18, or the display device 19. The power supply control unit 16B formed in the layer L2 includes any one of a transistor and a diode that is capable of supplying a sufficient electric power consumed by the semiconductor device 10.

The PLD 17 can provide a different function by update of a logical structure. In an example, the PLD 17 can function as a memory device. The signal processing unit can temporarily store display data displayed on the display device 19 described later and easily detect a difference between the display data and display data received by the transmission/reception control unit 12. In another example, the PLD 17 can extend part of the arithmetic function of the signal processing unit 13 or the GPU 15. For example, the parallel number in parallel arithmetic operation can be extended.

Next, the layer L2 is described. The layer L2 is a layer formed by crystal growth over the layer L1. Therefore, the first transistor included in the layer L1 does not overlap with the second transistor included in the layer L2. The second semiconductor layer of the second transistor preferably contains Ga. The second semiconductor layer of the second transistor preferably contains nitrogen or oxygen.

The layer L2 includes the transmission/reception control unit 12B and the power supply control unit 16B. The transmission/reception control unit 12B can supply large electric power that is instantaneously consumed by the transmission/reception control unit 12A. The power supply control unit 16B supplies electric power to the transmission/reception control unit 12A, the signal processing unit 13, the processor 14, the GPU 15, the power supply control unit 16A, and the PLD 17 that are placed in the layer L1. In addition, the power supply control unit 16B can supply electric power to the memory device 18 formed in the layer L3A and the display device 19 formed in the layer L3B.

Next, the layer L3 is described. The layer L3 is formed by stacking the layer L3B over the layer L3A. The layer L3A formed over the layer L1 is described first.

The memory device 18A is preferably placed over the transmission/reception control unit 12A. The memory device 18B is preferably placed over the signal processing unit 13. The memory device 18C is preferably placed over the processor 14. The memory device 18F is preferably placed over the GPU 15. In addition, the memory device 18D is preferably placed over the power supply control unit 16A. The memory device 18E is preferably placed over the PLD 17.

Note that any one of the memory devices 18A to 18F can function as a data saving register. In another example, any one of the memory devices 18A to 18F can function as a data management memory. In another example, any one of the memory devices 18A to 18F can function as a FIFO memory (First in First out memory) that absorbs different processing speed between devices. For example, a FIFO memory can temporarily store data received by the transmission/reception control unit 12 and the signal processing unit 13 can read the data from the FIFO memory using the processor 14. At this time, the transmission/reception control unit 12 can operate with an operation frequency different from that of the signal processing unit 13 or the processor 14. Multiple kinds of logical structure information for the PLD 17 are preferably stored in the memory device 18E.

The memory device 18 includes the third transistor. The third semiconductor layer of the third transistor preferably contains oxygen and further contains at least any one or more of In, Ga, Sn, and Zn. Thus, this can be expressed as that the third semiconductor layer of the third transistor includes an oxide semiconductor. A transistor including an oxide semiconductor (OS), which is one kind of metal oxide, in a semiconductor layer where a channel of the transistor is formed is referred to as an "OS transistor" or "OS-FET". It is known that the OS transistor has a small variation in electric characteristics due to temperature change. Furthermore, in the OS transistor, a semiconductor layer has a large energy gap, and thus the OS transistor can have an extremely low off-state current of several yA/μm (a current value per micrometer of a channel width). Therefore, the OS transistor is preferably used for a memory device. Note that the details of the OS transistor will be described in Embodiment 3.

A memory device using an OS transistor is described here. In the case where an OS transistor is used in a memory device, the memory device can be referred to as an "OS memory".

The OS memory can inhibit deterioration of data retained in the OS memory even when supply of electric power is stopped. Furthermore, the OS memory enables a capacitor retaining data to be downsized, and therefore a memory device suitable for high-density can be provided. Moreover, the OS memory can retain written information for a period of one year or longer, or further ten years or longer, utilizing extremely low off-state current characteristics of the OS transistor. Thus, the OS memory can be regarded as a nonvolatile memory.

In the OS memory, charge is written to a node through the OS transistor; hence, a high voltage, which a conventional flash memory requires, is unnecessary and high-speed write operation is possible. Furthermore, the number of data writing and reading in the OS memory is substantially unlimited because charge injection and extraction into/from a floating gate or a charge trap layer are not performed. The OS memory is less likely to degrade than a conventional flash memory and can have high reliability.

Unlike a magnetic memory, a resistive random access memory, or the like, the OS memory has no change in the structure at the atomic level. Thus, the OS memory has higher rewrite endurance than a magnetic memory and a resistive random access memory.

The off-state current of the OS transistor hardly increases even in a high-temperature environment. Specifically, the off-state current hardly increases even at an environment temperature higher than or equal to room temperature and lower than or equal to 200° C. In addition, the on-state current is less likely to decrease even in a high-temperature environment. The OS transistor has a high withstand voltage between its source and drain. When OS transistors are used as transistors included in a semiconductor device, the semiconductor device achieves stable operation and high reliability even in a high-temperature environment.

The OS transistor can be formed by a sputtering method in a BEOL (Back end of line) process for forming a wiring of a semiconductor device. Thus, one semiconductor device 10 can be formed using transistors with different characteristics. In other words, the use of the OS transistor can facilitate formation of SoC (System on a chip).

Note that the OS transistor can include a back gate. The back gate is placed so that a channel formation region of the third semiconductor layer is sandwiched between the gate and the back gate. The back gate can function like the gate. In addition, by changing the voltage of the back gate, the threshold voltage of the transistor can be changed. The voltage of the back gate may be the same as that of the gate or may be a GND voltage or a given voltage.

In addition, in general, the gate and the back gate are formed using conductive layers and thus each have a function of preventing an electric field generated outside the transistor from influencing the semiconductor layer in which a channel is formed (particularly, a function of preventing static electricity). That is, the variation in the electrical characteristics of the transistor due to the influence of external electric field such as static electricity can be prevented.

Next, the layer L3B is described. The display device 19 is formed using the third transistor included in the layer L3B. Although not described in detail in this specification, the display region 19B includes a plurality of pixels, each of which includes a light-emitting element. As the light-emitting element, an organic light emitting device (OLED) or an LED (Light Emitting Device) is preferably used.

Next, the layer L4 is described. The antenna array 11 includes a plurality of antennas 11A and the antennas 11A are preferably formed using alight-transmitting conductive layer. For the light-transmitting conductive layer, for example, indium oxide, ITO, indium zinc oxide, zinc oxide, zinc oxide to which gallium is added, or the like can be used.

Figure 4:
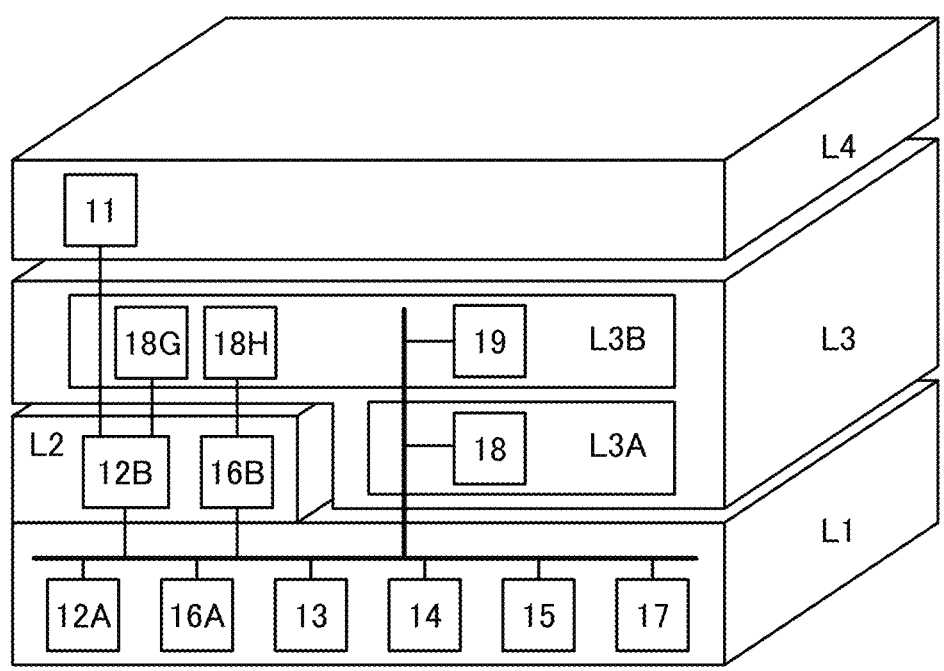
FIG. 4 is a diagram illustrating a semiconductor device.

FIG. 4 illustrates a semiconductor device 10A with a structure different from the structure of the semiconductor device 10 illustrated in FIG. 2. Note that in the structures described below, the same portions or portions having similar functions are denoted by the same reference numerals in common in different drawings and repetitive description thereof will be omitted.

The semiconductor device 10A is different from the semiconductor device 10 in that the layer L3B includes the display device 19, a memory device 18G, and a memory device 18H. The third transistors included in the display device 19, the memory device 18G, and the memory device 18H are formed in the same process.

Figure 5:
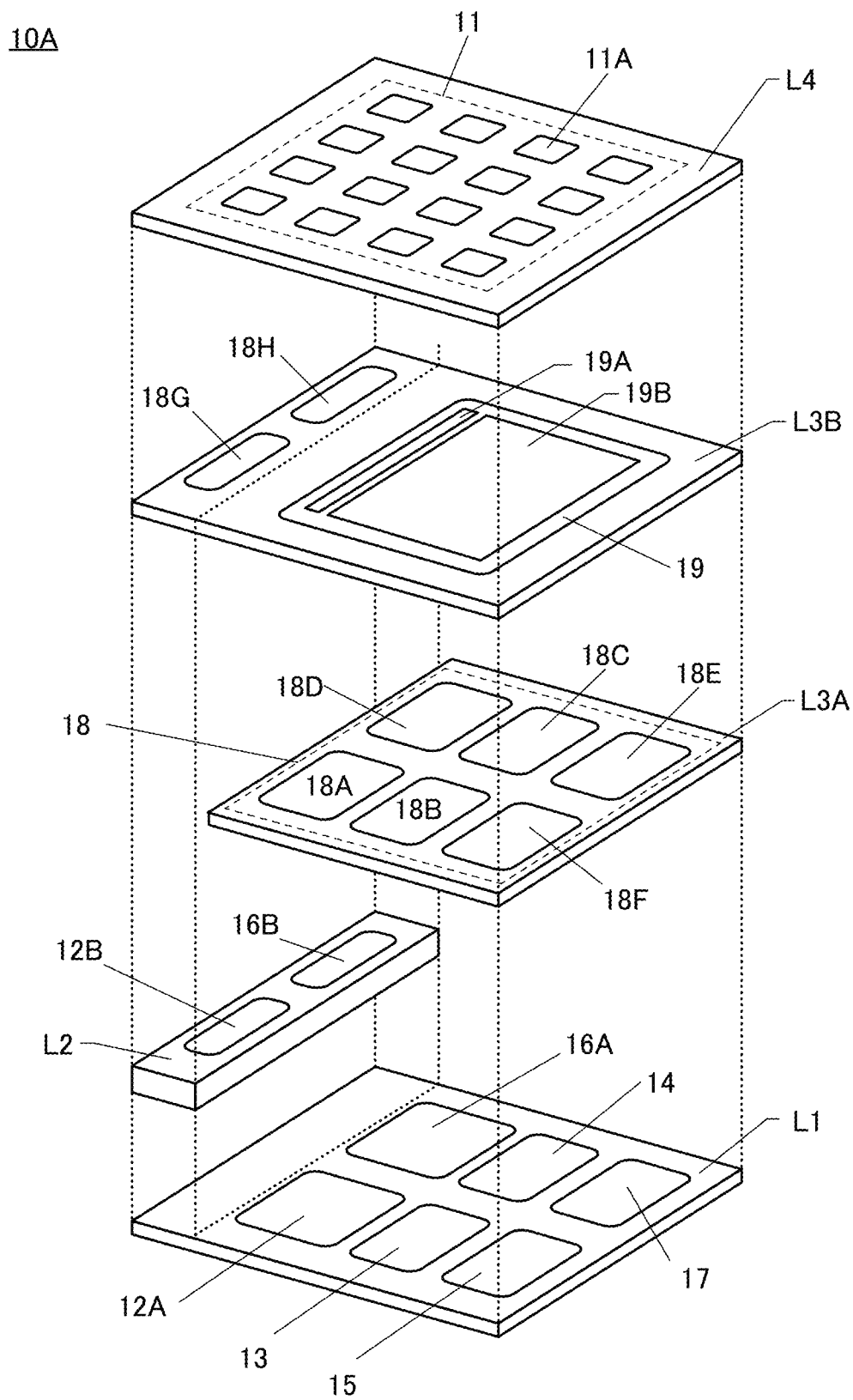
FIG. 5 is a diagram illustrating the semiconductor device.

FIG. 5 is a diagram illustrating the details of the semiconductor device 10A. The semiconductor device 10A is different from the semiconductor device 10 illustrated in FIG. 3 in that the layer L3B includes a portion overlapping with the layer L2. For example, the memory device 18G is preferably placed over the transmission/reception control unit 12B. The memory device 18G stores setting information of the transmission/reception control unit 12B. The memory device 18H is preferably placed over the power supply control unit 16B. The memory device 18H stores setting information of the power supply control unit 16B. Note that the memory device 18G and the memory device 18H preferably use OS memories.

Figure 6A:
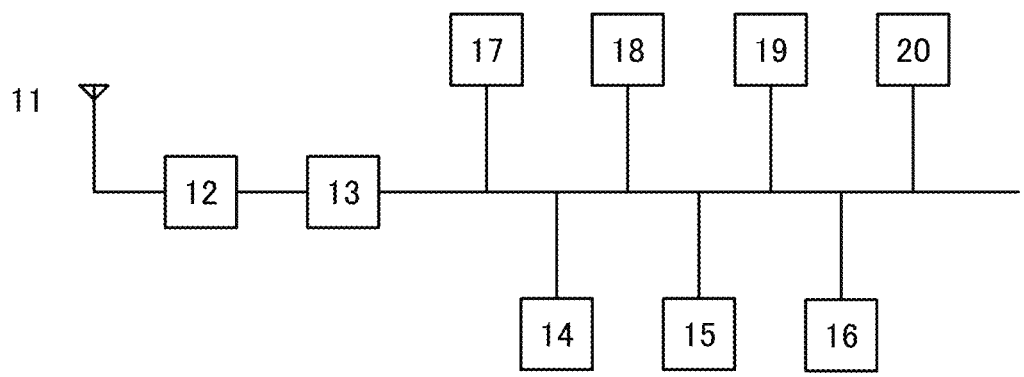
FIG. 6A is a diagram illustrating an electronic device.
Figure 6B:
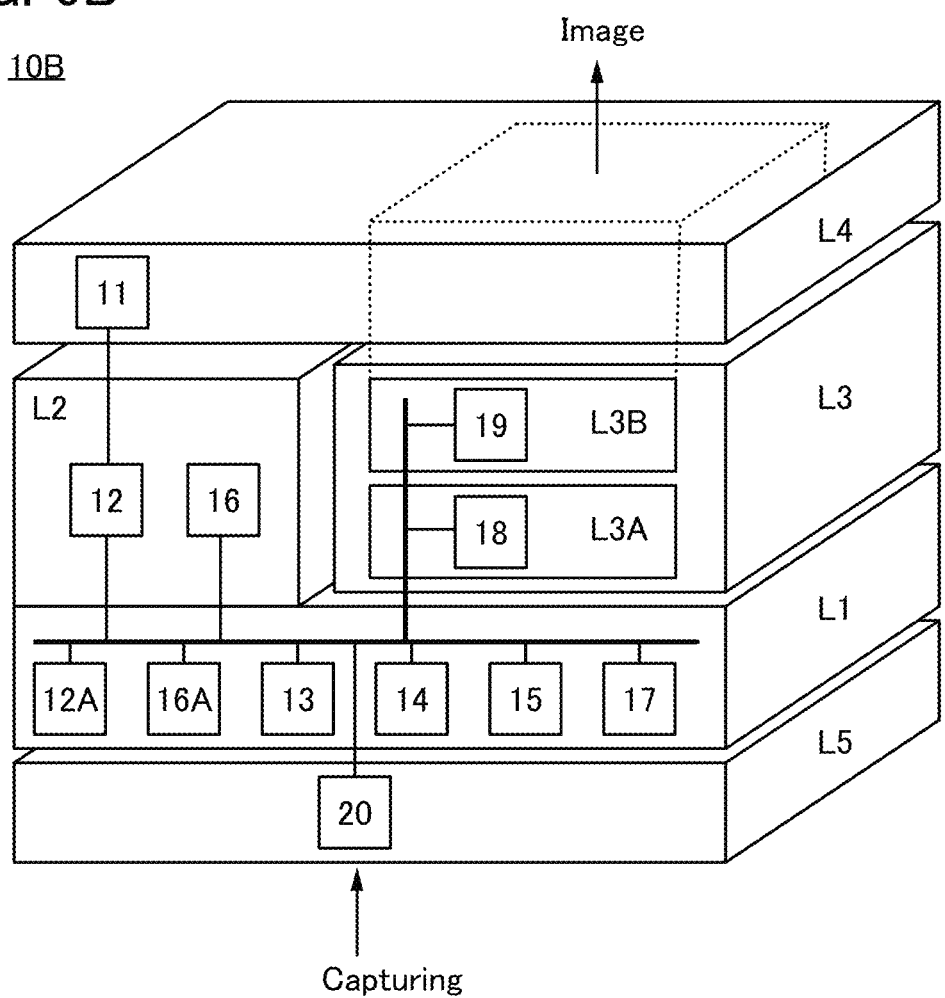
FIG. 6B is a diagram illustrating a semiconductor device.

FIG. 6A is a block diagram illustrating a structure of a semiconductor device 10B different from that of the semiconductor device 10 illustrated in FIG. 1. The semiconductor device 10B illustrated in FIG. 6A includes a sensor module 20. FIG. 6B is a diagram illustrating the semiconductor device 10B that has a structure different from that of the semiconductor device 10 illustrated in FIG. 2. The semiconductor device 10B includes a layer L5 on the side opposite to the side where the first transistor is formed in the layer L1, and the sensor module 20 is placed in the layer L5. The sensor module 20 can be electrically connected to the layer L1 using a through silicon via (TSV). Note that the sensor module 20 can use an image sensor, an infrared sensor, an ultrasonic wave sensor, a touch sensor, or the like.

Description is made on the case where the sensor module 20 is an image sensor, for example. The semiconductor device 10B can display information captured by the sensor module as an image on the display device 19.

In the semiconductor device 10B, wireless communication, signal processing for extended conversion of image data, the display device, and the sensor module can be configured as SoC, so that the number of components can be reduced. Thus, the semiconductor device 10B is suitable for a portable terminal including a goggles-type display which requires a small and lightweight semiconductor device.

Figure 7:
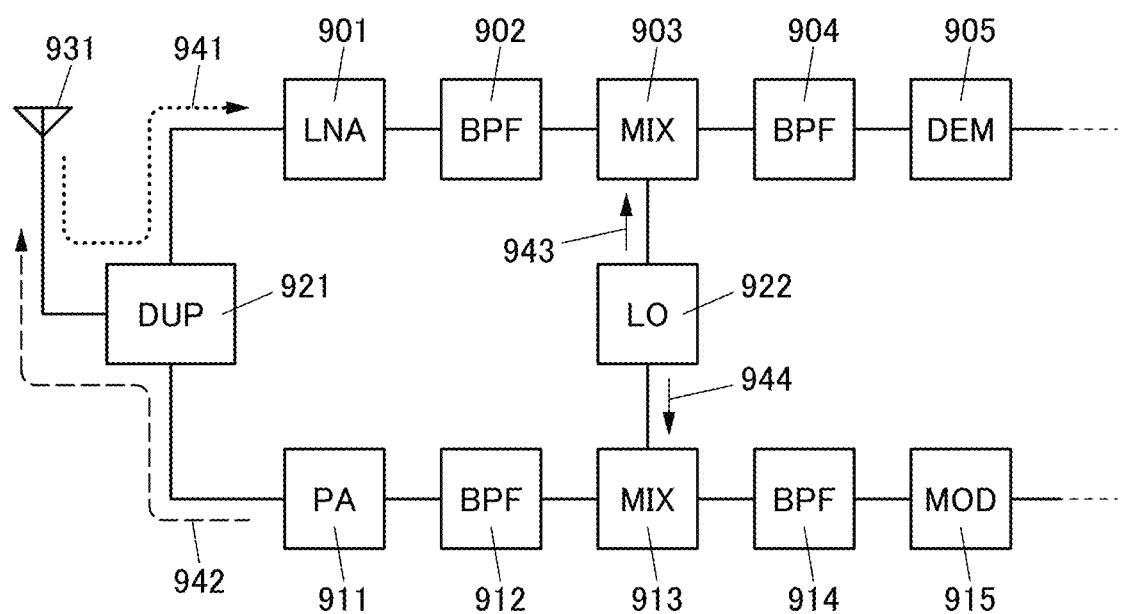
FIG. 7 is a diagram illustrating a structure example of a wireless transceiver.

FIG. 7 is a diagram illustrating a structure example of a wireless transceiver 900 as an example of the transmission/reception control unit 12. The wireless transceiver 900 includes a low noise amplifier (LNA) 901, a band pass filter (BPF) 902, a mixer (MIX) 903, a band pass filter 904, a demodulator (DEM) 905, a power amplifier (PA) 911, a band pass filter 912, a mixer 913, a band pass filter 914, a modulator (MOD) 915, a duplexer (DUP) 921, a local oscillator (LO) 922, and an antenna 931.

<Reception>

A signal 941 transmitted from another semiconductor device, a base station, or the like is input to the low-noise amplifier 901 as a received signal through the antenna 931 and the duplexer 921. The duplexer 921 has a function of transmitting and receiving a wireless signal with one antenna.

The low-noise amplifier 901 has a function of amplifying a weak received signal to a signal having intensity that can be processed by the wireless transceiver 900. The signal 941 amplified by the low-noise amplifier 901 is supplied to the mixer 903 through the band pass filter 902.

The band pass filter 902 has a function of attenuating frequency components outside a required frequency band among frequency components included in the signal 941 and transmitting the required frequency band.

The mixer 903 has a function of mixing the signal 941 transmitted through the band pass filter 902 and a signal 943 generated in the local oscillator 922 by a superheterodyne system. The mixer 903 mixes the signal 941 and the signal 943 and supplies a signal having a frequency component of a difference between them and a frequency component of the sum of them to the band pass filter 904.

The band pass filter 904 has a function of transmitting one frequency of the two frequency components. For example, the band pass filter 904 transmits the frequency component of the difference. Moreover, the band pass filter 904 also has a function of removing a noise component generated in the mixer 903. The signal transmitted through the band pass filter 904 is supplied to the demodulator 905. The demodulator 905 has a function of converting the supplied signal into a control signal, a data signal, or the like and outputting the signal. The signal output from the demodulator 905 is supplied to a variety of processing units (e.g., an arithmetic unit or a memory device).

<Transmission>

The modulator 915 has a function of generating a basic signal for transmitting a control signal, a data signal, or the like from the wireless transceiver 900 to another semiconductor device, a base station, or the like. The basic signal is supplied to the mixer 913 through the band pass filter 914.

The band pass filter 914 has a function of removing a noise component generated when the basic signal is generated in the modulator 915.

The mixer 913 has a function of mixing the basic signal transmitted through the band pass filter 914 and a signal 944 generated in the local oscillator 922 by the superheterodyne system. The mixer 913 mixes the basic signal and the signal 944 and supplies a signal having a frequency component of a difference between them and a frequency component of the sum of them to the band pass filter 912.

The band pass filter 912 has a function of transmitting one frequency of the two frequency components. For example, the band pass filter 912 transmits the frequency component of the sum. Moreover, the band pass filter 912 also has a function of removing a noise component generated in the mixer 913. The signal transmitted through the band pass filter 912 is supplied to the power amplifier 911.

The power amplifier 911 has a function of amplifying the supplied signal to generate a signal 942. The signal 942 is radiated to the outside from the antenna 931 through the duplexer 921.

A wireless transceiver 900A which is a modification example of the above-described wireless transceiver 900 is described with reference to FIG. 8A and FIG. 8B. In order to avoid repeated description, a description is mainly given to parts that are different from those of the wireless transceiver 900.

The wireless transceiver 900A includes a plurality of antennas 931 compatible with 5G communication standard. A plurality of duplexers 921, a plurality of low-noise amplifiers 901, and a plurality of power amplifiers 911 are also included. The wireless transceiver 900A includes a decoder circuit 906 (DEC) and a decoder circuit 916.

Figure 8A:
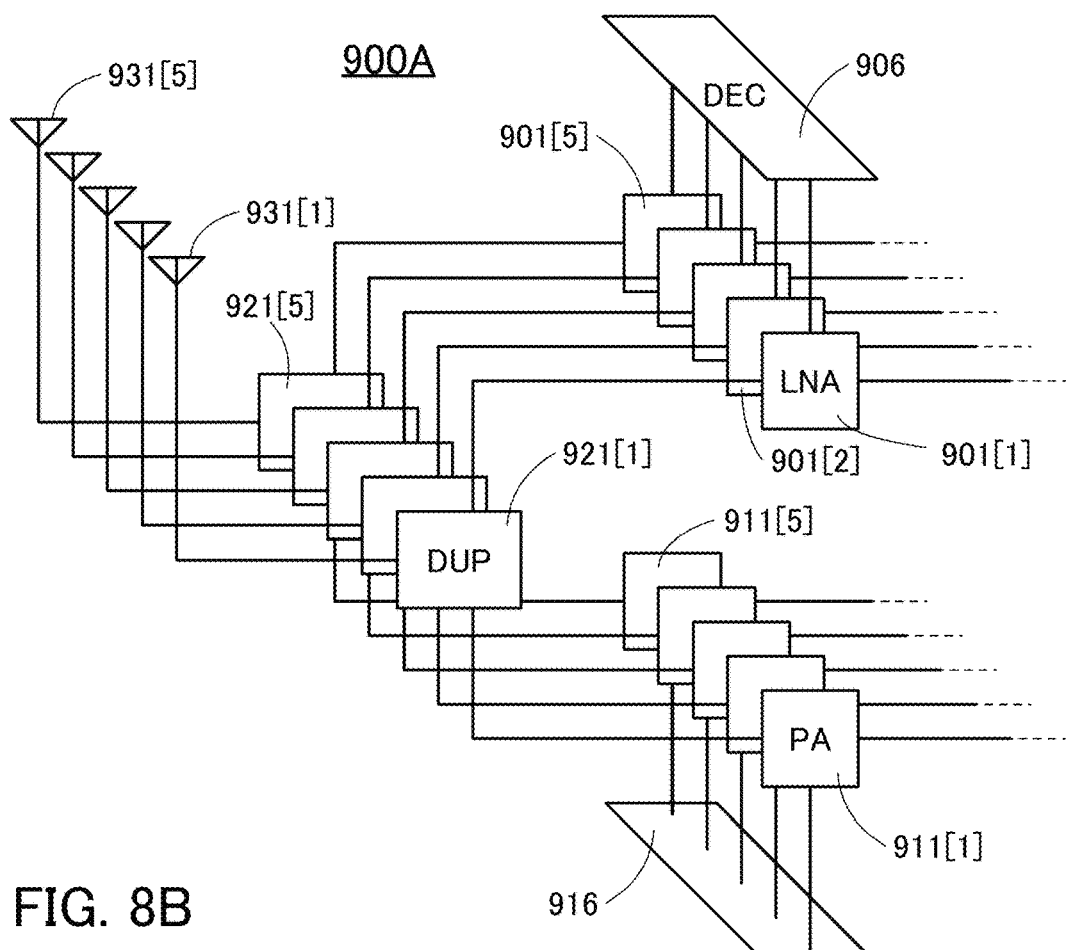
FIG. 8A and FIG. 8B are diagrams illustrating a structure example of a wireless transceiver.

FIG. 8A illustrates a case where five antennas 931, five duplexers 921, five low-noise amplifiers 901, and five power amplifiers 911 are included. In FIG. 8A, the first antenna 931 is denoted as an antenna 931[1], and the fifth antenna 931 is denoted as an antenna 931[5]. The duplexer 921, the low-noise amplifier 901, and the power amplifier 911 are also denoted in a manner similar to the antenna 931. Note that the number of the antenna 931, the duplexer 921, the low-noise amplifier 901, and the power amplifier 911 is not limited to five.

The antenna 931[1] is electrically connected to the duplexer 921[1]. The duplexer 921[1] is electrically connected to the low-noise amplifier 901[1] and the power amplifier 911[1]. The antenna 931[5] is electrically connected to the duplexer 921[5]. The duplexer 921[5] is electrically connected to the low-noise amplifier 901[5] and the power amplifier 911[5]. The second to fourth antennas 931 are also electrically connected to the second to fourth duplexers 921. In addition, the second to fourth duplexers 921 are also electrically connected to the second to fourth low-noise amplifiers 901 and the second to fourth power amplifiers 911.

The decoder circuit 906 is electrically connected to the plurality of low-noise amplifiers 901. In FIG. 8A, five low-noise amplifiers 901 are connected to the decoder circuit 906. The decoder circuit 916 is electrically connected to the plurality of power amplifiers 911. In FIG. 8A, five power amplifiers 911 are connected to the decoder circuit 916.

The decoder circuit 906 has a function of selecting any one or more of the low-noise amplifier 901[1] to the low-noise amplifier 901[5]. The decoder circuit 906 has a function of sequentially selecting the low-noise amplifier 901[1] to the low-noise amplifier 901[5]. Similarly, the decoder circuit 916 has a function of selecting any one or more of the power amplifier 911[1] to the power amplifier 911[5]. The decoder circuit 916 has a function of sequentially selecting the power amplifier 911[1] to the power amplifier 911[5].

Figure 8B:
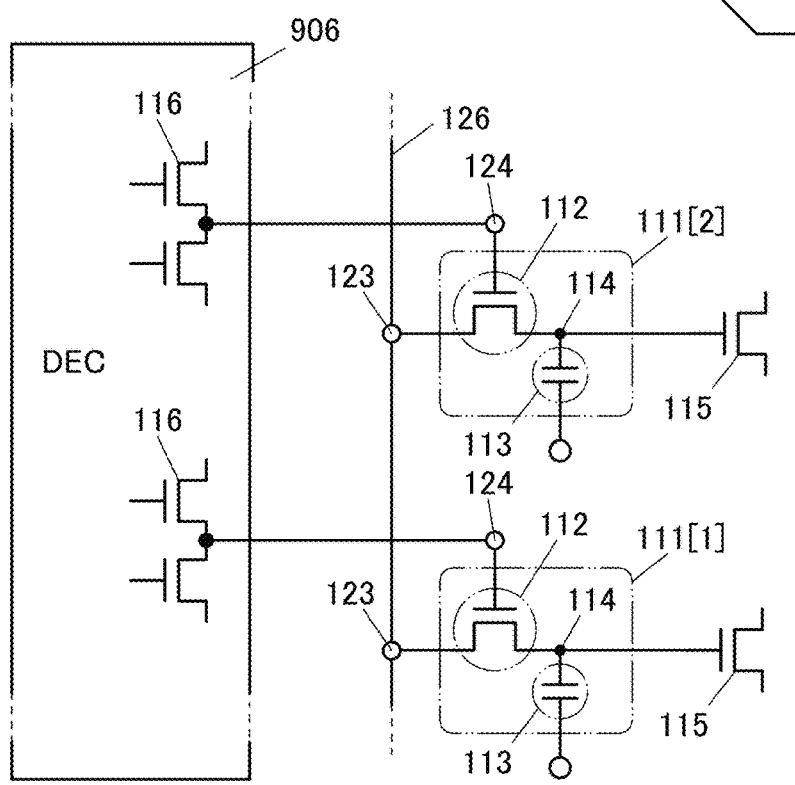

FIG. 8B illustrates an example of a connection between the decoder circuit 906 and the low-noise amplifier 901[1] and the low-noise amplifier 901[2]. The decoder circuit 906 is electrically connected to a memory element 111 (denoted as a memory element 111[1]) included in the low-noise amplifier 901[1] through a terminal 124 electrically connected to the memory element 111[1]. The decoder circuit 906 is electrically connected also to a memory element 111 (denoted as a memory element 111[2]) included in the low-noise amplifier 901[2] through the terminal 124 electrically connected to the memory element 111[2].

The memory element 111 includes a transistor 112 and a capacitor 113. A gate of the transistor 112 is electrically connected to the terminal 124. One of a source and a drain of the transistor 112 is electrically connected to a terminal 123. The other of the source and the drain of the transistor 112 is electrically connected to one electrode of the capacitor 113 and a gate of a transistor 115. Note that a node 114 is formed on a wiring to which the other of the source and the drain of the transistor 112, the one electrode of the capacitor 113, and the gate of the transistor 115 are electrically connected. The terminal 124 is electrically connected to one of a source and a drain of a transistor 116 in the decoder circuit 906. Note that the transistor 112 is preferably an OS transistor. In addition, the memory element 111 including an OS transistor can also be referred to as an OS memory.

The terminal 123 electrically connected to the memory element 111[1] and the terminal 123 electrically connected to the memory element 111[2] are electrically connected to a wiring 126. A voltage (charge) written to the node 114 is supplied through the wiring 126.

The decoder circuit 906 has a function of supplying a signal to turn on or off the transistor 112 to the terminal 124 electrically connected to a given memory element 111. When the memory elements 111 included in the low-noise amplifiers 901 are sequentially selected by the decoder circuit 906, a different voltage for each memory element 111 can be written to the node 114. In other words, a voltage appropriate for each of the plurality of low-noise amplifiers 901 can be written to the node 114.

The decoder circuit 916 also functions to the plurality of power amplifiers 911 in a manner similar to the decoder circuit 906.

The composition, structure, method, and the like described in this embodiment can be used in combination as appropriate with the compositions, structures, methods, and the like described in the other embodiments, the example, and the like.

Embodiment 2

In this embodiment, the structure of a transmission/reception control unit will be described. The transmission/reception control unit includes a power amplifier for transmitting a high-frequency signal; the signal that is to be transmitted is generated in a signal processing unit or generated by mixing a signal generated in a signal processing unit and a signal generated in an oscillator with a mixer. In a power amplifier operating in a high frequency band, signal loss in a transmission path needs to be reduced. In addition, it is required that radiation noise emitted from the power amplifier do not affect another circuit (hereinafter, a circuit includes a transistor, a wiring, and the like included in the circuit). It is further required that the power amplifier be not affected by radiation noise emitted from another circuit. In this embodiment, a structure is described in which both the influence of radiation noise from the power amplifier on another circuit and the influence of radiation noise from another circuit on the power amplifier are reduced. Note that the power amplifier corresponds to the power amplifier 911 in FIG. 8.

Figure 9:
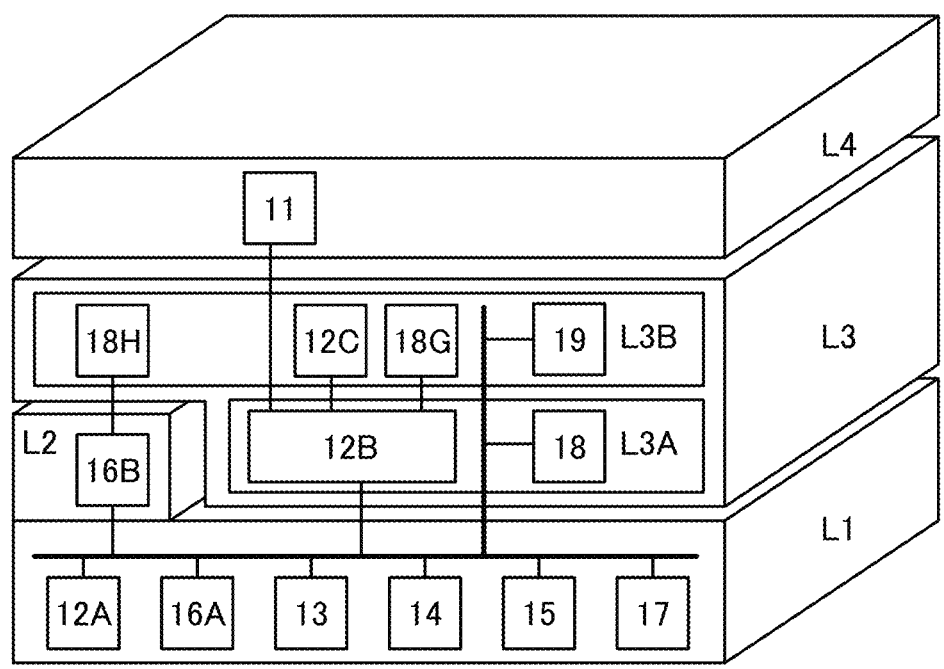
FIG. 9 is a diagram illustrating the semiconductor device.

FIG. 9 is a diagram illustrating the semiconductor device 10B. The semiconductor device 10A is referred to for the description of the semiconductor device 10B, and the same portions or portions having similar functions are denoted by the same reference numerals in common in different drawings and repetitive description thereof will be omitted.

A power amplifier included in the transmission/reception control unit 12B is formed using an OS transistor included in the layer L3A, and an inductor 12C is formed in the layer L3B. Note that the inductor 12C can be formed in the same process as a wiring layer formed in the display device 19. As another example, the inductor 12C may be formed in the layer L3A. For example, the inductor 12C can be formed by utilizing a wiring layer in the layer L3A where the power amplifier is formed.

The power amplifier includes a transmission path for the connection with an OS transistor. In order to obtain stable frequency characteristics of the power amplifier, it is preferable that the characteristic impedance in the case where the power amplifier receives a signal and the characteristic impedance in the case where the power amplifier transmits a signal co-match even in a high frequency band. Note that in the state where the characteristic impedance can co-match even in a high frequency band, the difference between the characteristic impedance in the case where the power amplifier receives a signal and the characteristic impedance in the case where the power amplifier transmits a signal is preferably within 10%. More preferably, the error is within 5%. Further preferably, the error is within 3%.

Therefore, an impedance matching circuit for adjusting the characteristic impedance is included in the transmission path of the power amplifier. The impedance matching circuit is includes the transmission path and a plurality of passive elements. Note that the impedance matching circuit may include a transistor. For example, the transmission path includes a component such as a resistor, an inductor, and a capacitor. Accordingly, the plurality of passive elements are preferably used for adjusting the characteristic impedance of the transmission path. However, there is a problem in that the passive element needs a large area with respect to a transistor.

A transmission path for the transmission with less high-frequency signal loss is a coplanar waveguide, a coplanar line with a ground, a microstrip line, a slit line, an SIW (silicon in waveguide), or the like. Although a coplanar waveguide is described in this embodiment, the present invention can be similarly applied to a microstrip line.

A coplanar waveguide is a transmission path that has a structure in which a linear transmission path is formed on a surface of a conductor formed over a dielectric substrate to transmit an electromagnetic wave. Note that an electromagnetic wave signal can be rephrased as a high-frequency signal. The electromagnetic wave signal is referred to as a high-frequency signal in the following description. The coplanar waveguide functions as part of the impedance matching circuit in the case of using a high-frequency signal. The coplanar waveguide can adjust the characteristic impedance using the thickness or film quality of a conductor, the distance between the conductors, and the like, and thus is suitable for a wide-range adjustment. Note that the coplanar waveguide will be described in detail with reference to FIG. 11C and FIG. 11D.

Therefore, it is preferable that the coplanar waveguide be used as a transmission path in the impedance matching circuit. Note that a coplanar waveguide formed on a planar surface emits radiation noise in a vertical direction. For example, when the power amplifier is formed above a circuit formed in the layer L1, radiation noise emitted from the power amplifier affects the operation of the circuit and causes a malfunction in some cases. Furthermore, in some cases, radiation noise emitted from the circuit affects the impedance matching circuit and the characteristic impedance of the impedance matching circuit is changed, so that transmission loss is increased.

The impedance matching circuit can adjust the characteristic impedance using the passive elements such as a capacitor, a resistor, and an inductor. Thus, the impedance matching circuit has a larger area than a circuit using a transistor. For example, in the case where the transmission/reception control unit 12B and the signal processing unit 13 are formed as one semiconductor device, the influence of radiation noise needs to be considered. The device size of the transmission/reception control unit 12B increases in accordance with the size of the passive element included in the impedance matching circuit in some cases.

Figure 10:
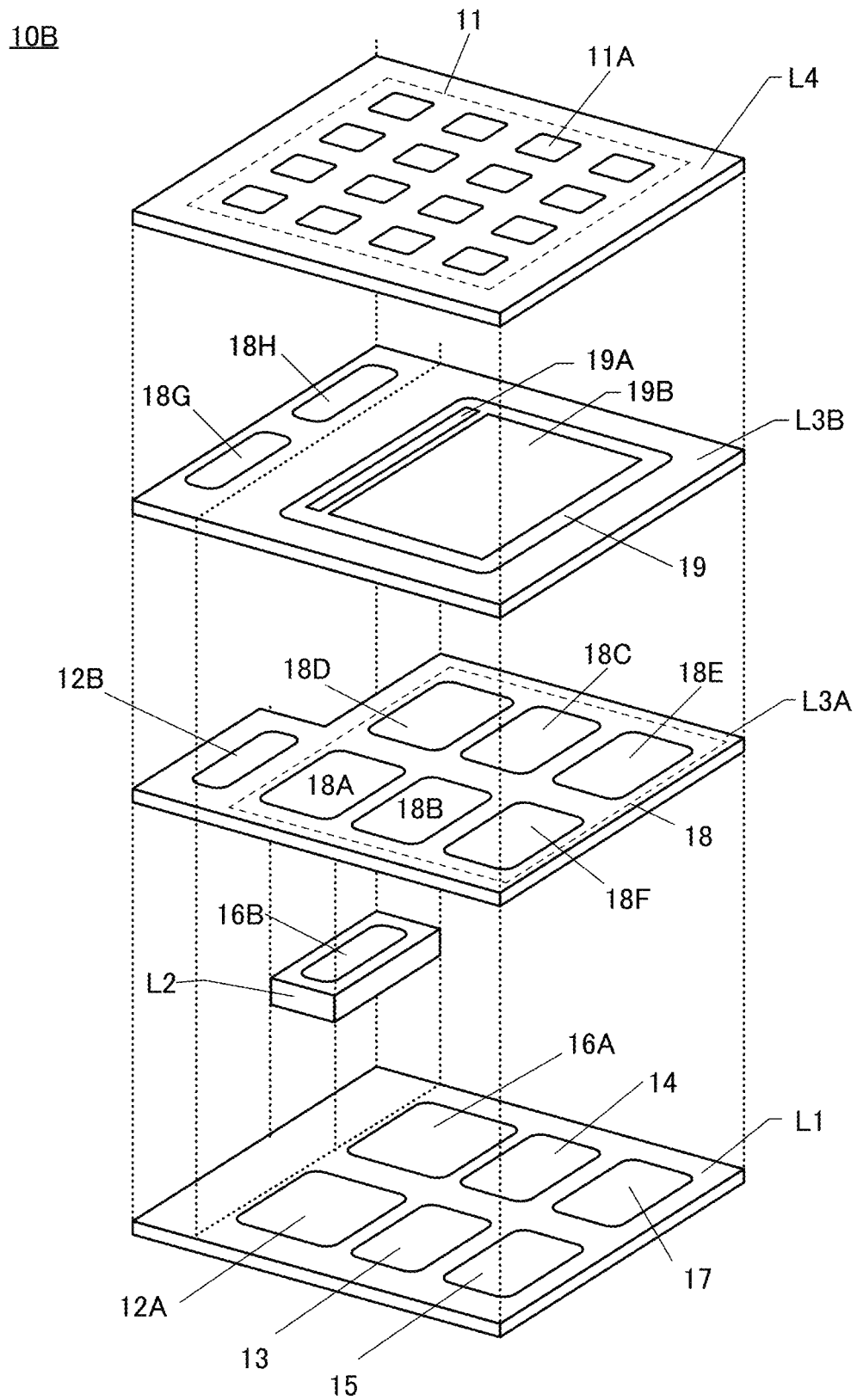
FIG. 10 is a diagram illustrating the semiconductor device.

FIG. 10 is a diagram illustrating the details of the semiconductor device 10B. FIG. 10 is different from FIG. 5 mainly in that the transmission/reception control unit 12B is provided in the layer L3A. It is preferable that a circuit included in the layer L1 be not placed in a position overlapping with the power amplifier included in the transmission/reception control unit 12B.

Next, the power amplifier is described in detail with reference to FIG. 11 to FIG. 14.

FIG. 11A and FIG. 11B are circuit diagrams illustrating the power amplifier 911. The power amplifier 911 includes an input terminal Sin, an output terminal Pout, a transistor Tr1, an impedance matching circuit Z1, and an impedance matching circuit Z2. The impedance matching circuit Z1 includes a capacitor C1, an inductor In1, and a coplanar waveguide CPW3a. The impedance matching circuit Z2 includes a capacitor C2, an inductor In2, a coplanar waveguide CPW2, and a coplanar waveguide CPW3b. In the case of describing a two-terminal coplanar waveguide, the coplanar waveguide might be described as the coplanar waveguide CPW2, and in the case of describing a three-terminal coplanar waveguide, the coplanar waveguide might be described as the coplanar waveguide CPW3. The coplanar waveguide CPW3 includes a terminal 1 to a terminal 3, and the coplanar waveguide CPW2 includes a terminal 1 and a terminal 2.

The input terminal Sin is electrically connected to one electrode of the capacitor C1. The other electrode of the capacitor C1 is electrically connected to the terminal 1 of the coplanar waveguide CPW3a. The terminal 2 of the coplanar waveguide CPW3a is electrically connected to a gate of the transistor Tr1. The terminal 3 of the coplanar waveguide CPW3a is electrically connected to one electrode of the inductor In1. The other electrode of the inductor In1 is electrically connected to a wiring V1.

One of a source and a drain of the transistor Tr1 is electrically connected to a wiring VG. The other of the source and the drain of the transistor Tr1 is electrically connected to the terminal 1 of the coplanar waveguide CPW3b. The terminal 2 of the coplanar waveguide CPW3b is electrically connected to one electrode of the inductor In2. The terminal 3 of the coplanar waveguide CPW3b is electrically connected to one electrode of the capacitor C2. The other electrode of the inductor In2 is electrically connected to a wiring V2.

The other electrode of the capacitor C2 is electrically connected to the terminal 1 of the coplanar waveguide CPW2. The terminal 2 of the coplanar waveguide CPW2 is electrically connected to the output terminal Pout.

Note that the transistor Tr1 is preferably an OS transistor. FIG. 11B illustrates an example of the transistor Tr1 that includes a back gate. The back gate of the transistor Tr1 is electrically connected to the source of the transistor Tr1, whereby the threshold voltage of the transistor Tr1 on the back gate side can be fixed. Note that the back gate of the transistor Tr1 may be electrically connected to another wiring and a fixed potential may be applied to the back gate.

The impedance of the impedance matching circuit Z1 is preferably adjusted to be the same as that of the impedance matching circuit Z2. For example, the impedance characteristics of the impedance matching circuit Z1 and the impedance matching circuit Z2 are preferably adjusted to be 50 ohms using the capacitor, the inductor, the coplanar waveguide, and the like.

FIG. 11C is a layout diagram illustrating the coplanar waveguide CPW2 as an example. The coplanar waveguide CPW2 has a structure in which a linear transmission path is formed on a surface of a conductor formed over a dielectric substrate.

The coplanar waveguide CPW2 includes an inner conductor 201a that is placed so as to be sandwiched between an outer conductor 202a and an outer conductor 202b. Note that the distance between the outer conductor 202a and the inner conductor 201a is preferably equal to the distance between the outer conductor 202b and the inner conductor 201a. With the distance, a capacitance component is formed between the inner conductor 201a and each of the outer conductor 202a and the outer conductor 202b. Note that the inner conductor 201a is a conductor formed in the same process as the outer conductor 202a and the outer conductor 202b.

In addition, the inner conductor 201a corresponds to the transmission path and includes the terminal 1 and the terminal 2. Note that the inner conductor 201a corresponding to the transmission path corresponds to a resistor component and an inductor component. Note that the inner conductor 201a has skin effect. Skin effect refers to the following phenomenon: in the case where a high-frequency signal flows through the inner conductor 201a, the current density of the inner conductor 201a is high at a surface of the inner conductor 201a and low in a portion apart from the surface of the inner conductor 201a. As a frequency becomes higher, more current concentrates on the surface and the AC resistance of the conductor becomes higher. Thus, the characteristic impedance of the coplanar waveguide CPW2 has peaks in accordance with the frequency. Therefore, it is preferable that the kind of an element contained in the conductor, the thickness of the conductor, the distance between the inner conductor and the outer conductor, and the like be selected in accordance with the characteristic impedance required for the coplanar waveguide CPW2.

Note that the outer conductor 202a included in the coplanar waveguide CPW2 preferably includes one or both of a terminal 203a and a terminal 203b, and the outer conductor 202b preferably includes one or both a terminal 203c and a terminal 203d. A fixed potential is preferably applied to the outer conductor 202a and the outer conductor 202b through the terminal 203a to the terminal 203d. For example, 0 V (a reference potential) is applied to the outer conductor 202a and the outer conductor 202b.

FIG. 11D is a layout diagram illustrating the coplanar waveguide CPW3 as an example. The coplanar waveguide CPW3 is a transmission path including a bent portion (branch).

The coplanar waveguide CPW3 includes an inner conductor 201b that is placed so as to be sandwiched between the outer conductor 202a, the outer conductor 202b, and an outer conductor 202c. Note that the distance between the outer conductor 202a and the inner conductor 201b is preferably equal to the distance between the outer conductor 202b and the inner conductor 201b and the distance between the outer conductor 202c and the inner conductor 201b. With the distance, a capacitance component is formed between the inner conductor 201a and each of the outer conductor 202a, the outer conductor 202b, and the outer conductor 202c. The inner conductor 201b is a conductor formed in the same process as the outer conductor 202a, the outer conductor 202b, and the outer conductor 202c.

In addition, the inner conductor 201b corresponds to the transmission path and includes the terminal 1, the terminal 2, and the terminal 3. Note that the inner conductor 201b corresponding to the transmission path corresponds to a resistor component and an inductor component. Note that in the coplanar waveguide CPW3 including a bent portion, an offset region may be provided by making one capacitance component of the bent portion large and the other small. The magnitude of an electromagnetic field generated by a high-frequency signal passing through the transmission path is changed by the change in the capacitance component, and thus change such as the bent portion can be absorbed.

Figure 12:
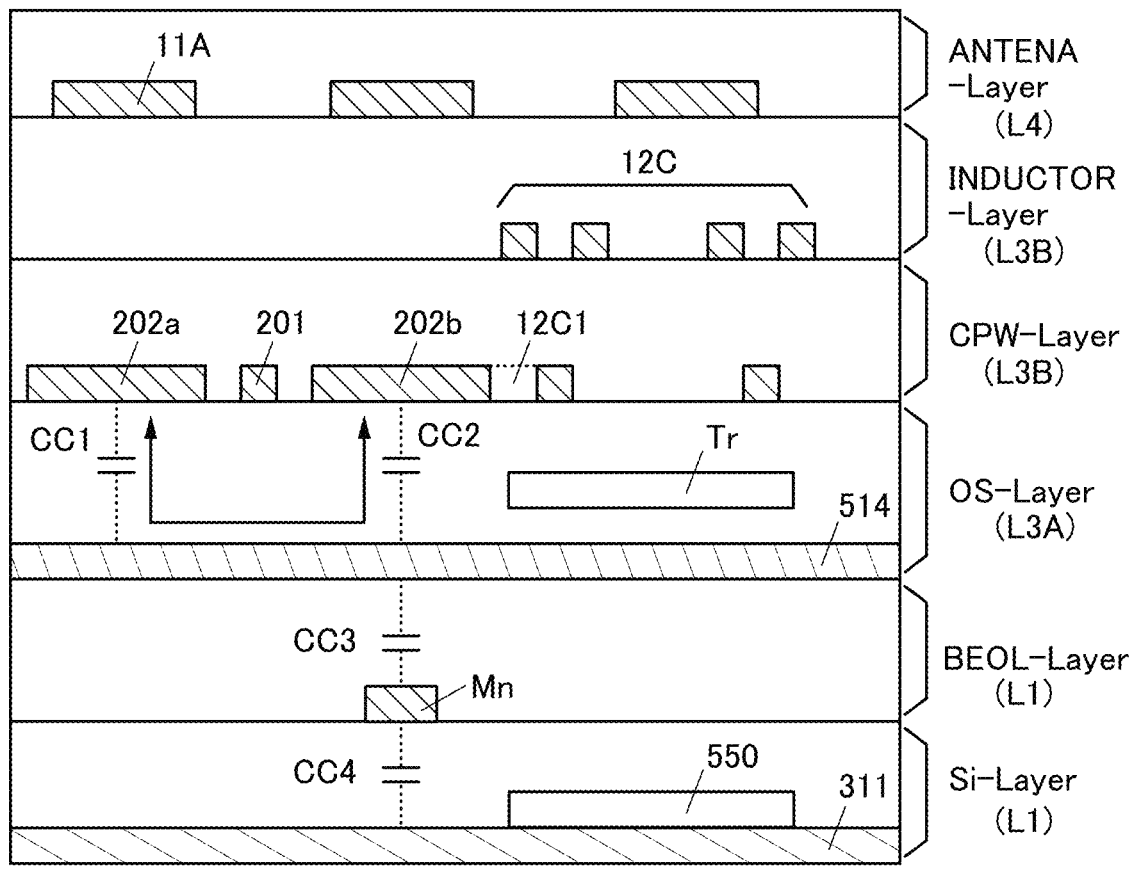
FIG. 12 is a diagram illustrating a structure example of the semiconductor device.

FIG. 12 is a schematic cross-sectional view of the semiconductor device 10B. The semiconductor device 10B includes the layer L1, the layer L3A, the layer L3B, and the layer L4. The layer L1 includes a Si-Layer and a BEOL-Layer. The Si-Layer includes a substrate 311. Note that a transistor 550 formed in the Si-Layer preferably contains silicon in its channel formation region. The transistor 550 will be described in detail in Embodiment 3. The BEOL-Layer includes a plurality of wirings layers. FIG. 12 illustrates an example where the BEOL-Layer includes a wiring Mn. Note that the layer L3A, the layer L3B, and the layer L4 may be rephrased as wiring layers of the transistor included in the layer L1.

Next, the layer L3A is described. The layer L3A includes an OS-Layer. The layer L3A includes a transistor Tr. The transistor Tr is preferably an OS transistor. The OS transistor will be described in detail in Embodiment 3. Note that the layer L3A is formed over the layer L1 with an insulator 514 therebetween. The insulator 514 is a metal oxide containing oxygen and at least one of hafnium, aluminum, and tantalum. For example, hafnium oxide or aluminum oxide has a higher dielectric constant than silicon oxide and silicon oxynitride. Note that in the case where the dielectric constant of an insulator is high, most of electromagnetic waves are absorbed by the insulator or is reflected by the insulator.

For example, in the case where a high-frequency signal is applied to the inner conductor 201a, the outer conductor 202a and the outer conductor 202b form a system bonded through coupling capacitance CC1 and coupling capacitance CC2. Therefore, a space formed between the insulator 514 and each of the outer conductor 202a and the outer conductor 202b can be regarded as a waveguide tube. The insulator 514 can reduce the influence of radiation noise on the transistor 550 that is formed in the layer L1. Furthermore, the influence of radiation noise emitted from the transistor 550 can be reduced by the insulator 514.

When the insulator 514 is provided, coupling capacitance CC3 is generated between the insulator 514 and the wiring Mn and coupling capacitance CC4 is generated between the wiring Mn and the substrate 311 or the transistor 550. Accordingly, a plurality of coupling capacitances are connected in series between the inner conductor 201 and the transistor 550, whereby the combined capacitance is formed. The capacitance value of the combined capacitance is preferably as small as possible. For example, when the capacitance value of the combined capacitance is small, the radiation noise is attenuated and the influence of the radiation noise is reduced.

Furthermore, the insulator 514 preferably has a barrier property against oxygen and hydrogen contained in the layer L1. The barrier property will be described in detail using Embodiment 3.

The layer L3B includes a CPW-Layer and an INDUCTOR-Layer. In the CPW-Layer and the INDUCTOR-Layer, the inductor 12C that is a passive element and the coplanar waveguide CPW are formed as components of the impedance matching circuit. Note that the inductor 12C may be formed using a plurality of conductive layers. Note that the inductor 12C may be formed in the same process as the coplanar waveguide CPW. For example, when part of the inductor 12C is formed in the same process as a coplanar waveguide 3, the inductor 12C can be easily connected to the coplanar waveguide CPW3 through an inductor 12C1.

The layer L4 includes an ANTENA-Layer. For example, the ANTENA-Layer preferably includes the antenna array 11 for transmitting a high-frequency signal. The antenna array 11 includes the plurality of antennas 11A and is electrically connected to the coplanar waveguide CPW2.

Figure 13:
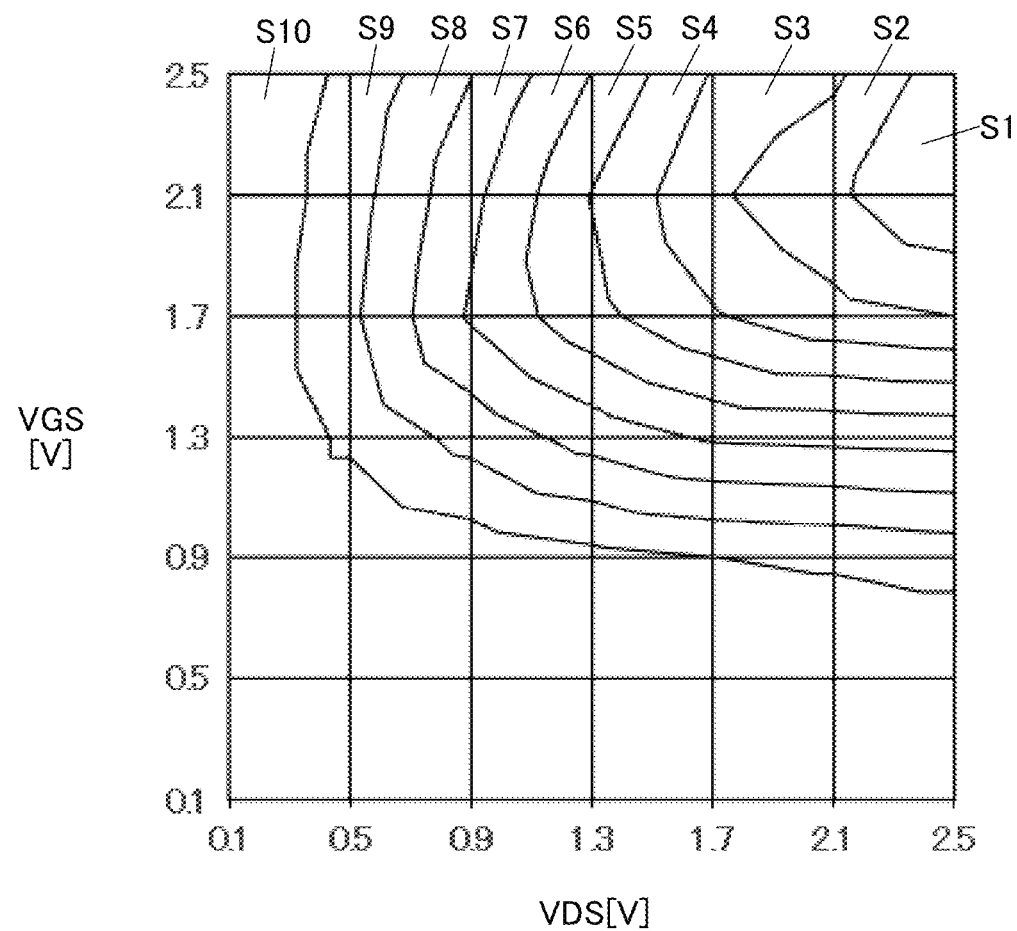
FIG. 13 is a graph showing electrical characteristics of transistors.

FIG. 13 is a graph showing electrical characteristics of transistors. A transistor using a high-frequency signal preferably has a high conductance. The horizontal axis of the graph shown in FIG. 13 represents a VDS voltage between a source and a drain of a transistor, and the vertical axis represents a VGS voltage between the source and agate of the transistor. Note that the graph is shown using a contour graph, and the unit of data is microsiemens [μS].

A region S1 is within a range higher than or equal to 10 μS and lower than or equal to 11 μS. A region S2 is within a range higher than or equal to 9 μS and lower than 10 μS. A region S3 is within a range higher than or equal to 8 μS and lower than 9 μS. A region S4 is within a range higher than or equal to 7 μS and lower than 8 μS. A region S5 is within a range higher than or equal to 6 μS and lower than 7 μS. A region S6 is within a range higher than or equal to 5 μS and lower than 6 μS. A region S7 is within a range higher than or equal to 4 μS and lower than 5 μS. A region S8 is within a range higher than or equal to 3 μS and lower than 4 μS. A region S9 is within a range higher than or equal to 2 μS and lower than 3 μS. A region S10 is within a range higher than or equal to 1 μS and lower than 2 μS.

The transistor has a region with a high conductance value with respect to the voltage VDS. Thus, it is preferable to use a region of the region S1 or the region S2 where the voltage VGS and the voltage VDS are high. For example, from the electrical characteristics of transistors shown in FIG. 13, it is preferable that 2.3 V and 2.5 V be respectively applied to the wiring V1 and the wiring V2 of the power amplifier 911 in FIG. 11A.

Figure 14:
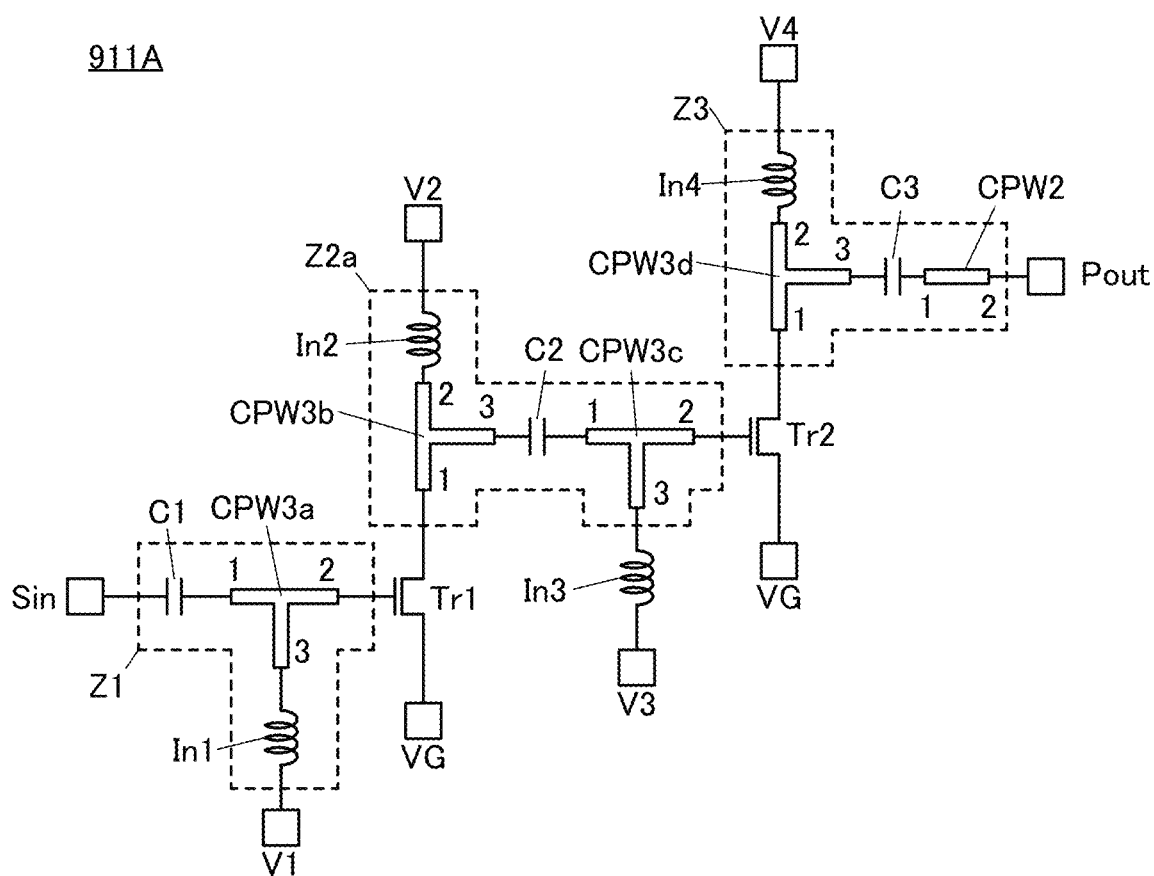
FIG. 14 is a circuit diagram illustrating a semiconductor device.

FIG. 14 is a circuit diagram illustrating a power amplifier. The power amplifier 911 is referred to for the description of a power amplifier 911A, and the same portions or portions having similar functions are denoted by the same reference numerals in common in different drawings and repetitive description thereof will be omitted.

The power amplifier 911A is different from the power amplifier 911 in including a transistor Tr2, an impedance matching circuit Z2a, and an impedance matching circuit Z3. The impedance matching circuit Z2a includes the capacitor C2, the inductor In2, an inductor In3, the coplanar waveguide CPW3b, and a coplanar waveguide CPW3c. The impedance matching circuit Z3 includes a capacitor C3, an inductor In4, a coplanar waveguide CPW3d, and the coplanar waveguide CPW2.

The input terminal Sin is electrically connected to one electrode of the capacitor C1. The other electrode of the capacitor C1 is electrically connected to the terminal 1 of the coplanar waveguide CPW3a. The terminal 2 of the coplanar waveguide CPW3a is electrically connected to a gate of the transistor Tr1. The terminal 3 of the coplanar waveguide CPW3a is electrically connected to one electrode of the inductor In1. The other electrode of the inductor In1 is electrically connected to the wiring V1.

One of a source and a drain of the transistor Tr1 is electrically connected to the wiring VG. The other of the source and the drain of the transistor Tr1 is electrically connected to the terminal 1 of the coplanar waveguide CPW3b. The terminal 2 of the coplanar waveguide CPW3b is electrically connected to one electrode of the inductor In2. The terminal 3 of the coplanar waveguide CPW3b is electrically connected to one electrode of the capacitor C2. The other electrode of the inductor In2 is electrically connected to the wiring V2.

The other electrode of the capacitor C2 is electrically connected to the terminal 1 of the coplanar waveguide CPW3c. The terminal 2 of the coplanar waveguide CPW3c is electrically connected to a gate of the transistor Tr2. The terminal 3 of the coplanar waveguide CPW3c is electrically connected to one electrode of the inductor In3. The other electrode of the inductor In3 is electrically connected to a wiring V3.

One of a source and a drain of the transistor Tr2 is electrically connected to the wiring VG. The other of the source and the drain of the transistor Tr2 is electrically connected to the terminal 1 of the coplanar waveguide CPW3d. The terminal 2 of the coplanar waveguide CPW3d is electrically connected to one electrode of the inductor In4. The terminal 3 of the coplanar waveguide CPW3d is electrically connected to one electrode of the capacitor C3. The other electrode of the inductor In4 is electrically connected to a wiring V4. The other electrode of the capacitor C3 is electrically connected to the terminal 1 of the coplanar waveguide CPW2. The terminal 2 of the coplanar waveguide CPW2 is electrically connected to the output terminal Pout.

Note that the transistor Tr1 and the transistor Tr2 are preferably OS transistors. The transistor Tr1 and the transistor Tr2 can include back gates. The back gate of the transistor Tr1 is electrically connected to the source of the transistor Tr1, whereby the threshold voltage of the transistor Tr1 on the back gate side can be fixed. The back gate of the transistor Tr2 is electrically connected to the source of the transistor Tr2, whereby the threshold voltage of the transistor Tr2 on the back gate side can be fixed. Note that the back gates of the transistor Tr1 and the transistor Tr2 may be electrically connected to other wirings and fixed potentials may be applied to the back gates.

The impedance of the impedance matching circuit Z1 is preferably adjusted to be the same as that of the impedance matching circuit Z2a and the impedance matching circuit Z3. For example, the impedance characteristics of the impedance matching circuit Z1, the impedance matching circuit Z2a, and the impedance matching circuit Z3 are preferably adjusted to be 50 ohms using the capacitor, the inductor, the coplanar waveguide, and the like.

The composition, structure, method, and the like described in this embodiment can be used in combination as appropriate with the compositions, structures, methods, and the like described in the other embodiments, the example, and the like.

Embodiment 3

In this embodiment, structures of transistors that can be used in the semiconductor device described in the above embodiments will be described. For example, a structure in which transistors having different electrical characteristics are stacked will be described. With such a structure, the degree of freedom in design of a semiconductor device can be increased. Stacking transistors having different electrical characteristics can increase the integration degree of the semiconductor device.

Figure 15:
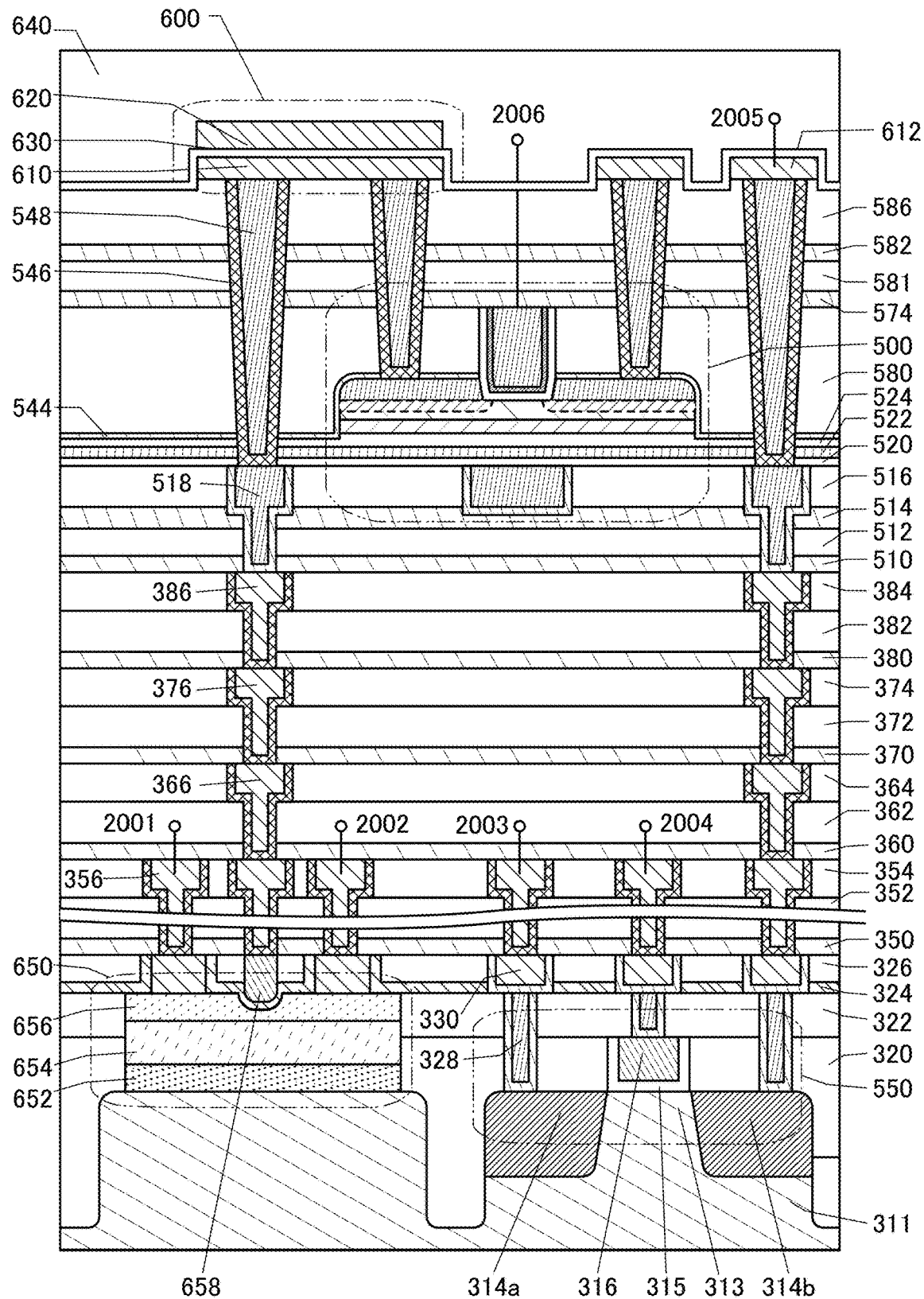
FIG. 15 is a diagram illustrating a structure example of a semiconductor device.
Figure 17A:
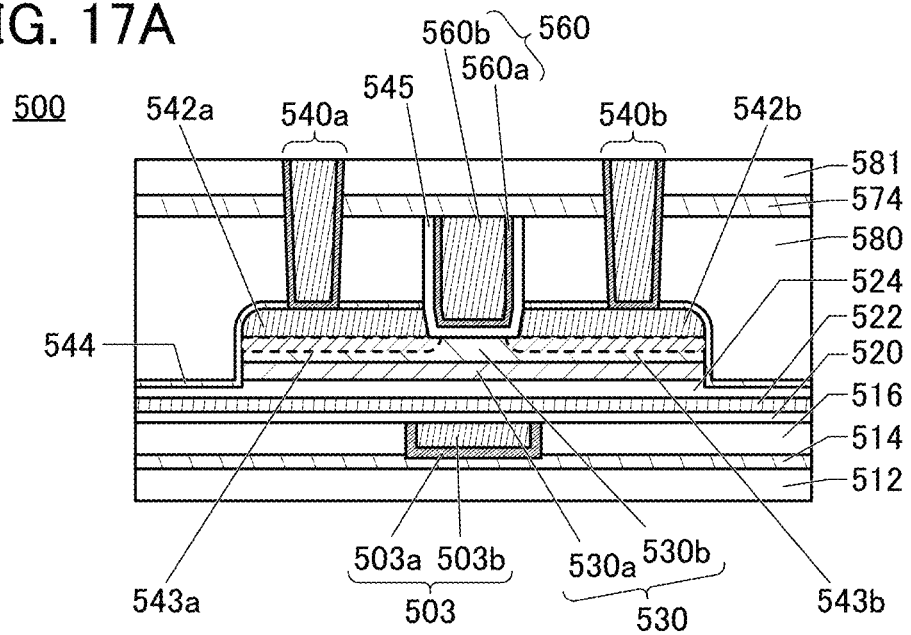
FIG. 17A to FIG. 17C are diagrams illustrating a transistor structure example.
Figure 17B:
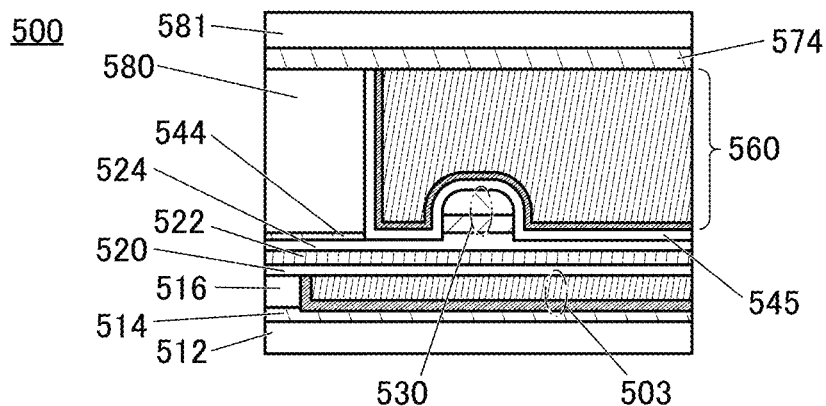
Figure 17C:
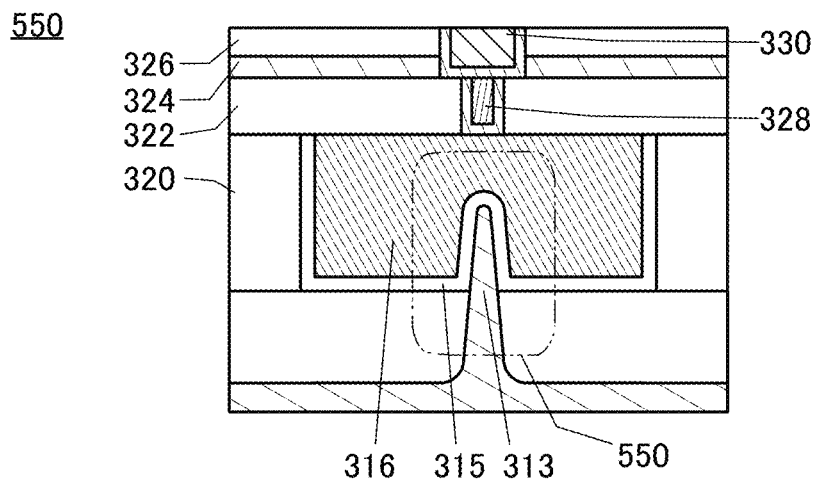

FIG. 15 illustrates part of a cross-sectional structure of a semiconductor device. The semiconductor device illustrated in FIG. 15 includes a transistor 550, a transistor 500, a transistor 650, and a capacitor 600. FIG. 17A is a cross-sectional view of the transistor 500 in the channel length direction, FIG. 17B is a cross-sectional view of the transistor 500 in the channel width direction, and FIG. 17C is a cross-sectional view of the transistor 550 in the channel width direction. For example, the transistor 500, the transistor 550, and the transistor 650 correspond to the transistor 112, the transistor 116, and the transistor 115, respectively, described in the above embodiment. The capacitor 600 corresponds to the capacitor 113. The wiring 2001 to the wiring 2006 can be electrically connected to other transistors or the like. Note that the wiring 2005 is electrically connected to the wiring 2006.

Note that in this specification, an expression that transistors are placed in a position including a region where they overlap with each other is sometimes used. The range of a transistor is a range including a channel formation region of the transistor and a region functioning as a source or a drain of the transistor.

For example, in the case where the transistor 500 is placed in a position overlapping with the transistor 550, it can be said that the transistor 500 is placed in a position where a partial region of a source or a drain of the transistor 500 overlaps with a region of a source or a drain of the transistor 550 as illustrated in FIG. 15. As another example, it can be said that the transistor 500 is placed in a position where a partial region of the source or the drain of the transistor 500 overlaps with a region of a source or a drain of the transistor 650.

Note that in FIG. 15, the transistor 500 is placed in a position overlapping with each of the transistor 550 and the transistor 650 for explanation. Note that the transistor 550 is the transistor included in the layer L1, the transistor 650 is the transistor included in the layer L2, and the transistor 500 is the transistor included in the layer L3.

The transistor 500 is an OS transistor and has an extremely low off-state current. Accordingly, data voltage or charge written to a storage node through the transistor 500 can be retained for a long time. In other words, the power consumption of the semiconductor device can be reduced because the storage node has a reduced frequency of refresh operation or requires no refresh operation.

In FIG. 15, the transistor 500 is provided above the transistor 550, and the capacitor 600 is provided above the transistor 550 and the transistor 500.

The transistor 550 is provided on a substrate 311 and includes a conductor 316, an insulator 315, a semiconductor region 313 that is part of the substrate 311, and a low-resistance region 314a and a low-resistance region 314b each functioning as a source region or a drain region.

As illustrated in FIG. 17C, a top surface and a side surface in the channel width direction of the semiconductor region 313 of the transistor 550 is covered with the conductor 316 with the insulator 315 therebetween. The use of such a Fin-type transistor as the transistor 550 can increase the effective channel width and thus improve on-state characteristics of the transistor 550. In addition, contribution of the electric field of the gate electrode can be increased, so that the off-state characteristics of the transistor 550 can be improved.

Note that the transistor 550 may be either a p-channel transistor or an n-channel transistor.

It is preferable that a region of the semiconductor region 313 where a channel is formed, a region in the vicinity thereof, the low-resistance region 314a and the low-resistance region 314b each functioning as the source region or the drain region, and the like contain a semiconductor such as a silicon-based semiconductor, further preferably single crystal silicon. Alternatively, a material containing Ge (germanium), SiGe (silicon germanium), GaAs (gallium arsenide), GaAlAs (gallium aluminum arsenide), or the like may be used. A structure may be employed in which silicon whose effective mass is controlled by applying stress to the crystal lattice and changing the lattice spacing is used. Alternatively, the transistor 550 may be a HEMT (High Electron Mobility Transistor) using GaAs and GaAlAs, or the like.

The low-resistance region 314a and the low-resistance region 314b contain an element that imparts n-type conductivity, such as arsenic or phosphorus, or an element that imparts p-type conductivity, such as boron, in addition to a semiconductor material used for the semiconductor region 313.

The conductor 316 functioning as a gate electrode can be formed using a semiconductor material such as silicon containing the element that imparts n-type conductivity, such as arsenic or phosphorus, or the element that imparts p-type conductivity, such as boron, or a conductive material such as a metal material, an alloy material, or a metal oxide material.

Note that a material used for a conductor determines the work function; thus, selecting the material used for the conductor can adjust the threshold voltage of the transistor. Specifically, titanium nitride, tantalum nitride, or the like is preferably used for the conductor. Furthermore, in order to ensure the conductivity and embeddability of the conductor, a stacked layer of metal materials such as tungsten and aluminum is preferably used for the conductor. In particular, tungsten is preferable in terms of heat resistance.

The transistor 550 may be formed using an SOI (Silicon on Insulator) substrate, for example.

The SOI substrate may be an SIMOX (Separation by Implanted Oxygen) substrate formed in such a manner that an oxygen ion is implanted into a mirror-polished wafer, and then, an oxide layer is formed at a certain depth from the surface and defects generated in a surface layer are eliminated by high-temperature heating or an SOI substrate formed by a Smart-Cut method in which a semiconductor substrate is cleaved by utilizing growth of a minute void, which is formed by implantation of a hydrogen ion, by heat treatment; an ELTRAN method (registered trademark: Epitaxial Layer Transfer); or the like. A transistor formed using a single crystal substrate contains a single crystal semiconductor in a channel formation region.

Figure 16:
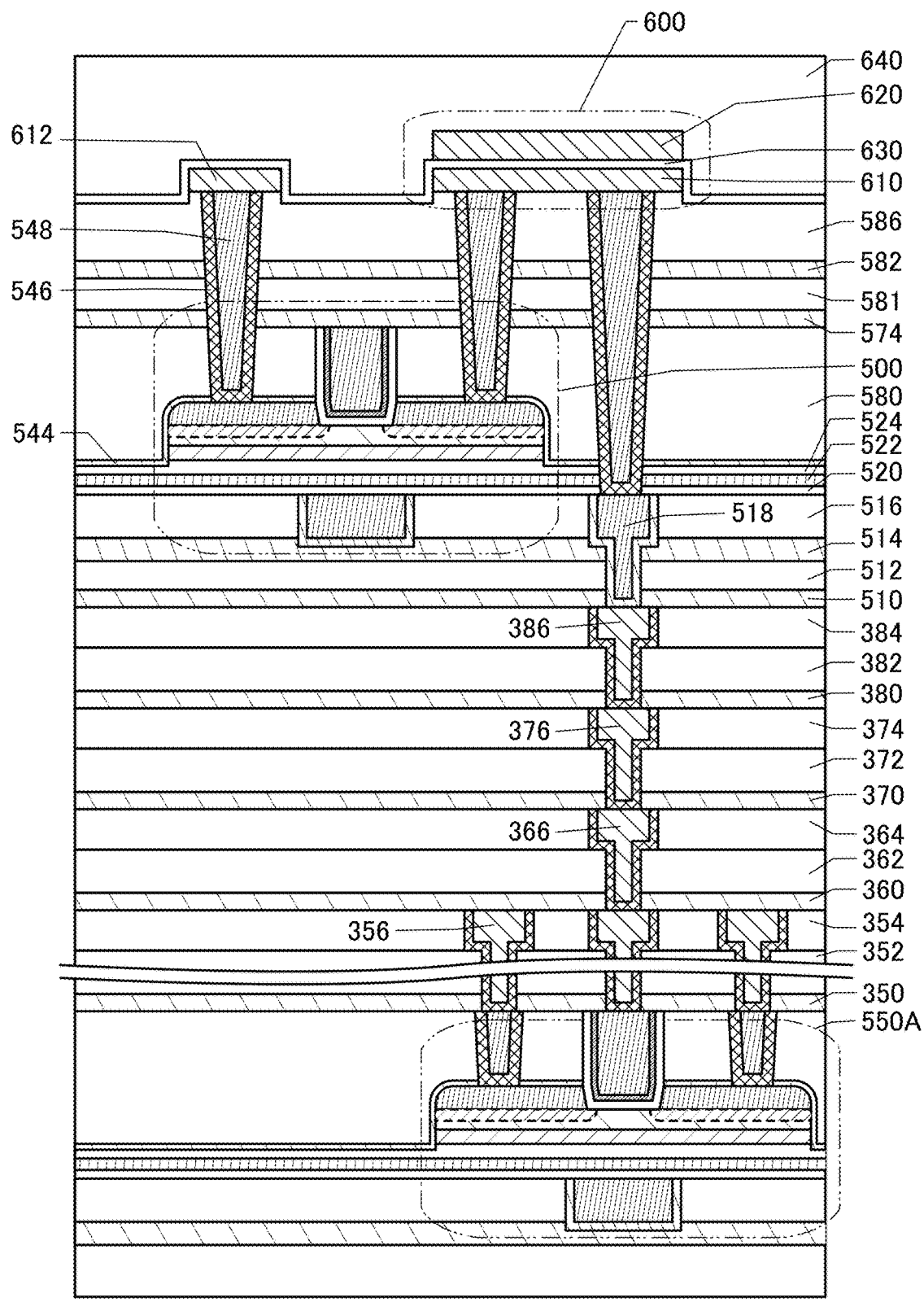
FIG. 16 is a diagram illustrating a structure example of a semiconductor device.

FIG. 16 illustrates the transistor 550A as the third transistor included in the layer L3A and the transistor 500 as the third transistor included in the layer L3B. Note that FIG. 16 illustrates an example where the transistor 550A is electrically connected to the transistor 500. Note that the transistor 500 included in the transmission/reception control unit 12, the memory device 18, or the display device 19 is not necessarily connected to the transistor 550.

Note that the transistor 500, the transistor 550, and the transistor 650 that are illustrated in FIG. 15 or a transistor 500A and the transistor 550 that are illustrated in FIG. 16 are just examples and the structures are not limited thereto, and an appropriate transistor can be used in accordance with a circuit structure or a driving method. For example, when the semiconductor device is a single-polarity circuit using only OS transistors (which means a circuit including only transistors having the same polarity, e.g., only n-channel transistors), the transistor 550A has a structure similar to that of the transistor 500 as illustrated in FIG. 16. Note that the details of the transistor 500 will be described later.

The transistor 650 is described. The transistor 650 is formed over the same substrate where the transistor 550 is formed. The transistor 650 is formed using a semiconductor layer to be formed over a single crystal silicon substrate, a sapphire substrate, or an SOI substrate. The semiconductor layer preferably has a crystalline structure containing gallium. Examples of the semiconductor layer containing gallium include gallium nitride (hereinafter, GaN) and gallium oxide (GaOx).

A semiconductor device using GaN for a semiconductor layer 654 is described with reference to FIG. 15. For example, GaN can be formed in such a manner that a low-temperature buffer layer 652 is provided over the substrate 311 to make single crystal GaN epitaxially grow on the low-temperature buffer layer 652. The epitaxially-grown single crystal GaN corresponds to the semiconductor layer 654. Note that in the example of FIG. 15, a single crystal silicon substrate is used as the substrate 311.

The transistor 650 is preferably formed using a semiconductor layer where a semiconductor layer 656 is epitaxially grown on the semiconductor layer 654. The semiconductor layer 654 is preferably GaN and the semiconductor layer 656 is preferably AlGaN. For example, it is known that aluminum nitride (AlN) has superior material characteristics of a band gap (6.2 eV) that is approximately 2 times that of GaN, an electrostatic breakdown electric field (12 MV/cm) that is approximately 4 times that of GaN, and a thermal conductivity (2.9 W/cmK) that is approximately 1.5 times that of GaN. Therefore, AlN, and AlGaN, which is a mixed crystal of AlN and GaN are preferable materials for a high-output and high-frequency device. A HEMT (High Electron Mobility Transistor) whose channel formation region is AlGaN can operate with a higher withstand voltage than a HEMT whose channel formation region is GaN. At the interface between GaN and AlGaN, two dimensional electron gas (2DEG) is generated due to polarization effects in GaN and AlGaN. That is, in a transistor with a HEMT structure, 2DEG is a channel formation region.

A conductor 330 is provided over the semiconductor layer 656. The conductor 330 corresponds to a source or a drain of the transistor 650.

An insulator 324 is provided between the conductor 658 and the semiconductor layer 656. Note that the conductor 658 may also be referred to as a gate electrode, and the insulator 324 may also be referred to as a gate insulator of the transistor 650. The insulator 324 can be formed using silicon oxide, aluminum oxide, hafnium oxide, or the like. For example, the insulator 324 contains any one of silicon oxide, aluminum oxide, and hafnium oxide, so that the off-state current of the transistor 650 is reduced. For detailed description of the gate insulator, the gate insulator is preferably a $SiO_2$ film, an $Al_2O_3$ film, or a $HfO_2$ film.

The transistor 650 preferably has a recessed gate structure. FIG. 15 illustrates an example in which the transistor 650 has a recessed gate structure. When the transistor 650 has a recessed gate structure, the off-state current of the transistor 650 is reduced. The recessed gate structure is formed by thinning with etching of the semiconductor layer 656 that is in a position overlapping with the gate electrode and in which a channel formation region is formed. The region of the semiconductor layer 656 that is thinned with the etching is referred to as a recessed region. The recessed region can have a high threshold voltage due to increased depletion of 2DEG. In addition, large current can flow through a non-recessed region because the concentration of 2DEG is increased.

An insulator 320, an insulator 322, an insulator 324, and an insulator 326 are stacked sequentially to cover the transistor 550.

The insulator 320, the insulator 322, the insulator 324, and the insulator 326 are formed using, for example, silicon oxide, silicon oxynitride, silicon nitride oxide, silicon nitride, aluminum oxide, aluminum oxynitride, aluminum nitride oxide, or aluminum nitride.

Note that in this specification, silicon oxynitride refers to a material that has a higher oxygen content than a nitrogen content, and silicon nitride oxide refers to a material that has a higher nitrogen content than an oxygen content. Moreover, in this specification, aluminum oxynitride refers to a material that has a higher oxygen content than a nitrogen content, and aluminum nitride oxide refers to a material that has a higher nitrogen content than an oxygen content.

The insulator 322 may have a function of a planarization film for eliminating a level difference caused by the transistor 550 or the like provided below the insulator 322. For example, a top surface of the insulator 322 may be planarized by planarization treatment using a chemical mechanical polishing (CMP) method or the like to increase planarity.

The insulator 324 is preferably formed using a film having a barrier property that prevents hydrogen and impurities from diffusing from the substrate 311, the transistor 550, or the like into a region where the transistor 500 is provided.

For the film having a barrier property against hydrogen, silicon nitride formed by a CVD method can be used, for example. Here, diffusion of hydrogen into a semiconductor element including an oxide semiconductor, such as the transistor 500, degrades the characteristics of the semiconductor element in some cases. Therefore, a film that inhibits hydrogen diffusion is preferably provided between the transistor 500 and the transistor 550. Specifically, the film that inhibits hydrogen diffusion is a film from which a small amount of hydrogen is released.

The amount of released hydrogen can be measured by thermal desorption spectroscopy (TDS), for example. The amount of hydrogen released from the insulator 324 that is converted into hydrogen atoms per unit area of the insulator 324 is less than or equal to $10 \times 10^{15}$ atoms/cm$^2$, preferably less than or equal to $5 \times 10^{15}$ atoms/cm$^2$ in TDS analysis in a film-surface temperature range of 50° C. to 500° C., for example.

Note that the dielectric constant of the insulator 326 is preferably lower than that of the insulator 324. For example, the dielectric constant of the insulator 326 is preferably lower than 4, further preferably lower than 3. For example, the dielectric constant of the insulator 326 is preferably 0.7 times or less that of the insulator 324, further preferably 0.6 times or less that of the insulator 324. In the case where a material with a low dielectric constant is used for an interlayer film, the parasitic capacitance between wirings can be reduced.

A conductor 328, the conductor 330, and the like that are connected to the capacitor 600 or the transistor 500 are embedded in the insulator 320, the insulator 322, the insulator 324, and the insulator 326. The conductor 330 has a function of the source electrode or the drain electrode of the transistor 650. Note that the conductor 328 and the conductor 330 each have a function of a plug or a wiring. A plurality of conductors functioning as plugs or wirings are collectively denoted by the same reference numeral in some cases. In this specification and the like, a wiring and a plug connected to the wiring may be a single component. That is, part of a conductor functions as a wiring in some cases, and part of a conductor functions as a plug in other cases.

As a material for each of the plugs and wirings (e.g., the conductor 328 and the conductor 330), a conductive material such as a metal material, an alloy material, a metal nitride material, or a metal oxide material can be used in a single-layer structure or a stacked-layer structure. It is preferable to use a high-melting-point material that has both heat resistance and conductivity, such as tungsten or molybdenum, and it is preferable to use tungsten. Alternatively, a low-resistance conductive material such as aluminum or copper is preferably used. The use of a low-resistance conductive material can reduce wiring resistance.

A wiring layer may be provided over the insulator 326 and the conductor 330. For example, an insulator 350, an insulator 352, and an insulator 354 are stacked sequentially in FIG. 15. Furthermore, a conductor 356 is formed in the insulator 350, the insulator 352, and the insulator 354. The conductor 356 has a function of a plug connected to the transistor 550, a plug connected to the transistor 650, or a wiring. Note that the conductor 356 can be provided using a material similar to that for the conductor 328 and the conductor 330.

Note that for example, the insulator 350 is preferably formed using an insulator having a barrier property against hydrogen, like the insulator 324. Furthermore, the conductor 356 preferably includes a conductor having a barrier property against hydrogen. The conductor having a barrier property against hydrogen is formed particularly in an opening portion of the insulator 350 having a barrier property against hydrogen. In such a structure, the transistor 550 or the transistor 650 can be separated from the transistor 500 with a barrier layer, so that the hydrogen diffusion from the transistor 550 or the transistor 650 into the transistor 500 can be inhibited.

Note that as the conductor having a barrier property against hydrogen, tantalum nitride is preferably used, for example. By stacking tantalum nitride and tungsten, which has high conductivity, hydrogen diffusion from the transistor 550 can be inhibited while the conductivity of a wiring is ensured. In that case, a tantalum nitride layer having a barrier property against hydrogen is preferably in contact with the insulator 350 having a barrier property against hydrogen.

A wiring layer may be provided over the insulator 354 and the conductor 356. For example, an insulator 360, an insulator 362, and an insulator 364 are stacked sequentially in FIG. 15. Furthermore, a conductor 366 is formed in the insulator 360, the insulator 362, and the insulator 364. The conductor 366 functions as a plug or a wiring. Note that the conductor 366 can be provided using a material similar to that for the conductor 328 and the conductor 330.

Note that for example, the insulator 360 is preferably formed using an insulator having a barrier property against hydrogen, like the insulator 324. Furthermore, the conductor 366 preferably includes a conductor having a barrier property against hydrogen. The conductor having a barrier property against hydrogen is formed particularly in an opening portion of the insulator 360 having a barrier property against hydrogen. In such a structure, the transistor 550 or the transistor 650 can be separated from the transistor 500 with a barrier layer, so that the hydrogen diffusion from the transistor 550 or the transistor 650 into the transistor 500 can be inhibited.

A wiring layer may be provided over the insulator 364 and the conductor 366. For example, an insulator 370, an insulator 372, and an insulator 374 are stacked sequentially in FIG. 15. Furthermore, a conductor 376 is formed in the insulator 370, the insulator 372, and the insulator 374. The conductor 376 has a function of a plug or a wiring. Note that the conductor 376 can be provided using a material similar to that for the conductor 328 and the conductor 330.

Note that for example, the insulator 370 is preferably formed using an insulator having a barrier property against hydrogen, like the insulator 324. Furthermore, the conductor 376 preferably includes a conductor having a barrier property against hydrogen. The conductor having a barrier property against hydrogen is formed particularly in an opening portion of the insulator 370 having a barrier property against hydrogen. In such a structure, the transistor 550 or the transistor 650 can be separated from the transistor 500 with a barrier layer, so that the hydrogen diffusion from the transistor 550 or the transistor 650 into the transistor 500 can be inhibited.

A wiring layer may be provided over the insulator 374 and the conductor 376. For example, an insulator 380, an insulator 382, and an insulator 384 are stacked sequentially in FIG. 15. Furthermore, a conductor 386 is formed in the insulator 380, the insulator 382, and the insulator 384. The conductor 386 has a function of a plug or a wiring. Note that the conductor 386 can be provided using a material similar to that for the conductor 328 and the conductor 330.

Note that for example, the insulator 380 is preferably formed using an insulator having a barrier property against hydrogen, like the insulator 324. Furthermore, the conductor 386 preferably includes a conductor having a barrier property against hydrogen. The conductor having a barrier property against hydrogen is formed particularly in an opening portion of the insulator 380 having a barrier property against hydrogen. In such a structure, the transistor 550 or the transistor 650 can be separated from the transistor 500 with a barrier layer, so that the hydrogen diffusion from the transistor 550 or the transistor 650 into the transistor 500 can be inhibited.

Figure 20:
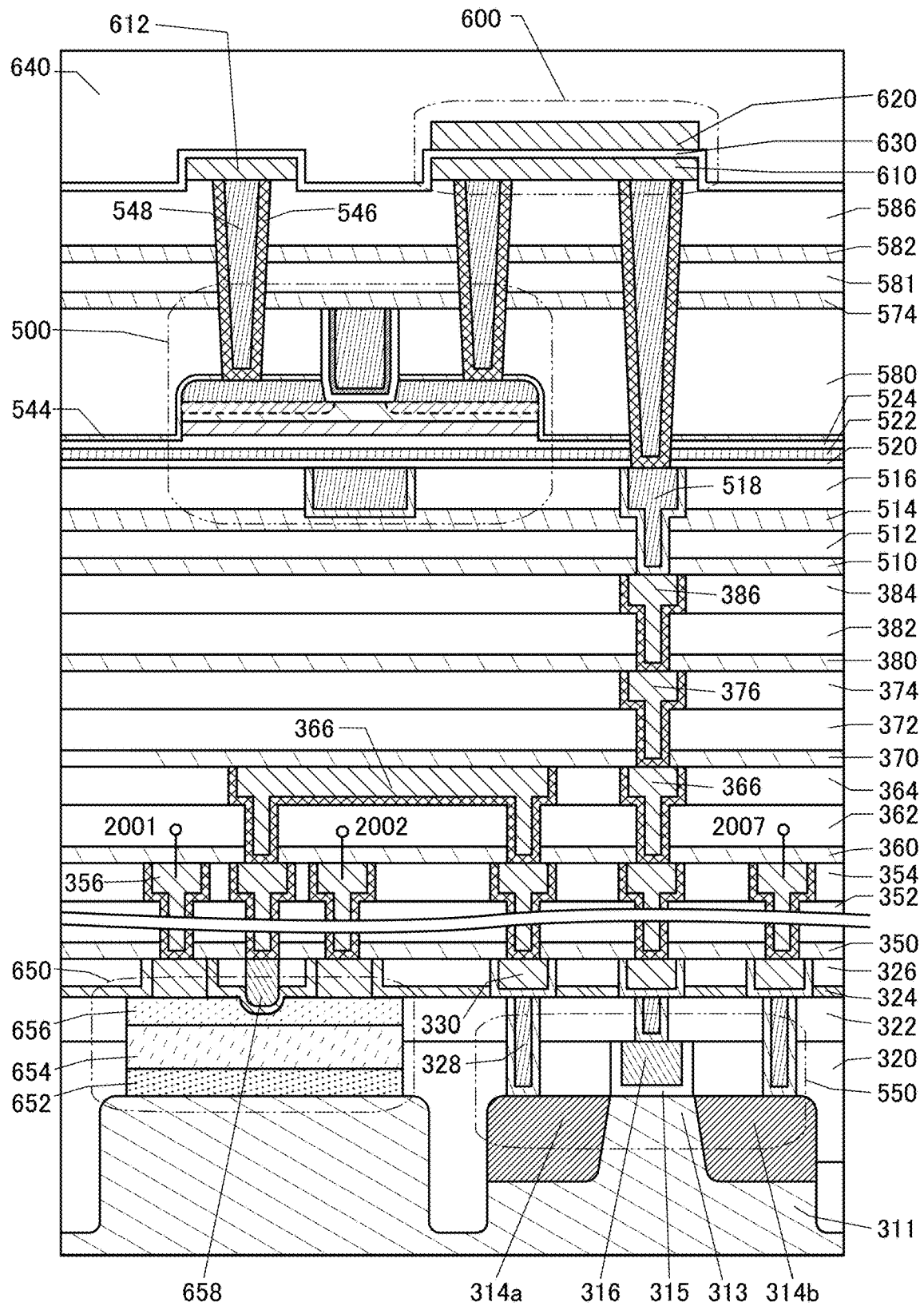
FIG. 20 is a diagram illustrating a structure example of a semiconductor device.

FIG. 20 illustrates an example where the transistor 550 is connected to the transistor 650 through the conductor 366. Note that the wiring for connection between the transistor 550 and the transistor 650 is not limited to the conductor 366.

Although the wiring layer including the conductor 356, the wiring layer including the conductor 366, the wiring layer including the conductor 376, and the wiring layer including the conductor 386 are described above, the semiconductor device of this embodiment is not limited thereto. Three or less wiring layers that are similar to the wiring layer including the conductor 356 may be provided, or five or more wiring layers that are similar to the wiring layer including the conductor 356 may be provided.

An insulator 510, an insulator 512, an insulator 514, and an insulator 516 are stacked sequentially over the insulator 384. A substance having a barrier property against oxygen or hydrogen is preferably used for any of the insulator 510, the insulator 512, the insulator 514, and the insulator 516.

For example, each of the insulator 510 and the insulator 514 is preferably formed using a film having a barrier property that can prevent diffusion of hydrogen and impurities from the substrate 311, a region where the transistor 550 is provided, a region where the transistor 650 is provided, or the like into a region where the transistor 500 is provided. Therefore, each of the insulator 510 and the insulator 514 can be formed using a material similar to that for the insulator 324.

For the film having a barrier property against hydrogen, for example, silicon nitride deposited by a CVD method can be used. Here, diffusion of hydrogen into a semiconductor element including an oxide semiconductor, such as the transistor 500, degrades the characteristics of the semiconductor element in some cases. Therefore, a film that inhibits hydrogen diffusion is preferably provided between the transistor 500 and the transistor 550 or the transistor 650. Specifically, the film that inhibits hydrogen diffusion is a film from which a small amount of hydrogen is released.

For the film having a barrier property against hydrogen, for example, a metal oxide such as aluminum oxide, hafnium oxide, or tantalum oxide is preferably used for each of the insulator 510 and the insulator 514.

In particular, aluminum oxide has an excellent blocking effect that prevents both oxygen and impurities such as hydrogen and moisture, which can cause a change in electrical characteristics of the transistor, from passing through the film. Accordingly, the use of aluminum oxide can prevent entry of impurities such as hydrogen and moisture into the transistor 500 during and after a manufacturing process of the transistor. In addition, release of oxygen from the oxide included in the transistor 500 can be inhibited. Therefore, aluminum oxide is suitably used as a protective film for the transistor 500.

The insulator 512 and the insulator 516 can be formed using a material similar to that for the insulator 320, for example. In the case where a material with a relatively low dielectric constant is used for these insulators, the parasitic capacitance between wirings can be reduced. A silicon oxide film or a silicon oxynitride film can be used for the insulator 512 and the insulator 516, for example.

A conductor 518, a conductor included in the transistor 500 (e.g., a conductor 503), and the like are embedded in the insulator 510, the insulator 512, the insulator 514, and the insulator 516. Note that the conductor 518 has a function of a plug or a wiring that is connected to the capacitor 600, the transistor 550, or the transistor 650. The conductor 518 can be provided using a material similar to that for the conductor 328 and the conductor 330.

In particular, the conductor 518 in a region in contact with the insulator 510 and the insulator 514 is preferably a conductor having a barrier property against oxygen, hydrogen, and water. In such a structure, the transistor 550 or the transistor 650 can be separated from the transistor 500 with a layer having a barrier property against oxygen, hydrogen, and water, so that the hydrogen diffusion from the transistor 550 or the transistor 650 into the transistor 500 can be inhibited.

The transistor 500 is provided above the insulator 516.

As illustrated in FIG. 17A and FIG. 17B, the transistor 500 includes the conductor 503 placed to be embedded in the insulator 514 and the insulator 516, an insulator 520 placed over the insulator 516 and the conductor 503, an insulator 522 placed over the insulator 520, an insulator 524 placed over the insulator 522, an oxide 530a placed over the insulator 524, an oxide 530b placed over the oxide 530a, a conductor 542a and a conductor 542b placed apart from each other over the oxide 530b, an insulator 580 that is placed over the conductor 542a and the conductor 542b and has an opening overlapping with a region between the conductor 542a and the conductor 542b, an insulator 545 placed on a bottom surface and a side surface of the opening, and a conductor 560 placed on the formation surface of the insulator 545.

As illustrated in FIG. 17A and FIG. 17B, an insulator 544 is preferably placed between the insulator 580 and the oxide 530a, the oxide 530b, the conductor 542a, and the conductor 542b. In addition, as illustrated in FIG. 17A and FIG. 17B, the conductor 560 preferably includes a conductor 560a provided inside the insulator 545 and a conductor 560b embedded inside the conductor 560a. Moreover, as illustrated in FIG. 17A and FIG. 17B, an insulator 574 is preferably placed over the insulator 580, the conductor 560, and the insulator 545.

In this specification and the like, the oxide 530a and the oxide 530b are sometimes collectively referred to as the oxide 530. The conductor 542a and the conductor 542b are sometimes collectively referred to as the conductor 542.

The transistor 500 has, in the region where the channel is formed and its vicinity, a structure in which two layers, the oxide 530a and the oxide 530b, are stacked; however, one embodiment of the present invention is not limited thereto. For example, a single layer of the oxide 530b or a stacked-layer structure of three or more layers may be provided.

Although the conductor 560 has a two-layer structure in the transistor 500, the present invention is not limited thereto. For example, the conductor 560 may have a single-layer structure or a stacked-layer structure of three or more layers. The transistor 500 illustrated in FIG. 15, FIG. 16, FIG. 17A, and FIG. 20 is just an example and is not limited to the structure illustrated therein, and an appropriate transistor can be used in accordance with a circuit structure, a driving method, or the like.

Here, the conductor 560 functions as a gate electrode of the transistor, and the conductor 542a and the conductor 542b each function as a source electrode or a drain electrode. As described above, the conductor 560 is embedded in the opening of the insulator 580 and the region between the conductor 542a and the conductor 542b. The positions of the conductor 560, the conductor 542a, and the conductor 542b with respect to the opening of the insulator 580 are selected in a self-aligned manner. That is, in the transistor 500, the gate electrode can be placed between the source electrode and the drain electrode in a self-aligned manner. Therefore, the conductor 560 can be formed without an alignment margin, resulting in a reduction of an area occupied by the transistor 500. Accordingly, miniaturization and high integration of the semiconductor device can be achieved.

In addition, since the conductor 560 is formed in the region between the conductor 542a and the conductor 542b in a self-aligned manner, the conductor 560 has neither a region overlapping with the conductor 542a nor a region overlapping with the conductor 542b. Thus, parasitic capacitance formed between the conductor 560 and each of the conductor 542a and the conductor 542b can be reduced. As a result, the transistor 500 can have increased switching speed and excellent frequency characteristics.

The conductor 560 functions as a first gate (also referred to as a top gate) electrode in some cases. The conductor 503 functions as a second gate (also referred to as a bottom gate) electrode in some cases. In that case, by changing a voltage applied to the conductor 503 independently of a voltage applied to the conductor 560, the threshold voltage of the transistor 500 can be controlled. In particular, the threshold voltage of the transistor 500 can be higher than 0 V and the off-state current can be reduced by applying a negative voltage to the conductor 503. Thus, a drain current at the voltage application of 0 V to the conductor 560 can be smaller in the case where a negative voltage is applied to the conductor 503 than in the case where the negative voltage is not applied to the conductor 503.

The conductor 503 is provided to overlap with the oxide 530 and the conductor 560. Accordingly, in the case where voltages are applied to the conductor 560 and the conductor 503, an electric field generated from the conductor 560 and an electric field generated from the conductor 503 are connected, thereby covering the channel formation region formed in the oxide 530.

In this specification and the like, a transistor structure in which a channel formation region is electrically surrounded by the electric fields of a pair of gate electrodes (a first gate electrode and a second gate electrode) is referred to as a surrounded channel (S-channel) structure. Furthermore, in this specification and the like, the S-channel structure has a feature in that the side surface and the vicinity of the oxide 530 in contact with the conductor 542a and the conductor 542b functioning as the source electrode and the drain electrode are of I-type like the channel formation region. The side surface and the vicinity of the oxide 530 in contact with the conductor 542a and the conductor 542b are in contact with the insulator 544 and thus can be of I-type like the channel formation region. Note that in this specification and the like, "I-type" can be equated with "highly purified intrinsic" to be described later. The S-channel structure disclosed in this specification and the like is different from a Fin structure or a planar structure. With the use of the S-channel structure, a transistor with high resistance to a short-channel effect, i.e., a transistor in which a short-channel effect is unlikely to occur, can be obtained.

The conductor 503 has a structure similar to that of the conductor 518; a conductor 503a is formed in contact with an inner wall of the opening in the insulator 514 and the insulator 516, and a conductor 503b is formed further inside. Although the conductor 503a and the conductor 503b are stacked in the transistor 500, one embodiment of the present invention is not limited thereto. For example, the conductor 503 may be provided as a single layer or to have a stacked-layer structure of three or more layers.

The conductor 503a is preferably formed using a conductive material having a function of inhibiting diffusion of impurities such as a hydrogen atom, a hydrogen molecule, a water molecule, and a copper atom (a conductive material through which the above impurities are less likely to pass). Alternatively, the conductor 503a is preferably formed using a conductive material having a function of inhibiting diffusion of oxygen (e.g., at least one of oxygen atoms, oxygen molecules, and the like) (a conductive material through which the above oxygen is less likely to pass). Note that in this specification, a function of inhibiting diffusion of impurities or oxygen means a function of inhibiting diffusion of any one or all of the above impurities and oxygen.

For example, when the conductor 503a has a function of inhibiting diffusion of oxygen, the conductivity of the conductor 503b can be prevented from being lowered because of oxidation.

In the case where the conductor 503 also functions as a wiring, the conductor 503b is preferably formed using a conductive material with high conductivity that contains tungsten, copper, or aluminum as its main component. Although the conductor 503 has a stacked layer of the conductor 503a and the conductor 503b in this embodiment, the conductor 503 may have a single-layer structure.

The insulator 520, the insulator 522, and the insulator 524 have a function of a second gate insulating film.

Here, an insulator containing oxygen more than that in the stoichiometric composition is preferably used as the insulator 524 in contact with the oxide 530. Such oxygen is easily released from the film by heating. In this specification and the like, oxygen released by heating is sometimes referred to as "excess oxygen". That is, a region containing excess oxygen (also referred to as an "excess-oxygen region") is preferably formed in the insulator 524. When such an insulator containing excess oxygen is provided in contact with the oxide 530, oxygen vacancies (Vo) in the oxide 530 can be reduced, leading to an improvement in reliability of the transistor 500. When hydrogen enters the oxygen vacancies in the oxide 530, such defects (hereinafter, referred to as VoH in some cases) serve as donors and generate electrons serving as carriers in some cases. In other cases, bonding of part of hydrogen to oxygen bonded to a metal atom sometimes generates electrons serving as carriers. Thus, a transistor including an oxide semiconductor that contains a large amount of hydrogen is likely to have normally-on characteristics. Moreover, hydrogen in an oxide semiconductor is easily transferred by a stress such as heat or an electric field; thus, a large amount of hydrogen in an oxide semiconductor might reduce the reliability of a transistor. In one embodiment of the present invention, VoH in the oxide 530 is preferably reduced as much as possible so that the oxide 530 becomes a highly purified intrinsic or substantially highly purified intrinsic. In order to obtain such an oxide semiconductor with sufficiently reduced VoH, it is important to remove impurities such as moisture and hydrogen in the oxide semiconductor (this treatment is also referred to as "dehydration" or "dehydrogenation treatment") and supply oxygen to the oxide semiconductor to fill oxygen vacancies (this treatment is also referred to as "oxygen adding treatment"). When an oxide semiconductor with sufficiently reduced impurities such as VoH is used for a channel formation region of a transistor, the transistor can have stable electrical characteristics.

As the insulator including the excess-oxygen region, specifically, an oxide material that releases part of oxygen by heating is preferably used. An oxide that releases oxygen by heating is an oxide film in which the amount of released oxygen converted into oxygen atoms is greater than or equal to $1.0 \times 10^{18}$ atoms/cm$^3$, preferably greater than or equal to $1.0 \times 10^{19}$ atoms/cm$^3$, further preferably greater than or equal to $2.0 \times 10^{19}$ atoms/cm$^3$ or greater than or equal to $3.0 \times 10^{20}$ atoms/cm$^3$ in TDS (Thermal Desorption Spectroscopy) analysis. In the TDS analysis, the film-surface temperature is preferably higher than or equal to 100° C. and lower than or equal to 700° C., or higher than or equal to 100° C. and lower than or equal to 400° C.

One or more of heat treatment, microwave treatment, and RF treatment may be performed in a state in which the insulator including the excess-oxygen region and the oxide 530 are in contact with each other. By the treatment, water or hydrogen in the oxide 530 can be removed. For example, in the oxide 530, dehydrogenation can be performed when a reaction in which a bond of VoH is cut occurs, i.e., a reaction of "VoH→Vo+H" occurs. Part of hydrogen generated at this time is bonded to oxygen to be H$_2$O, and removed from the oxide 530 or an insulator near the oxide 530 in some cases. In other cases, part of hydrogen is gettered by the conductor 542.

For the microwave treatment, for example, an apparatus including a power supply that generates high-density plasma or an apparatus including a power supply that applies RF to the substrate side is suitably used. For example, the use of an oxygen-containing gas and high-density plasma enables high-density oxygen radicals to be generated, and application of the RF to the substrate side allows the oxygen radicals generated by the high-density plasma to be efficiently introduced into the oxide 530 or an insulator in the vicinity of the oxide 530. The pressure in the microwave treatment is higher than or equal to 133 Pa, preferably higher than or equal to 200 Pa, further preferably higher than or equal to 400 Pa. As a gas introduced into an apparatus for performing the microwave treatment, for example, oxygen and argon are used and the oxygen flow rate ratio (O$_2$/(O$_2$+Ar)) is lower than or equal to 50%, preferably higher than or equal to 10% and lower than or equal to 30%.

In a manufacturing process of the transistor 500, the heat treatment is preferably performed with a surface of the oxide 530 exposed. For example, the heat treatment is performed at a temperature higher than or equal to 100° C. and lower than or equal to 450° C., preferably higher than or equal to 350° C. and lower than or equal to 400° C. The heat treatment is performed in a nitrogen gas atmosphere, an inert gas atmosphere, or an atmosphere containing an oxidizing gas at 10 ppm or more, 1% or more, or 10% or more. For example, the heat treatment is preferably performed in an oxygen atmosphere. Accordingly, oxygen can be supplied to the oxide 530 to reduce oxygen vacancies (Vo). The heat treatment may be performed under a reduced pressure. Alternatively, the heat treatment may be performed in such a manner that heat treatment is performed in a nitrogen gas atmosphere or an inert gas atmosphere, and then another heat treatment is performed in an atmosphere containing an oxidizing gas at 10 ppm or more, 1% or more, or 10% or more in order to compensate for released oxygen. Alternatively, the heat treatment may be performed in such a manner that heat treatment is performed in an atmosphere containing an oxidizing gas at 10 ppm or more, 1% or more, or 10% or more, and then another heat treatment is successively performed in a nitrogen gas atmosphere or an inert gas atmosphere.

Note that the oxygen adding treatment performed on the oxide 530 can promote a reaction in which oxygen vacancies in the oxide 530 are filled with supplied oxygen, i.e., a reaction of "Vo+O→null". Furthermore, hydrogen remaining in the oxide 530 reacts with supplied oxygen, so that the hydrogen can be removed as H$_2$O (dehydration). This can inhibit recombination of hydrogen remaining in the oxide 530 with oxygen vacancies and formation of VoH.

In the case where the insulator 524 includes an excess-oxygen region, it is preferable that the insulator 522 have a function of inhibiting diffusion of oxygen (e.g., oxygen atoms and oxygen molecules) (or that the above oxygen be less likely to pass through the insulator 522).

The insulator 522 preferably has a function of inhibiting diffusion of oxygen or impurities, in which case diffusion of oxygen contained in the oxide 530 to the insulator 520 side is prevented. In addition, the conductor 503 can be inhibited from reacting with oxygen contained in the insulator 524 or the oxide 530.

The insulator 522 preferably has a single-layer structure or a stacked-layer structure using an insulator containing what is called a high-k material such as aluminum oxide, hafnium oxide, an oxide containing aluminum and hafnium (hafnium aluminate), tantalum oxide, zirconium oxide, lead zirconate titanate (PZT), strontium titanate (SrTiO$_3$), or (Ba,Sr)TiO$_3$ (BST), for example. With miniaturization and high integration of a transistor, a problem such as generation of leakage current sometimes arises because of a thin gate insulating film. When a high-k material is used for an insulator functioning as the gate insulating film, a gate voltage at the time of operating the transistor can be reduced while the physical thickness of the gate insulating film is kept.

It is particularly preferable to use an insulator containing an oxide of one or both of aluminum and hafnium, which is an insulating material having a function of inhibiting diffusion of impurities, oxygen, and the like (through which the above oxygen is less likely to pass). Aluminum oxide, hafnium oxide, an oxide containing aluminum and hafnium (hafnium aluminate), or the like is preferably used for the insulator containing an oxide of one or both of aluminum and hafnium. In the case where the insulator 522 is formed using such a material, the insulator 522 functions as a layer that inhibits release of oxygen from the oxide 530 and entry of impurities such as hydrogen from the periphery of the transistor 500 into the oxide 530.

Alternatively, aluminum oxide, bismuth oxide, germanium oxide, niobium oxide, silicon oxide, titanium oxide, tungsten oxide, yttrium oxide, or zirconium oxide may be added to the insulator, for example. Alternatively, the insulator may be subjected to nitriding treatment. Silicon oxide, silicon oxynitride, or silicon nitride may be stacked over the insulator.

It is preferable that the insulator 520 be thermally stable. For example, silicon oxide and silicon oxynitride are suitable because of their thermal stability. Furthermore, combination of an insulator which is a high-k material and silicon oxide or silicon oxynitride enables the insulator 520 to have a stacked-layer structure that is thermally stable and has a high dielectric constant.

Note that the transistor 500 in FIG. 17A and FIG. 17B includes the insulator 520, the insulator 522, and the insulator 524 as the second gate insulating film having a three-layer structure; however, the second gate insulating film may have a single-layer structure or a stacked-layer structure of two layers or four or more layers. In that case, the stacked layers are not necessarily formed of the same material and may be formed of different materials.

In the transistor 500, a metal oxide functioning as an oxide semiconductor is used as the oxide 530 including a channel formation region. Note that the oxide semiconductor preferably contains at least one of In and Zn. For example, as the oxide 530, a metal oxide such as an In-M-Zn oxide (an element M is one or more kinds selected from aluminum, gallium, yttrium, copper, vanadium, beryllium, boron, titanium, iron, nickel, germanium, zirconium, molybdenum, lanthanum, cerium, neodymium, hafnium, tantalum, tungsten, magnesium, and the like) is preferably used.

The metal oxide functioning as an oxide semiconductor may be formed by a sputtering method or an ALD (Atomic Layer Deposition) method. Note that the metal oxide functioning as an oxide semiconductor will be described in detail in another embodiment.

As the metal oxide functioning as the channel formation region in the oxide 530, a metal oxide whose band gap is greater than or equal to 2 eV, preferably greater than or equal to 2.5 eV is preferably used. The use of a metal oxide having such a wide band gap can reduce the off-state current of a transistor.

When the oxide 530a is provided below the oxide 530b in the oxide 530, impurities can be inhibited from diffusing into the oxide 530b from the components formed below the oxide 530a.

The oxide 530 preferably has a plurality of oxide layers that differ in the atomic ratio of metal atoms. Specifically, the atomic ratio of the element M to constituent elements in the metal oxide used as the oxide 530a is preferably greater than the atomic ratio of the element M to constituent elements in the metal oxide used as the oxide 530b. Moreover, the atomic ratio of the element M to In in the metal oxide used as the oxide 530a is preferably greater than the atomic ratio of the element M to In in the metal oxide used as the oxide 530b. Moreover, the atomic ratio of In to the element M in the metal oxide used as the oxide 530b is preferably greater than the atomic ratio of In to the element M in the metal oxide used as the oxide 530a.

The energy of the conduction band minimum of the oxide 530a is preferably higher than the energy of the conduction band minimum of the oxide 530b. In other words, the electron affinity of the oxide 530a is preferably smaller than the electron affinity of the oxide 530b.

Here, the energy level of the conduction band minimum is gradually varied at a junction portion of the oxide 530a and the oxide 530b. In other words, the energy level of the conduction band minimum at a junction portion of the oxide 530a and the oxide 530b is continuously varied or continuously connected. To vary the energy level gradually, the density of defect states in a mixed layer formed at the interface between the oxide 530a and the oxide 530b is preferably made low.

Specifically, when the oxide 530a and the oxide 530b contain the same element (as a main component) in addition to oxygen, a mixed layer with a low density of defect states can be formed. For example, in the case where the oxide 530b is an In-Ga—Zn oxide, it is preferable to use an In-Ga—Zn oxide, a Ga—Zn oxide, gallium oxide, or the like as the oxide 530a.

At this time, the oxide 530b serves as a main carrier path. When the oxide 530a has the above structure, the density of defect states at the interface between the oxide 530a and the oxide 530b can be made low. Thus, the influence of interface scattering on carrier conduction is small, and the transistor 500 can have high on-state current.

The conductor 542a and the conductor 542b functioning as the source electrode and the drain electrode are provided over the oxide 530b. For the conductor 542a and the conductor 542b, it is preferable to use a metal element selected from aluminum, chromium, copper, silver, gold, platinum, tantalum, nickel, titanium, molybdenum, tungsten, hafnium, vanadium, niobium, manganese, magnesium, zirconium, beryllium, indium, ruthenium, iridium, strontium, and lanthanum; an alloy containing any of the above metal elements as its component; an alloy containing a combination of the above metal elements; or the like. For example, tantalum nitride, titanium nitride, tungsten, a nitride containing titanium and aluminum, a nitride containing tantalum and aluminum, ruthenium oxide, ruthenium nitride, an oxide containing strontium and ruthenium, an oxide containing lanthanum and nickel, or the like is preferably used. Tantalum nitride, titanium nitride, a nitride containing titanium and aluminum, a nitride containing tantalum and aluminum, ruthenium oxide, ruthenium nitride, an oxide containing strontium and ruthenium, and an oxide containing lanthanum and nickel are preferable because they are oxidation-resistant conductive materials or materials that retain their conductivity even after absorbing oxygen. Furthermore, a metal nitride film such as tantalum nitride is preferable because it has a barrier property against hydrogen or oxygen.

Although the conductor 542a and the conductor 542b have a single-layer structure in FIG. 17, they may have a stacked-layer structure of two or more layers. For example, a tantalum nitride film and a tungsten film may be stacked. Alternatively, a titanium film and an aluminum film may be stacked. Other examples include a two-layer structure in which an aluminum film is stacked over a tungsten film, a two-layer structure in which a copper film is stacked over a copper-magnesium-aluminum alloy film, a two-layer structure in which a copper film is stacked over a titanium film, and a two-layer structure in which a copper film is stacked over a tungsten film.

Other examples include a three-layer structure where a titanium film or a titanium nitride film is formed, an aluminum film or a copper film is stacked over the titanium film or the titanium nitride film, and a titanium film or a titanium nitride film is formed over the aluminum film or the copper film; and a three-layer structure where a molybdenum film or a molybdenum nitride film is formed, an aluminum film or a copper film is stacked over the molybdenum film or the molybdenum nitride film, and a molybdenum film or a molybdenum nitride film is formed over the aluminum film or the copper film. Note that a transparent conductive material containing indium oxide, tin oxide, or zinc oxide may be used.

As illustrated in FIG. 17A, a region 543a and a region 543b are sometimes formed as low-resistance regions at the interface between the oxide 530 and the conductor 542a (the conductor 542b) and in the vicinity of the interface. In that case, the region 543a functions as one of a source region and a drain region, and the region 543b functions as the other of the source region and the drain region. A channel formation region is formed in a region between the region 543a and the region 543b.

When the conductor 542a (the conductor 542b) is provided in contact with the oxide 530, the oxygen concentration of the region 543a (the region 543b) sometimes decreases. In addition, a metal compound layer that contains the metal contained in the conductor 542a (the conductor 542b) and the component of the oxide 530 is sometimes formed in the region 543a (the region 543b). In that case, the region 543a (the region 543b) has increased carrier density to be a low-resistance region.

The insulator 544 is provided to cover the conductor 542a and the conductor 542b and inhibits oxidation of the conductor 542a and the conductor 542b. Here, the insulator 544 may be provided to cover the side surface of the oxide 530 and to be in contact with the insulator 524.

A metal oxide containing one kind or two or more kinds selected from hafnium, aluminum, gallium, yttrium, zirconium, tungsten, titanium, tantalum, nickel, germanium, neodymium, lanthanum, magnesium, and the like can be used for the insulator 544. For the insulator 544, silicon nitride oxide or silicon nitride can be used, for example.

It is particularly preferable to use, as the insulator 544, an insulator containing an oxide of one or both of aluminum and hafnium, for example, aluminum oxide, hafnium oxide, or an oxide containing aluminum and hafnium (hafnium aluminate). In particular, hafnium aluminate is preferable because it has higher heat resistance than a hafnium oxide film and thus is less likely to be crystallized by heat treatment in a later step. Note that the insulator 544 is not an essential component when the conductor 542a and the conductor 542b are oxidation-resistant materials or do not significantly lose their conductivity even after absorbing oxygen. Design is determined as appropriate in consideration of required transistor characteristics.

The insulator 544 can inhibit impurities such as water and hydrogen contained in the insulator 580 from diffusing into the oxide 530b. Moreover, the oxidation of the conductor 542 due to excess oxygen in the insulator 580 can be inhibited.

The insulator 545 functions as a first gate insulating film. The insulator 545 is preferably formed using an insulator which contains excess oxygen and from which oxygen is released by heating, like the insulator 524.

Specifically, any of silicon oxide, silicon oxynitride, silicon nitride oxide, silicon nitride, silicon oxide to which fluorine is added, silicon oxide to which carbon is added, silicon oxide to which carbon and nitrogen are added, and porous silicon oxide each containing excess oxygen can be used. In particular, silicon oxide and silicon oxynitride, which have thermal stability, are preferable.

When an insulator containing excess oxygen is provided as the insulator 545, oxygen can be effectively supplied from the insulator 545 to the channel formation region of the oxide 530b. As in the insulator 524, the concentration of impurities such as water or hydrogen in the insulator 545 is preferably lowered. The thickness of the insulator 545 is preferably greater than or equal to 1 nm and less than or equal to 20 nm.

Furthermore, in order that excess oxygen contained in the insulator 545 can be efficiently supplied to the oxide 530, a metal oxide may be provided between the insulator 545 and the conductor 560. The metal oxide preferably inhibits diffusion of oxygen from the insulator 545 into the conductor 560. Providing the metal oxide that inhibits diffusion of oxygen inhibits diffusion of excess oxygen from the insulator 545 into the conductor 560. That is, a reduction in the amount of excess oxygen supplied to the oxide 530 can be inhibited. Moreover, oxidization of the conductor 560 due to excess oxygen can be inhibited. The metal oxide can be formed using a material that can be used for the insulator 544.

Note that the insulator 545 may have a stacked-layer structure like the second gate insulating film. With miniaturization and high integration of a transistor, a problem such as generation of leakage current sometimes arises because of a thin gate insulating film. Thus, when an insulator functioning as a gate insulating film has a stacked-layer structure of a high-k material and a thermally stable material, a gate voltage at the time of operating the transistor can be reduced while the physical thickness of the gate insulating film is kept. Furthermore, the stacked-layer structure can be thermally stable and have a high dielectric constant.

Although the conductor 560 functioning as the first gate electrode has a two-layer structure in FIG. 17A and FIG. 17B, the conductor 560 may have a single-layer structure or a stacked-layer structure of three or more layers.

The conductor 560a is preferably formed using a conductive material having a function of inhibiting diffusion of impurities such as a hydrogen atom, a hydrogen molecule, a water molecule, a nitrogen atom, a nitrogen molecule, a nitrogen oxide molecule (e.g., $N_2O$, $NO$, and $NO_2$), and a copper atom. Alternatively, the conductor 560a is preferably formed using a conductive material having a function of inhibiting diffusion of oxygen (e.g., at least one of oxygen atoms, oxygen molecules, and the like). When the conductor 560a has a function of inhibiting diffusion of oxygen, the conductivity of the conductor 560b can be prevented from being lowered because of oxidization due to oxygen contained in the insulator 545. As a conductive material having a function of inhibiting diffusion of oxygen, for example, tantalum, tantalum nitride, ruthenium, or ruthenium oxide is preferably used. The conductor 560a can be formed using an oxide semiconductor that can be used for the oxide 530. In that case, when the conductor 560b is formed by a sputtering method, the conductor 560a can have a reduced electric resistance value and become a conductor. Such a conductor can be referred to as an OC (Oxide Conductor) electrode.

Furthermore, the conductor 560b is preferably formed using a conductive material containing tungsten, copper, or aluminum as its main component. The conductor 560b also functions as a wiring and thus is preferably a conductor having high conductivity. For example, a conductive material containing tungsten, copper, or aluminum as its main component can be used. The conductor 560b may have a stacked-layer structure, for example, a stacked-layer structure of titanium or titanium nitride and the above conductive material.

The insulator 580 is provided over the conductor 542a and the conductor 542b with the insulator 544 therebetween. The insulator 580 preferably includes an excess-oxygen region. For example, the insulator 580 preferably contains silicon oxide, silicon oxynitride, silicon nitride oxide, silicon nitride, silicon oxide to which fluorine is added, silicon oxide to which carbon is added, silicon oxide to which carbon and nitrogen are added, porous silicon oxide, a resin, or the like. In particular, silicon oxide and silicon oxynitride, which have thermal stability, are preferable. Silicon oxide and porous silicon oxide are particularly preferable because an excess-oxygen region can be easily formed in a later step.

The insulator 580 preferably includes an excess-oxygen region. When the insulator 580 from which oxygen is released by heating is provided, oxygen in the insulator 580 can be efficiently supplied to the oxide 530. The concentration of impurities such as water or hydrogen in the insulator 580 is preferably lowered.

The opening of the insulator 580 is formed to overlap with the region between the conductor 542a and the conductor 542b. Thus, the conductor 560 is formed to be embedded in the opening of the insulator 580 and the region between the conductor 542a and the conductor 542b.

The gate length needs to be short for miniaturization of the semiconductor device without a reduction in the conductivity of the conductor 560. When the conductor 560 is made thick to achieve this, the conductor 560 might have a shape with a high aspect ratio. Even when having a shape with a high aspect ratio, the conductor 560 can be formed without collapsing during the process because the conductor 560 is provided to be embedded in the opening of the insulator 580 in this embodiment.

The insulator 574 is preferably provided in contact with a top surface of the insulator 580, atop surface of the conductor 560, and atop surface of the insulator 545. When the insulator 574 is formed by a sputtering method, the insulator 545 and the insulator 580 can include an excess-oxygen region. Therefore, oxygen can be supplied from the excess-oxygen region to the oxide 530.

For example, a metal oxide containing one kind or two or more kinds selected from hafnium, aluminum, gallium, yttrium, zirconium, tungsten, titanium, tantalum, nickel, germanium, magnesium, and the like can be used for the insulator 574.

In particular, aluminum oxide has a high barrier property, and even a thin aluminum oxide film having a thickness greater than or equal to 0.5 nm and less than or equal to 3.0 nm can inhibit diffusion of hydrogen and nitrogen. Thus, aluminum oxide deposited by a sputtering method can serve as not only an oxygen supply source but also a barrier film against impurities such as hydrogen.

The insulator 581 functioning as an interlayer film is preferably provided over the insulator 574. As in the insulator 524 and the like, the concentration of impurities such as water or hydrogen in the insulator 581 is preferably lowered.

A conductor 540a and a conductor 540b are provided in the openings formed in the insulator 581, the insulator 574, the insulator 580, and the insulator 544. The conductor 540a and the conductor 540b are provided to face each other with the conductor 560 therebetween. The conductor 540a and the conductor 540b have a structure similar to that of a conductor 546 and a conductor 548 described later.

An insulator 582 is provided over the insulator 581. A substance having a barrier property against oxygen or hydrogen is preferably used for the insulator 582. Thus, the insulator 582 can be formed using a material similar to that for the insulator 514. For the insulator 582, a metal oxide such as aluminum oxide, hafnium oxide, or tantalum oxide is preferably used, for example.

In particular, aluminum oxide has an excellent blocking effect that prevents both oxygen and impurities such as hydrogen and moisture, which can cause a change in electrical characteristics of the transistor, from passing through the film. Accordingly, the use of aluminum oxide can prevent entry of impurities such as hydrogen and moisture into the transistor 500 during and after a manufacturing process of the transistor. In addition, release of oxygen from the oxide included in the transistor 500 can be inhibited. Therefore, aluminum oxide is suitably used as a protective film for the transistor 500.

An insulator 586 is provided over the insulator 582. The insulator 586 can be formed using a material similar to that for the insulator 320. In the case where a material with a relatively low dielectric constant is used for these insulators, the parasitic capacitance between wirings can be reduced. For example, a silicon oxide film, a silicon oxynitride film, or the like can be used for the insulator 586.

The conductor 546, the conductor 548, and the like are embedded in the insulator 520, the insulator 522, the insulator 524, the insulator 544, the insulator 580, the insulator 574, the insulator 581, the insulator 582, and the insulator 586.

The conductor 546 and the conductor 548 have a function of plugs or wirings that are connected to the capacitor 600, the transistor 500, or the transistor 550. The conductor 546 and the conductor 548 can each be formed using a material similar to that for the conductor 328 and the conductor 330.

After the transistor 500 is formed, an opening may be formed to surround the transistor 500 and an insulator having a high barrier property against hydrogen or water may be formed to cover the opening. Surrounding the transistor 500 by the insulator having a high barrier property can prevent entry of moisture and hydrogen from the outside. Alternatively, a plurality of transistors 500 may be collectively surrounded by the insulator having a high barrier property against hydrogen or water. When an opening is formed to surround the transistor 500, for example, the formation of an opening reaching the insulator 522 or the insulator 514 and the formation of the insulator having a high barrier property in contact with the insulator 522 or the insulator 514 are suitable because these formation steps can also serve as some of the manufacturing steps of the transistor 500. The insulator having a high barrier property against hydrogen or water may be formed using a material similar to that for the insulator 522 or the insulator 514, for example.

Next, the capacitor 600 is provided above the transistor 500. The capacitor 600 includes a conductor 610, a conductor 620, and an insulator 630.

A conductor 612 may be provided over the conductor 546 and the conductor 548. The conductor 612 has a function of a plug or a wiring that is connected to the transistor 500. The conductor 610 has a function of an electrode of the capacitor 600. The conductor 612 and the conductor 610 can be formed in the same process.

The conductor 612 and the conductor 610 can be formed using a metal film containing an element selected from molybdenum, titanium, tantalum, tungsten, aluminum, copper, chromium, neodymium, and scandium; a metal nitride film containing any of the above elements as its component (a tantalum nitride film, a titanium nitride film, a molybdenum nitride film, or a tungsten nitride film); or the like. Alternatively, it is possible to use a conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide to which silicon oxide is added.

The conductor 612 and the conductor 610 each have a single-layer structure in this embodiment; however, the structure is not limited thereto, and a stacked-layer structure of two or more layers may be used. For example, between a conductor having a barrier property and a conductor having high conductivity, a conductor that is highly adhesive to the conductor having a barrier property and the conductor having high conductivity may be formed.

The conductor 620 is provided to overlap with the conductor 610 with the insulator 630 therebetween. Note that the conductor 620 can be formed using a conductive material such as a metal material, an alloy material, or a metal oxide material. It is preferable to use a high-melting-point material that has both heat resistance and conductivity, such as tungsten or molybdenum, and it is particularly preferable to use tungsten. In the case where the conductor 620 is formed in the same process as another component such as a conductor, copper (Cu), aluminum (Al), or the like, which is a low-resistance metal material, may be used.

An insulator 640 is provided over the conductor 620 and the insulator 630. The insulator 640 can be formed using a material similar to that for the insulator 320. The insulator 640 may function as a planarization film that covers a roughness thereunder.

With the use of the structure, a semiconductor device that includes a transistor including an oxide semiconductor can be miniaturized or highly integrated.

Examples of a substrate that can be used for the semiconductor device of one embodiment of the present invention include a glass substrate, a quartz substrate, a sapphire substrate, a ceramic substrate, a metal substrate (e.g., a stainless steel substrate, a substrate including stainless steel foil, a tungsten substrate, and a substrate including tungsten foil), a semiconductor substrate (e.g., a single crystal semiconductor substrate, a polycrystalline semiconductor substrate, and a compound semiconductor substrate), and an SOI (Silicon on Insulator) substrate. Alternatively, a plastic substrate having heat resistance to the processing temperature in this embodiment may be used. Examples of a glass substrate include barium borosilicate glass, aluminosilicate glass, aluminoborosilicate glass, and soda lime glass. Alternatively, crystallized glass or the like can be used.

Alternatively, a flexible substrate, an attachment film, paper including a fibrous material, a base film, or the like can be used as the substrate. As examples of the flexible substrate, the attachment film, the base material film, and the like, the following can be given. Examples include plastics typified by polyethylene terephthalate (PET), polyethylene naphthalate (PEN), polyether sulfone (PES), and polytetrafluoroethylene (PTFE). Another example is a synthetic resin such as acrylic. Other examples include polypropylene, polyester, polyvinyl fluoride, and polyvinyl chloride. Alternatively, polyamide, polyimide, an aramid resin, an epoxy resin, an inorganic vapor deposition film, and paper can be used. Specifically, the use of a semiconductor substrate, a single crystal substrate, an SOI substrate, or the like enables the manufacture of small-sized transistors with a small variation in characteristics, size, shape, or the like and with high current capability. A circuit using such transistors achieves lower power consumption or higher integration.

A flexible substrate may be used as the substrate, and a transistor, a resistor, a capacitor, and/or the like may be formed directly over the flexible substrate. Alternatively, a separation layer may be provided between the substrate and the transistor, the resistor, the capacitor, and/or the like. The separation layer can be used when part or the whole of a semiconductor device formed over the separation layer is separated from the substrate and transferred to another substrate. In such a case, the transistor, the resistor, the capacitor, and/or the like can be transferred to a substrate having low heat resistance or a flexible substrate. As the separation layer, a stack of inorganic films, namely a tungsten film and a silicon oxide film, an organic resin film of polyimide or the like formed over a substrate, or a silicon film containing hydrogen can be used, for example.

That is, a semiconductor device may be formed over one substrate and then transferred to another substrate. Examples of a substrate to which a semiconductor device is transferred include, in addition to the above-described substrates over which transistors can be formed, a paper substrate, a cellophane substrate, an aramid film substrate, a polyimide film substrate, a stone substrate, a wood substrate, a cloth substrate (including a natural fiber (e.g., silk, cotton, or hemp), a synthetic fiber (e.g., nylon, polyurethane, or polyester), a regenerated fiber (e.g., acetate, cupro, rayon, or regenerated polyester), or the like), a leather substrate, and a rubber substrate. With the use of any of these substrates, it is possible to manufacture a flexible semiconductor device or a highly durable semiconductor device, to provide heat resistance, or to reduce a weight or a thickness.

Providing a semiconductor device over a flexible substrate can suppress an increase in weight and can produce a non-breakable semiconductor device.

Modification Example 1 of Transistor

Figure 18A:
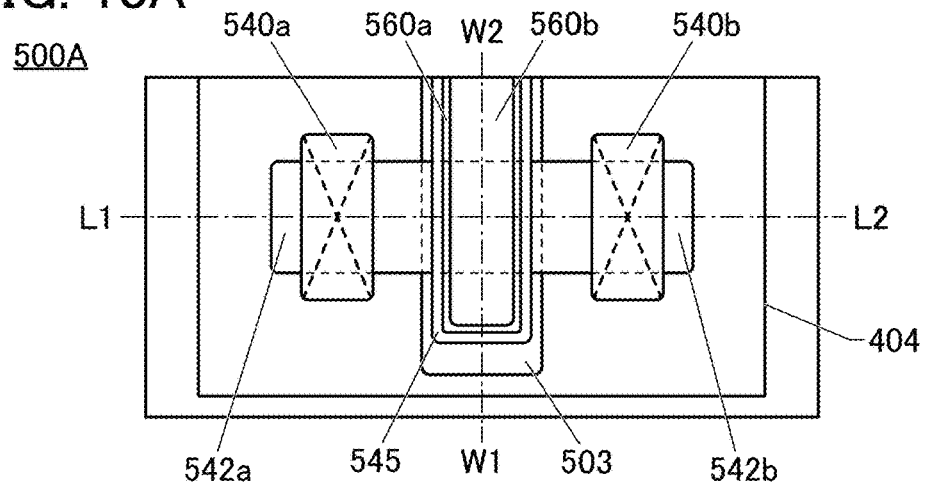
FIG. 18A to FIG. 18C are diagrams illustrating a transistor structure example.
Figure 18B:
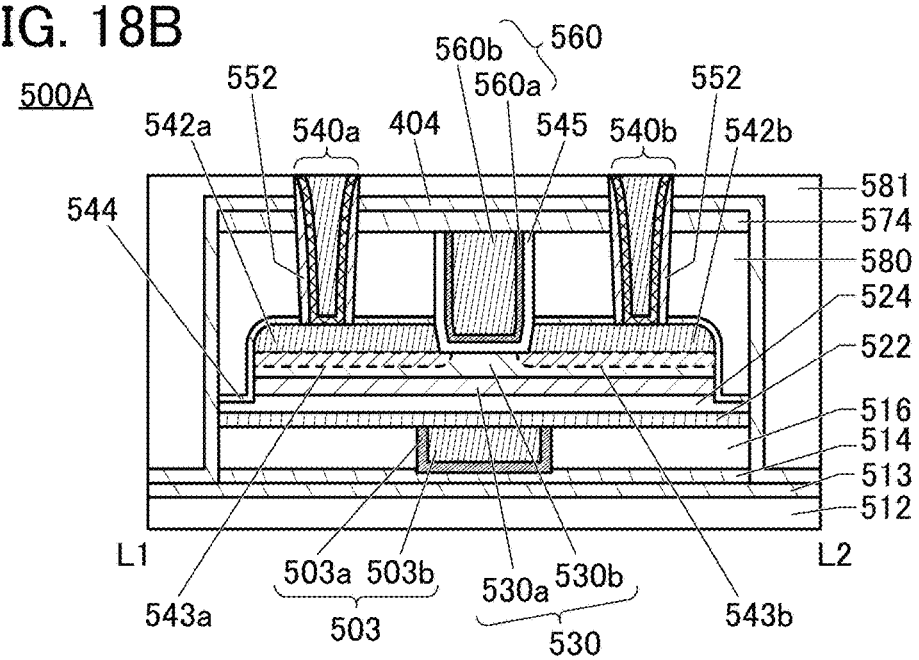
Figure 18C:
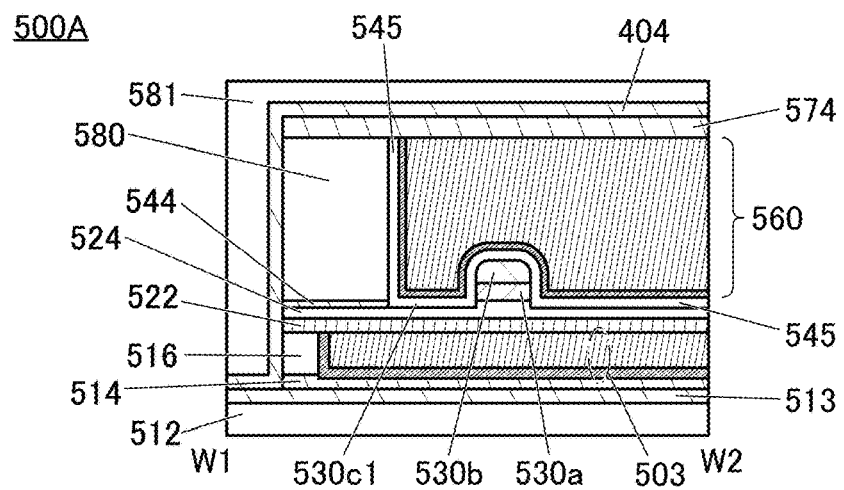

The transistor 500A illustrated in FIG. 18A to FIG. 18C is a modification example of the transistor 500 illustrated in FIG. 17A and FIG. 17B. FIG. 18A is a top view of the transistor 500A, FIG. 18B is a cross-sectional view of the transistor 500A in the channel length direction, and FIG. 18C is a cross-sectional view of the transistor 500A in the channel width direction. The structure illustrated in FIG. 18A to FIG. 18C can be used for other transistors such as the transistor 550 included in the semiconductor device of one embodiment of the present invention.

The transistor 500A illustrated in FIG. 18A to FIG. 18C is different from the transistor 500 illustrated in FIG. 17A and FIG. 17B in including an insulator 552, an insulator 513, and an insulator 404. The transistor 500A is different from the transistor 500 also in that the insulator 552 is provided in contact with a side surface of the conductor 540a and a side surface of the conductor 540b. The transistor 500A is different from the transistor 500 also in not including the insulator 520.

In the transistor 500A having the structure illustrated in FIG. 18A and FIG. 18B, the insulator 513 is provided over the insulator 512. The insulator 404 is provided over the insulator 574 and the insulator 513.

In the transistor 500A illustrated in FIG. 18A and FIG. 18B, the insulator 514, the insulator 516, the insulator 522, the insulator 524, the insulator 544, the insulator 580, and the insulator 574 are patterned and covered with the insulator 404. That is, the insulator 404 is in contact with a top surface of the insulator 574, a side surface of the insulator 574, a side surface of the insulator 580, a side surface of the insulator 544, a side surface of the insulator 524, a side surface of the insulator 522, a side surface of the insulator 516, a side surface of the insulator 514, and a top surface of the insulator 513. Thus, the oxide 530 and the like are isolated from the outside by the insulator 404 and the insulator 513.

The insulator 513 and the insulator 404 preferably have high capability of inhibiting diffusion of hydrogen (e.g., at least one of hydrogen atoms, hydrogen molecules, and the like) or water molecules. For example, the insulator 513 and the insulator 404 are preferably formed using silicon nitride or silicon nitride oxide with a high hydrogen barrier property. This can inhibit diffusion of hydrogen or the like into the oxide 530, thereby inhibiting the degradation of the characteristics of the transistor 500A. Thus, the reliability of the semiconductor device of one embodiment of the present invention can be increased.

The insulator 552 is provided in contact with the insulator 581, the insulator 404, the insulator 574, the insulator 580, and the insulator 544. The insulator 552 preferably has a function of inhibiting diffusion of hydrogen or water molecules. For example, as the insulator 552, an insulator such as silicon nitride, aluminum oxide, or silicon nitride oxide that has a high hydrogen barrier property is preferably used. In particular, silicon nitride is suitably used for the insulator 552 because of its high hydrogen barrier property. The use of a material having a high hydrogen barrier property for the insulator 552 can inhibit diffusion of impurities such as water or hydrogen from the insulator 580 and the like into the oxide 530 through the conductor 540a and the conductor 540b. Furthermore, oxygen contained in the insulator 580 can be inhibited from being absorbed by the conductor 540a and the conductor 540b. In this manner, the reliability of the semiconductor device of one embodiment of the present invention can be increased.

Modification Example 2 of Transistor

Figure 19A:
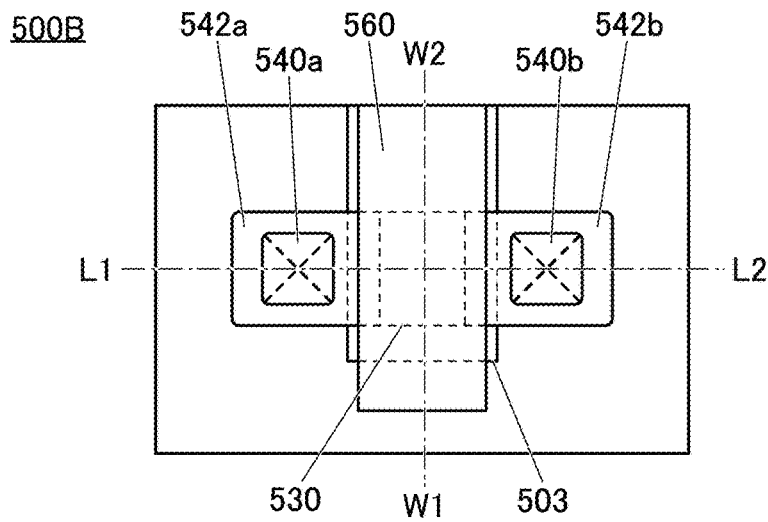
FIG. 19A to FIG. 19C are diagrams illustrating a transistor structure example.
Figure 19B:
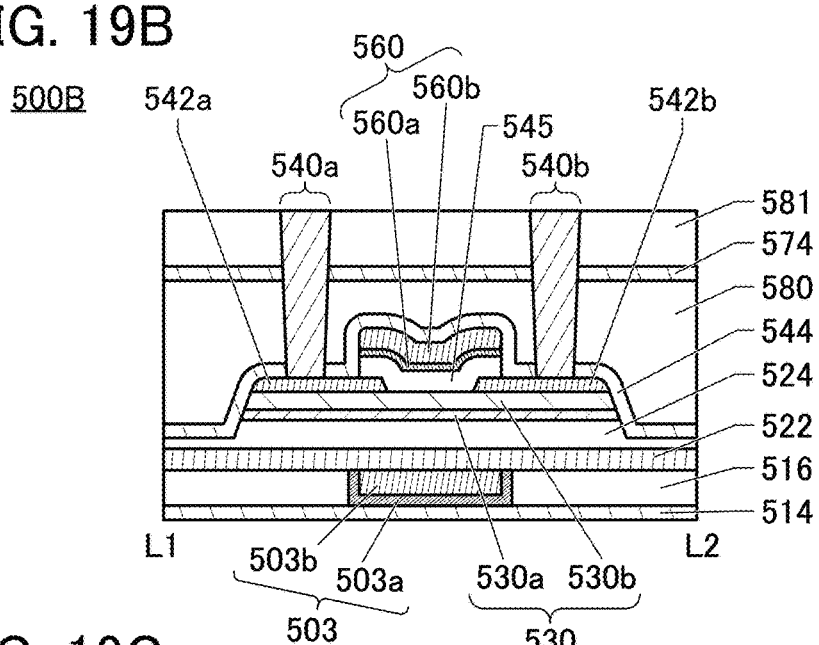
Figure 19C:
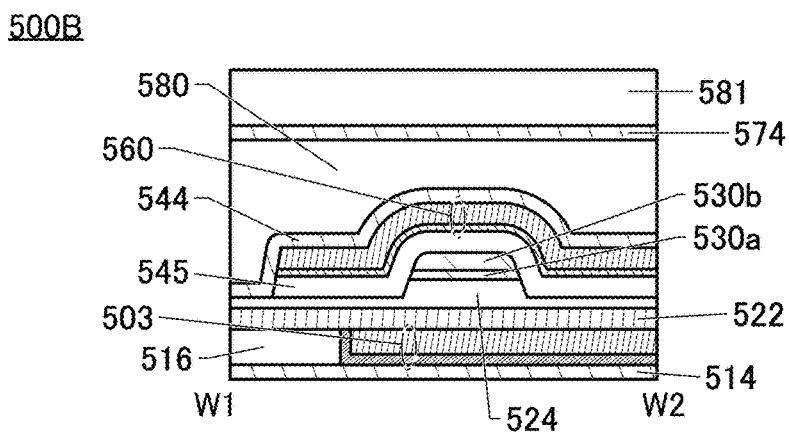

A structure example of a transistor 500B is described with reference to FIG. 19A, FIG. 19B, and FIG. 19C. FIG. 19A is a top view of the transistor 500B. FIG. 19B is a cross-sectional view of a portion indicated by a dashed-dotted line L1-L2 in FIG. 19A. FIG. 19C is a cross-sectional view of a portion indicated by a dashed-dotted line W1-W2 in FIG. 19A. Note that for simplification of the drawing, some components are not illustrated in the top view in FIG. 19A.

The transistor 500B is a modification example of the transistor 500 and can be replaced with the transistor 500. Therefore, differences from the transistor 500 are mainly described to avoid repeated description.

The conductor 560 functioning as the first gate electrode includes the conductor 560a and the conductor 560b over the conductor 560a. The conductor 560a is preferably formed using a conductive material having a function of inhibiting diffusion of impurities such as a hydrogen atom, a hydrogen molecule, a water molecule, and a copper atom. Alternatively, the conductor 560a is preferably formed using a conductive material having a function of inhibiting diffusion of oxygen (e.g., at least one of oxygen atoms, oxygen molecules, and the like).

When the conductor 560a has a function of inhibiting oxygen diffusion, the range of choices for the material of the conductor 560b can be expanded. That is, the conductor 560a inhibits oxidation of the conductor 560b, thereby preventing a decrease in conductivity of the conductor 560b.

The insulator 544 is preferably provided to cover the top surface and the side surface of the conductor 560 and aside surface of the insulator 545. Note that the insulator 544 is preferably formed using an insulating material having a function of inhibiting diffusion of oxygen and impurities such as water or hydrogen. For example, aluminum oxide or hafnium oxide is preferably used. Alternatively, for example, a metal oxide such as magnesium oxide, gallium oxide, germanium oxide, yttrium oxide, zirconium oxide, lanthanum oxide, neodymium oxide, or tantalum oxide; silicon nitride oxide; or silicon nitride can be used.

The insulator 544 can inhibit the oxidation of the conductor 560. In addition, the insulator 544 can inhibit diffusion of impurities such as water and hydrogen contained in the insulator 580 into the transistor 500B.

The transistor 500B has a structure in which the conductor 560 overlaps with part of the conductor 542a and part of the conductor 542b and thus tends to have larger parasitic capacitance than the transistor 500. Thus, the transistor 500B tends to have a lower operation frequency than the transistor 500. However, the transistor 500B does not require a step of embedding the conductor 560, the insulator 545, and the like in the opening formed in the insulator 580 and the like; thus, the productivity of the transistor 500B is higher than that of the transistor 500.

The composition, structure, method, and the like described in this embodiment can be used in combination as appropriate with the compositions, structures, methods, and the like described in the other embodiments, the example, and the like.

Embodiment 4

In this embodiment, an oxide semiconductor, which is one kind of metal oxide, will be described.

A metal oxide preferably contains at least indium or zinc. In particular, indium and zinc are preferably contained. In addition to them, aluminum, gallium, yttrium, tin, or the like is preferably contained. Furthermore, one or more kinds selected from boron, silicon, titanium, iron, nickel, germanium, zirconium, molybdenum, lanthanum, cerium, neodymium, hafnium, tantalum, tungsten, magnesium, cobalt, and the like may be contained.

<Classification of Crystal Structure>

First, the classification of crystal structures of an oxide semiconductor will be described with reference to FIG. 21A. FIG. 21A shows the classification of crystal structures of an oxide semiconductor, typically IGZO (a metal oxide containing In, Ga, and Zn).

As shown in FIG. 21A, an oxide semiconductor is roughly classified into "Amorphous", "Crystalline", and "Crystal". The term "Amorphous" includes completely amorphous. The term "Crystalline" includes CAAC (c-axis-aligned crystalline), nc (nanocrystalline), and CAC (cloud-aligned composite). Note that the term "Crystalline" excludes single crystal, poly crystal, and completely amorphous. The term "Crystal" includes single crystal and poly crystal.

Note that the structures in the thick frame in FIG. 21A are in an intermediate state between "Amorphous" and "Crystal", and belong to a new boundary region (New crystalline phase). In other words, these structures are completely different from "Amorphous", which is energetically unstable, and "Crystal".

A crystal structure of a film or a substrate can be evaluated with an X-ray diffraction (XRD) spectrum. FIG. 21B shows an XRD spectrum, which is obtained by GIXD (Grazing-Incidence XRD) measurement, of a CAAC-IGZO film classified into "Crystalline". Note that the GIXD method is also called a thin film method or a Seemann-Bohlin method. The XRD spectrum that is shown in FIG. 21B and obtained by GIXD measurement is hereinafter simply referred to as an XRD spectrum. The CAAC-IGZO film in FIG. 21B has a composition in the neighborhood of In:Ga:Zn=4:2:3 [atomic ratio]. The CAAC-IGZO film in FIG. 21B has a thickness of 500 nm.

As shown in FIG. 21B, a clear peak indicating crystallinity is observed in the XRD spectrum of the CAAC-IGZO film. Specifically, a peak indicating c-axis alignment is detected at 2θ of around 31° in the XRD spectrum of the CAAC-IGZO film. As shown in FIG. 21B, the peak at 2θ of around 31° is asymmetric with respect to the axis of the angle at which the peak intensity is detected.

A crystal structure of a film or a substrate can also be evaluated with a diffraction pattern obtained by a nanobeam electron diffraction method (NBED) (such a pattern is also referred to as a nanobeam electron diffraction pattern). FIG. 21C shows a diffraction pattern of the CAAC-IGZO film. FIG. 21C shows a diffraction pattern obtained by the NBED method in which an electron beam is incident in the direction parallel to the substrate. The CAAC-IGZO film in FIG. 21C has a composition in the neighborhood of In:Ga:Zn=4:2:3 [atomic ratio]. In the nanobeam electron diffraction method, electron diffraction is performed with a probe diameter of 1 nm.

As shown in FIG. 21C, a plurality of spots indicating c-axis alignment are observed in the diffraction pattern of the CAAC-IGZO film.

<<Oxide Semiconductor Structure>>

Oxide semiconductors might be classified in a manner different from the one in FIG. 21A when classified in terms of the crystal structure. For example, oxide semiconductors are classified into a single crystal oxide semiconductor and a non-single-crystal oxide semiconductor. Examples of the non-single-crystal oxide semiconductor include the above-described CAAC-OS and nc-OS. Other examples of the non-single-crystal oxide semiconductor include a polycrystalline oxide semiconductor, an amorphous-like oxide semiconductor (a-like OS), and an amorphous oxide semiconductor.

Here, the CAAC-OS, the nc-OS, and the a-like OS will be described in detail.

[CAAC-OS]

The CAAC-OS is an oxide semiconductor including a plurality of crystal regions whose c-axes are aligned in a particular direction. Note that the particular direction is the thickness direction of a CAAC-OS film, the normal direction of the surface where the CAAC-OS film is formed, or the normal direction of the surface of the CAAC-OS film. The crystal region has a periodic atomic arrangement. When an atomic arrangement is regarded as a lattice arrangement, the crystal region refers to a region with a regular lattice arrangement. Moreover, in some cases, the CAAC-OS includes a region where a plurality of crystal regions are connected to each other in the a-b plane direction, and this region has distortion. Note that distortion refers to a portion where the direction of a lattice arrangement changes between a region with a regular lattice arrangement and another region with a regular lattice arrangement in the region where the plurality of crystal regions are connected to each other. That is, the CAAC-OS is an oxide semiconductor that has c-axis alignment and does not have clear alignment in the a-b plane direction.

Note that the plurality of crystal regions are each formed of one or more minute crystals (crystals each of which has a maximum diameter less than 10 nm). The maximum diameter of a crystal region formed of one minute crystal is less than 10 nm. The size of a crystal region formed of a plurality of minute crystals may be approximately several tens of nanometers.

In an In-M-Zn oxide (the element M is one or more kinds selected from aluminum, gallium, yttrium, tin, titanium, and the like), the CAAC-OS tends to have a layered crystal structure (also referred to as a layered structure) in which a layer containing indium (In) and oxygen (hereinafter, an In layer) and a layer containing the element M, zinc (Zn), and oxygen (hereinafter, an (M,Zn) layer) are stacked. Indium and the element M can be replaced with each other. Thus, the (M,Zn) layer contains indium in some cases. The In layer contains the element M in some cases, and contains Zn in other cases. The layered structure is observed as a lattice image in a high-resolution TEM image, for example.

When the CAAC-OS film is subjected to structural analysis by out-of-plane XRD measurement with an XRD apparatus using θ/2θ scanning, for example, a peak indicating c-axis alignment is detected at 2θ of 31° or around 31°. Note that the position of the peak indicating c-axis alignment (the value of 2θ) may change depending on the kind, composition, or the like of the metal element contained in the CAAC-OS.

For example, a plurality of bright spots are observed in the electron diffraction pattern of the CAAC-OS film. Note that one spot and another spot are observed point-symmetrically with a spot of the incident electron beam passing through a sample (also referred to as a direct spot) as the symmetric center.

When the crystal region is observed from the particular direction, a lattice arrangement in the crystal region is basically a hexagonal lattice arrangement; however, a unit lattice is not always a regular hexagon and is a non-regular hexagon in some cases. A pentagonal lattice arrangement, a heptagonal lattice arrangement, and the like are included in the distortion in some cases. Note that a clear crystal grain boundary (grain boundary) cannot be observed even in the vicinity of the distortion in the CAAC-OS. That is, formation of a crystal grain boundary is inhibited by the distortion of a lattice arrangement. This is probably because the CAAC-OS can tolerate distortion owing to a low density of arrangement of oxygen atoms in the a-b plane direction, an interatomic bond distance changed by substitution of a metal atom, and the like.

A crystal structure in which a clear crystal grain boundary is observed is what is called polycrystal. It is highly probable that the crystal grain boundary becomes a recombination center and traps carriers and thus decreases the on-state current and field-effect mobility of a transistor, for example. Thus, the CAAC-OS in which no clear crystal grain boundary is observed is one of crystalline oxides having a crystal structure suitable for a semiconductor layer of a transistor. Note that Zn is preferably contained to form the CAAC-OS. For example, an In—Zn oxide and an In-Ga—Zn oxide are suitable because they can inhibit generation of a crystal grain boundary as compared with an In oxide.

The CAAC-OS is an oxide semiconductor with high crystallinity in which no clear crystal grain boundary is observed. Thus, in the CAAC-OS, a reduction in electron mobility due to the crystal grain boundary is unlikely to occur. Entry of impurities, formation of defects, or the like might decrease the crystallinity of an oxide semiconductor. This means that the CAAC-OS can be referred to as an oxide semiconductor having small amounts of impurities and defects (e.g., oxygen vacancies). Thus, an oxide semiconductor including the CAAC-OS is physically stable. Accordingly, the oxide semiconductor including the CAAC-OS is resistant to heat and has high reliability. In addition, the CAAC-OS is stable with respect to high temperatures in the manufacturing process (i.e., thermal budget). Accordingly, the use of the CAAC-OS for the OS transistor can extend a degree of freedom of the manufacturing process.

[nc-OS]

In the nc-OS, a microscopic region (e.g., a region with a size greater than or equal to 1 nm and less than or equal to 10 nm, in particular, a region with a size greater than or equal to 1 nm and less than or equal to 3 nm) has a periodic atomic arrangement. In other words, the nc-OS includes a minute crystal. Note that the size of the minute crystal is, for example, greater than or equal to 1 nm and less than or equal to 10 nm, particularly greater than or equal to 1 nm and less than or equal to 3 nm; thus, the minute crystal is also referred to as a nanocrystal. There is no regularity of crystal orientation between different nanocrystals in the nc-OS. Thus, the orientation in the whole film is not observed. Accordingly, in some cases, the nc-OS cannot be distinguished from an a-like OS or an amorphous oxide semiconductor, depending on an analysis method. For example, when an nc-OS film is subjected to structural analysis by out-of-plane XRD measurement with an XRD apparatus using θ/2θ scanning, a peak indicating crystallinity is not observed. Furthermore, a diffraction pattern like a halo pattern is observed when the nc-OS film is subjected to electron diffraction (also referred to as selected-area electron diffraction) using an electron beam with a probe diameter larger than the diameter of a nanocrystal (e.g., larger than or equal to 50 nm). Meanwhile, in some cases, a plurality of spots in a ring-like region with a direct spot as the center are observed in the obtained electron diffraction pattern when the nc-OS film is subjected to electron diffraction (also referred to as nanobeam electron diffraction) using an electron beam with a probe diameter nearly equal to or smaller than the diameter of a nanocrystal (e.g., larger than or equal to 1 nm and smaller than or equal to 30 nm).

[a-like OS]

The a-like OS is an oxide semiconductor having a structure between those of the nc-OS and the amorphous oxide semiconductor. The a-like OS has a void or a low-density region. That is, the a-like OS has lower crystallinity than the nc-OS and the CAAC-OS. Moreover, the a-like OS has higher hydrogen concentration than the nc-OS and the CAAC-OS.

<<Oxide Semiconductor Structure>>

Next, the above-described CAC-OS will be described in detail. Note that the CAC-OS relates to the material composition.

[CAC-OS]

The CAC-OS refers to one composition of a material in which elements constituting a metal oxide are unevenly distributed with a size greater than or equal to 0.5 nm and less than or equal to 10 nm, preferably greater than or equal to 1 nm and less than or equal to 3 nm, or a similar size, for example. Note that a state in which one or more metal elements are unevenly distributed and regions including the metal element(s) are mixed with a size greater than or equal to 0.5 nm and less than or equal to 10 nm, preferably greater than or equal to 1 nm and less than or equal to 3 nm, or a similar size in a metal oxide is hereinafter referred to as a mosaic pattern or a patch-like pattern.

In addition, the CAC-OS has a composition in which materials are separated into a first region and a second region to form a mosaic pattern, and the first regions are distributed in the film (this composition is hereinafter also referred to as a cloud-like composition). That is, the CAC-OS is a composite metal oxide having a composition in which the first regions and the second regions are mixed.

Note that the atomic ratios of In, Ga, and Zn to the metal elements contained in the CAC-OS in an In-Ga—Zn oxide are denoted by [In], [Ga], and [Zn], respectively. For example, the first region in the CAC-OS in the In-Ga—Zn oxide has [In] higher than [In] in the composition of the CAC-OS film. Moreover, the second region has [Ga] higher than [Ga] in the composition of the CAC-OS film. For example, the first region has higher [In] and lower [Ga] than the second region. Moreover, the second region has higher [Ga] and lower [In] than the first region.

Specifically, the first region includes indium oxide, indium zinc oxide, or the like as its main component. The second region includes gallium oxide, gallium zinc oxide, or the like as its main component. That is, the first region can be rephrased as a region containing In as its main component. The second region can be rephrased as a region containing Ga as its main component.

Note that a clear boundary between the first region and the second region cannot be observed in some cases.

For example, in EDX mapping obtained by energy dispersive X-ray spectroscopy (EDX), it is confirmed that the CAC-OS in the In-Ga—Zn oxide has a composition in which the region containing In as its main component (the first region) and the region containing Ga as its main component (the second region) are unevenly distributed and mixed.

In the case where the CAC-OS is used for a transistor, a switching function (on/off switching function) can be given to the CAC-OS owing to the complementary action of the conductivity derived from the first region and the insulating property derived from the second region. That is, the CAC-OS has a conducting function in part of the material and has an insulating function in another part of the material; as a whole, the CAC-OS has a function of a semiconductor. Separation of the conducting function and the insulating function can maximize each function. Accordingly, when the CAC-OS is used for a transistor, high on-state current (Ion), high field-effect mobility ($\mu$), and excellent switching operation can be achieved.

An oxide semiconductor can have any of various structures that show various different properties. Two or more kinds among the amorphous oxide semiconductor, the polycrystalline oxide semiconductor, the a-like OS, the CAC-OS, the nc-OS, and the CAAC-OS may be included in an oxide semiconductor of one embodiment of the present invention.

<Transistor Including Oxide Semiconductor>

Next, a transistor including the above oxide semiconductor is described.

When the oxide semiconductor is used for a transistor, the transistor can have high field-effect mobility. In addition, the transistor with high reliability can be obtained.

An oxide semiconductor with a low carrier concentration is preferably used for the transistor. For example, the carrier concentration of an oxide semiconductor is lower than or equal to $1\times10^{17}$ cm$^{-3}$, preferably lower than or equal to $1\times10^{15}$ cm$^{\beta3}$, further preferably lower than or equal to $1\times10^{13}$ cm$^{-3}$, still further preferably lower than or equal to $1\times10^{11}$ cm$^{-3}$, yet further preferably lower than $1\times10^{10}$ cm$^{-3}$, and higher than or equal to $1\times10^{-9}$ cm$^{-3}$. In order to reduce the carrier concentration of an oxide semiconductor film, the impurity concentration in the oxide semiconductor film is reduced so that the density of defect states can be reduced. In this specification and the like, a state with a low impurity concentration and a low density of defect states is referred to as a highly purified intrinsic or substantially highly purified intrinsic state. Note that an oxide semiconductor with a low carrier concentration may be referred to as a highly purified intrinsic or substantially highly purified intrinsic oxide semiconductor.

A highly purified intrinsic or substantially highly purified intrinsic oxide semiconductor film has a low density of defect states and thus has a low density of trap states in some cases.

Charges trapped by the trap states in an oxide semiconductor take a long time to disappear and may behave like fixed charges. Thus, a transistor whose channel formation region is formed in an oxide semiconductor having a high density of trap states has unstable electrical characteristics in some cases.

Thus, a reduction in the concentration of impurities in the oxide semiconductor is effective in stabilizing electrical characteristics of the transistor. In order to reduce the concentration of impurities in the oxide semiconductor, the concentration of impurities in an adjacent film is also preferably reduced. Examples of impurities include hydrogen, nitrogen, alkali metal, alkaline earth metal, iron, nickel, and silicon.

<Impurity>

The influence of impurities in the oxide semiconductor is described here.

When silicon or carbon, which is a Group 14 element, is contained in an oxide semiconductor, defect states are formed in the oxide semiconductor. Thus, the concentration of silicon or carbon in the oxide semiconductor and the concentration of silicon or carbon in the vicinity of an interface with the oxide semiconductor (the concentration measured by secondary ion mass spectrometry (SIMS)) are lower than or equal to $2\times10^{18}$ atoms/cm$^3$, preferably lower than or equal to $2\times10^{17}$ atoms/cm$^3$.

When the oxide semiconductor contains alkali metal or alkaline earth metal, defect states are formed and carriers are generated, in some cases. Accordingly, a transistor including an oxide semiconductor that contains alkali metal or alkaline earth metal tends to have normally-on characteristics. Thus, the concentration of alkali metal or alkaline earth metal in the oxide semiconductor measured by SIMS is set lower than or equal to $1\times10^{18}$ atoms/cm$^3$, preferably lower than or equal to $2\times10^{16}$ atoms/cm$^3$.

An oxide semiconductor containing nitrogen easily becomes n-type by generation of electrons serving as carriers and an increase in carrier concentration. Thus, a transistor including an oxide semiconductor that contains nitrogen as the semiconductor tends to have normally-on characteristics. When nitrogen is contained in the oxide semiconductor, trap states are sometimes formed. This might result in unstable electrical characteristics of the transistor. Thus, the concentration of nitrogen in the oxide semiconductor, which is measured by SIMS, is lower than $5\times10^{19}$ atoms/cm$^3$, preferably lower than or equal to $5\times10^{18}$ atoms/cm$^3$, further preferably lower than or equal to $1\times10^{18}$ atoms/cm$^3$, still further preferably lower than or equal to $5\times10^{17}$ atoms/cm$^3$.

Hydrogen contained in an oxide semiconductor reacts with oxygen bonded to a metal atom to be water, and thus causes an oxygen vacancy in some cases. Entry of hydrogen into the oxygen vacancy generates an electron serving as a carrier in some cases. Furthermore, in some cases, bonding of part of hydrogen to oxygen bonded to a metal atom generates an electron serving as a carrier. Thus, a transistor including an oxide semiconductor that contains hydrogen tends to have normally-on characteristics. Accordingly, hydrogen in the oxide semiconductor is preferably reduced as much as possible. Specifically, the hydrogen concentration in the oxide semiconductor measured by SIMS is lower than $1\times10^{20}$ atoms/cm$^3$, preferably lower than $1\times10^{19}$ atoms/cm$^3$, further preferably lower than $5\times10^{18}$ atoms/cm$^3$, still further preferably lower than $1\times10^{18}$ atoms/cm$^3$.

When an oxide semiconductor with sufficiently reduced impurity concentration is used for a channel formation region of a transistor, the transistor can have stable electrical characteristics.

The composition, structure, method, and the like described in this embodiment can be used in combination as appropriate with the compositions, structures, methods, and the like described in the other embodiments, the example, and the like.

Embodiment 5

In this embodiment, application examples of the above-described semiconductor device will be described.

[Semiconductor Wafer and Chip]

Figure 22A:
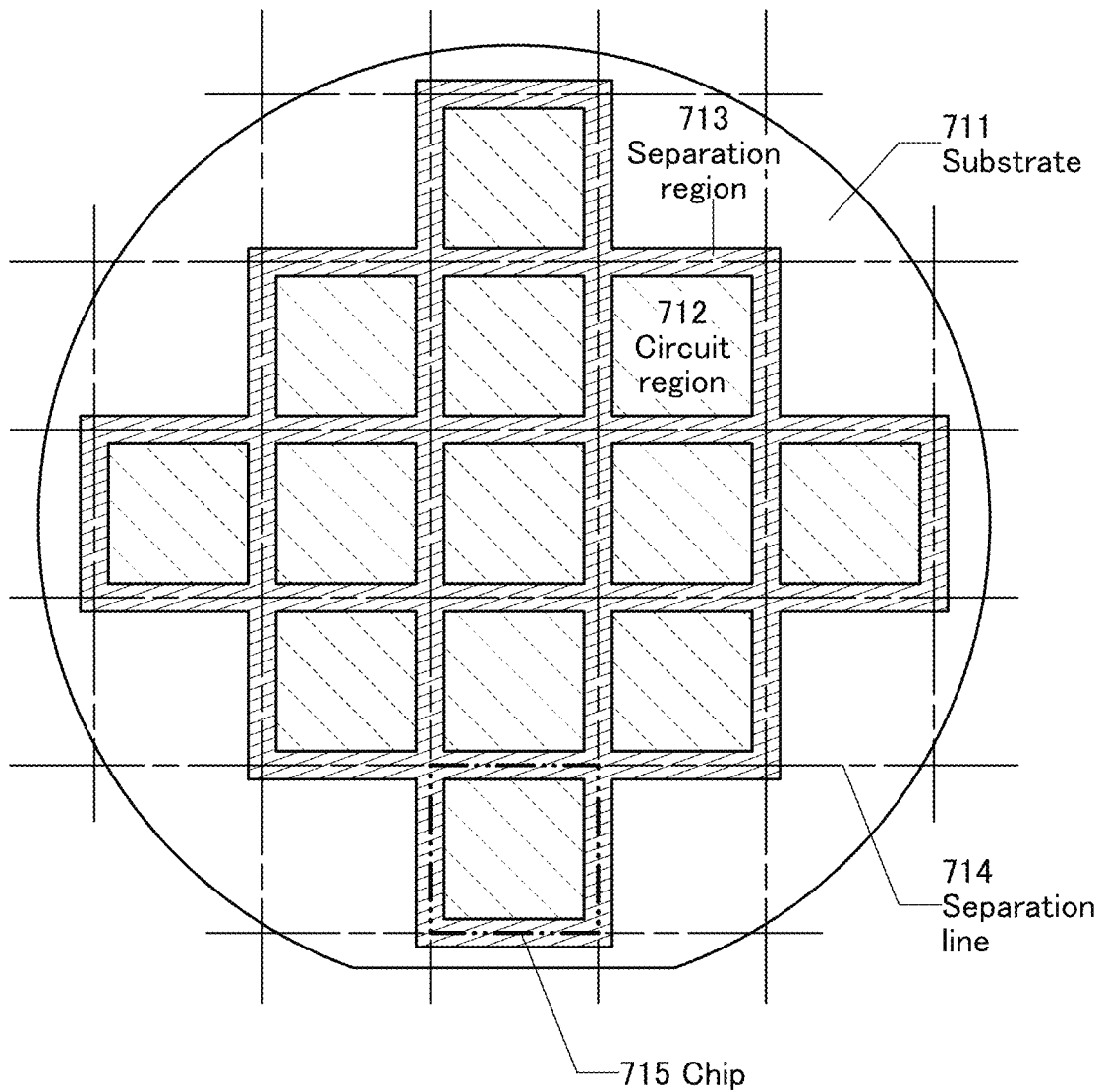
FIG. 22A is a top view of a semiconductor wafer.

FIG. 22A is a top view of a substrate 711 before dicing treatment. As the substrate 711, a semiconductor substrate (also referred to as a "semiconductor wafer") can be used, for example. A plurality of circuit regions 712 are provided on the substrate 711. A semiconductor device, a CPU, an RF tag, an image sensor, or the like of one embodiment of the present invention can be provided in the circuit region 712.

Figure 22B:
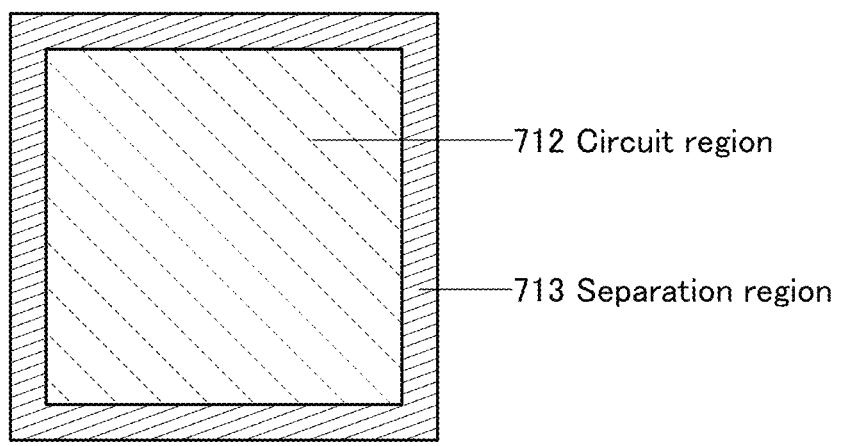
FIG. 22B is an enlarged view of a chip.

The plurality of circuit regions 712 are each surrounded by a separation region 713. Separation lines (also referred to as "dicing lines") 714 are set at a position overlapping with the separation regions 713. The substrate 711 is cut along the separation lines 714, whereby chips 715 including the circuit regions 712 can be cut out from the substrate 711. FIG. 22B is an enlarged view of the chip 715.

A conductor or a semiconductor layer may be provided in the separation regions 713. Providing a conductor or a semiconductor layer in the separation regions 713 relieves ESD that might be caused in a dicing step, preventing a decrease in the yield of the dicing step. A dicing step is generally performed while letting pure water whose specific resistance is decreased by dissolution of a carbonic acid gas or the like flow to a cut portion, in order to cool down a substrate, remove swarf, and prevent electrification, for example. Providing a conductor or a semiconductor layer in the separation regions 713 allows a reduction in the usage of the pure water. Therefore, the cost of manufacturing semiconductor devices can be reduced. Moreover, semiconductor devices can be manufactured with improved productivity.

For a semiconductor layer provided in the separation regions 713, a material having a band gap of 2.5 eV or more and 4.2 eV or less, preferably 2.7 eV or more and 3.5 eV or less is preferably used. The use of such a material allows accumulated charges to be released slowly; thus, the rapid move of charges due to ESD can be suppressed and electrostatic breakdown is less likely to occur.

[Electronic Component]

FIG. 23 shows an example in which the chip 715 is used in an electronic component. Note that the electronic component is also referred to as a semiconductor package or an IC package. For electronic components, there are various standards and names corresponding to a terminal extraction direction and a terminal shape.

An electronic component is completed by combining the semiconductor device described in any of the above embodiments and components other than the semiconductor device in an assembly process (post-process).

Figure 23A:
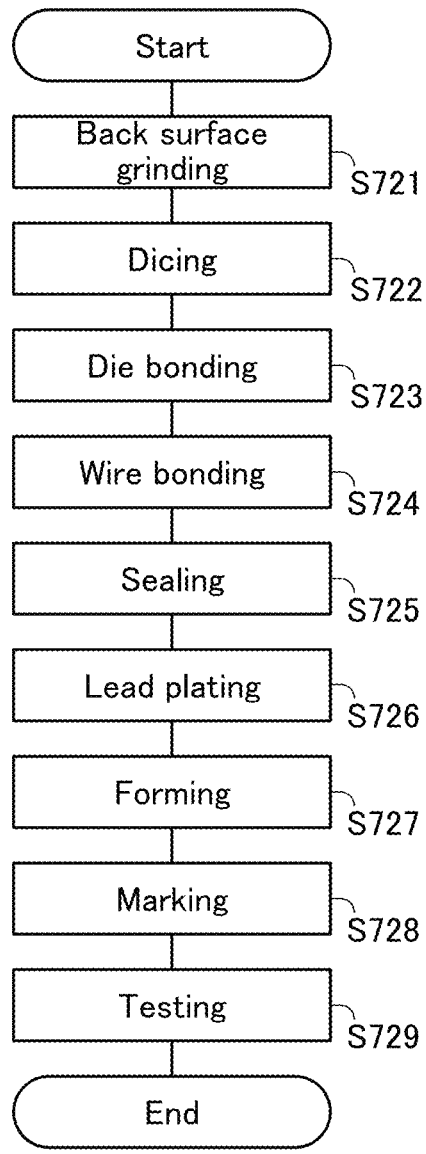
FIG. 23A is a flow chart showing an example of a process for manufacturing an electronic component.

The post-process will be described with reference to a flow chart in FIG. 23A. After an element substrate including the semiconductor device described in the above embodiment is completed in a pre-process, a "back surface grinding step" of grinding a back surface (a surface where a semiconductor device and the like are not formed) of the element substrate is performed (Step S721). When the element substrate is thinned by grinding, warpage or the like of the element substrate is reduced, so that the size of the electronic component can be reduced.

Next, a "dicing step" of dividing the element substrate into a plurality of chips (chips 715) is performed (Step S722). Then, a "die bonding step" of separately picking up the divided chips and bonding the chips onto a lead frame is performed (Step S723). To bond a chip and a lead frame in the die bonding step, a method such as bonding using resin or a tape is selected as appropriate depending on products. Note that the chip may be bonded onto an interposer substrate instead of the lead frame.

Next, a "wire bonding step" of electrically connecting a lead of the lead frame and an electrode on the chip through a metal fine line (wire) is performed (Step S724). A silver line or a gold line can be used as the metal fine line. Ball bonding or wedge bonding can be used as the wire bonding.

The wire-bonded chip is subjected to a "sealing step (molding step)" of sealing the chip with an epoxy resin or the like (Step S725). Through the sealing step, the inside of the electronic component is filled with a resin, so that a circuit portion incorporated in the chip and a wire for connecting the chip to the lead can be protected from external mechanical force, and deterioration of characteristics (a decrease in reliability) due to moisture or dust can be reduced.

Subsequently, a "lead plating step" of plating the lead of the lead frame is performed (Step S726). This plating process prevents rust of the lead and enables more reliable soldering at the time of mounting the electronic component on a printed circuit board in a later step. Then, a "forming step" of cutting and forming of the lead is performed (Step S727).

Next, a "marking step" of printing (marking) on a surface of the package is performed (Step S728). After a "testing step" (Step S729) for checking whether an external shape is good and whether there is a malfunction, for example, the electronic component is completed.

Figure 23B:
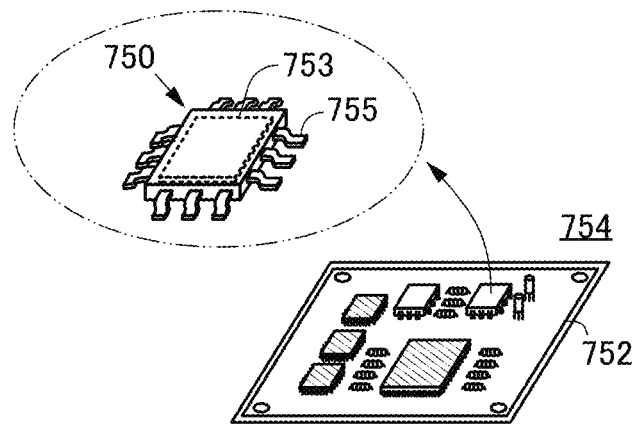
FIG. 23B is a schematic perspective view of an electronic component.

FIG. 23B is a schematic perspective view of a completed electronic component. FIG. 23B is a schematic perspective view illustrating a QFP (Quad Flat Package) as an example of the electronic component. An electronic component 750 illustrated in FIG. 23B includes a lead 755 and a semiconductor device 753. As the semiconductor device 753, the semiconductor device described in any of the above embodiments can be used, for instance.

The electronic component 750 in FIG. 23B is mounted on a printed circuit board 752, for example. A plurality of electronic components 750 are combined and electrically connected to each other over the printed circuit board 752; thus, a substrate on which the electronic components are mounted (a circuit board 754) is completed. The completed circuit board 754 is provided in an electronic device or the like.

[Electronic Device]

Next, examples of electronic devices including the semiconductor device of one embodiment of the present invention or the above-described electronic component will be described.

Examples of electronic devices including the semiconductor device of one embodiment of the present invention or the electronic component include display devices of televisions, monitors, and the like; lighting devices; desktop personal computers; laptop personal computers; word processors; image reproduction devices that reproduce still images and moving images stored in recording media such as DVDs (Digital Versatile Discs); portable CD players; radios; tape recorders; headphone stereos; stereos; table clocks; wall clocks; cordless phone handsets; transceivers; mobile phones; car phones; portable game machines; tablet terminals; large-sized game machines such as pachinko machines; calculators; portable information terminals; electronic notebooks; e-book readers; electronic translators; audio input devices; video cameras; digital still cameras; electric shavers; high-frequency heating appliances such as microwave ovens; electric rice cookers; electric washing machines; electric vacuum cleaners; water heaters; electric fans; hair dryers; air-conditioning systems such as air conditioners, humidifiers, and dehumidifiers; dishwashers; dish dryers; clothes dryers; futon dryers; electric refrigerators; electric freezers; electric refrigerator-freezers; freezers for preserving DNA; flashlights; tools such as chain saws; smoke detectors; and medical equipment such as dialyzers. Other examples include industrial equipment such as guide lights, traffic lights, conveyor belts, elevators, escalators, industrial robots, power storage systems, and power storage devices for leveling the amount of power supply and smart grid.

In addition, moving objects and the like driven by electric motors using electric power from the power storage devices are also included in the category of electronic devices. Examples of the moving objects include electric vehicles (EVs), hybrid electric vehicles (HEVs) that include both an internal-combustion engine and a motor, plug-in hybrid electric vehicles (PHEVs), tracked vehicles in which caterpillar tracks are substituted for wheels of these vehicles, motorized bicycles including motor-assisted bicycles, motorcycles, electric wheelchairs, golf carts, boats, ships, submarines, helicopters, aircraft, rockets, artificial satellites, space probes, planetary probes, and spacecraft.

The semiconductor device of one embodiment of the present invention or the electronic component can be used for a communication device or the like incorporated in the electronic devices.

The electronic devices may include a sensor (a sensor having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared rays), for example.

The electronic devices can have a variety of functions such as a function of displaying a variety of data (a still image, a moving image, a text image, and the like) on a display portion, a touch panel function, a function of displaying a calendar, date, time, and the like, a function of executing a variety of software (programs), a wireless communication function, and a function of reading out a program or data stored in a recording medium, for example.

Figure 24:
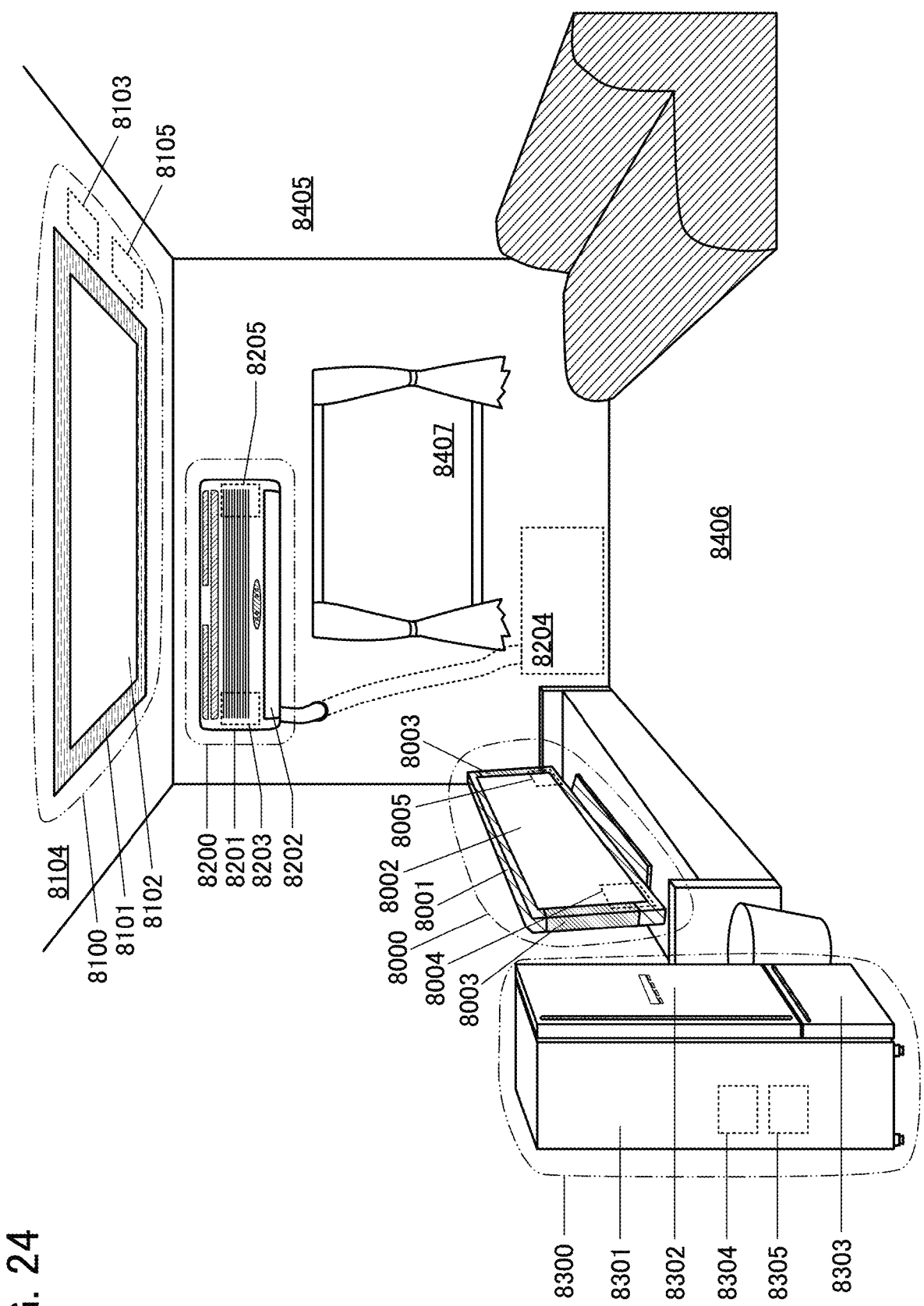
FIG. 24 is a diagram illustrating examples of electronic devices.

FIG. 24 and FIG. 25A to FIG. 25F illustrate examples of electronic devices. In FIG. 24, a display device 8000 is an example of an electronic device including a semiconductor device 8004 of one embodiment of the present invention. Specifically, the display device 8000 corresponds to a display device for TV broadcast reception and includes a housing 8001, a display portion 8002, speaker portions 8003, the semiconductor device 8004, a power storage device 8005, and the like. The semiconductor device 8004 of one embodiment of the present invention is provided in the housing 8001. The semiconductor device 8004 can retain control data, a control program, or the like. The semiconductor device 8004 has a communication function, and the display device 8000 can function as an IoT device. The display device 8000 can receive electric power from a commercial power supply. Alternatively, the display device 8000 can use electric power stored in the power storage device 8005.

A display device such as a liquid crystal display device, a light-emitting display device in which a light-emitting element such as an organic EL element is provided in each pixel, an electrophoresis display device, a DMD (Digital Micromirror Device), a PDP (Plasma Display Panel), or an FED (Field Emission Display) can be used for the display portion 8002.

Note that the display device includes, in its category, all of information display devices for personal computers, advertisement displays, and the like besides TV broadcast reception.

In FIG. 24, an installation lighting device 8100 is an example of an electronic device including a semiconductor device 8103 of one embodiment of the present invention. Specifically, the lighting device 8100 includes a housing 8101, a light source 8102, the semiconductor device 8103, a power storage device 8105, and the like. Although FIG. 24 illustrates the case where the semiconductor device 8103 is provided in a ceiling 8104 on which the housing 8101 and the light source 8102 are installed, the semiconductor device 8103 may be provided in the housing 8101. The semiconductor device 8103 can retain data such as emission luminance of the light source 8102, a control program, or the like. The semiconductor device 8103 has a communication function, and the lighting device 8100 can function as an IoT device. The lighting device 8100 can receive electric power from a commercial power supply. Alternatively, the lighting device 8100 can use electric power stored in the power storage device.

Although FIG. 24 illustrates the installation lighting device 8100 provided in the ceiling 8104 as an example, the semiconductor device of one embodiment of the present invention can be used in an installation lighting device provided in, for example, a wall 8405, a floor 8406, a window 8407, or the like other than the ceiling 8104, or a tabletop lighting device or the like.

As the light source 8102, an artificial light source that emits light artificially by using electric power can be used. Specific examples of the artificial light source include an incandescent lamp, a discharge lamp such as a fluorescent lamp, and light-emitting elements such as an LED and an organic EL element.

In FIG. 24, an air conditioner including an indoor unit 8200 and an outdoor unit 8204 is an example of an electronic device including a semiconductor device 8203 of one embodiment of the present invention. Specifically, the indoor unit 8200 includes a housing 8201, an air outlet 8202, the semiconductor device 8203, a power storage device 8205, and the like. Although FIG. 24 illustrates the case where the semiconductor device 8203 is provided in the indoor unit 8200, the semiconductor device 8203 may be provided in the outdoor unit 8204. Alternatively, the semiconductor devices 8203 may be provided in both the indoor unit 8200 and the outdoor unit 8204. The semiconductor device 8203 can retain control data, a control program, or the like of the air conditioner. The semiconductor device 8203 has a communication function, and the air conditioner can function as an IoT device. The air conditioner can receive electric power from a commercial power supply. Alternatively, the air conditioner can use electric power stored in the power storage device 8205.

Although FIG. 24 illustrates the split-type air conditioner including the indoor unit and the outdoor unit as an example, the semiconductor device of one embodiment of the present invention can be used in a unified-type air conditioner in which the functions of an indoor unit and an outdoor unit are included in one housing.

In FIG. 24, an electric refrigerator-freezer 8300 is an example of an electronic device including a semiconductor device 8304 of one embodiment of the present invention. Specifically, the electric refrigerator-freezer 8300 includes a housing 8301, a refrigerator door 8302, a freezer door 8303, the semiconductor device 8304, a power storage device 8305, and the like. In FIG. 24, the power storage device 8305 is provided in the housing 8301. The semiconductor device 8304 can retain control data, a control program, or the like of the electric refrigerator-freezer 8300. The semiconductor device 8304 has a communication function, and the electric refrigerator-freezer 8300 can function as an IoT device. The electric refrigerator-freezer 8300 can receive electric power from a commercial power supply. Alternatively, the electric refrigerator-freezer 8300 can use electric power stored in the power storage device 8305.

Figure 25A:
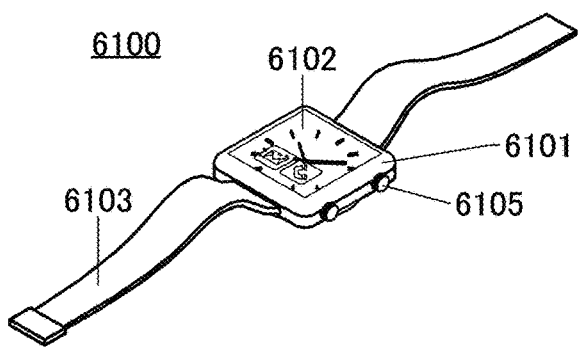
FIG. 25A to FIG. 25F are diagrams illustrating examples of electronic devices.

FIG. 25A illustrates an example of a watch-type portable information terminal. A portable information terminal 6100 includes a housing 6101, a display portion 6102, a band 6103, operation buttons 6105, and the like. The portable information terminal 6100 further includes a secondary battery and the semiconductor device of one embodiment of the present invention or the electronic component. The portable information terminal 6100 including the semiconductor device of one embodiment of the present invention or the electronic component can function as an IoT device.

Figure 25B:
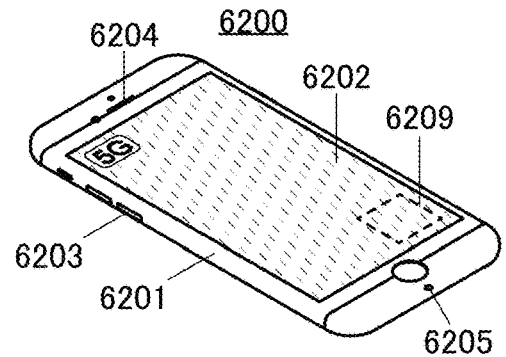

FIG. 25B illustrates an example of a portable telephone. A portable information terminal 6200 includes a display portion 6202 incorporated in a housing 6201, operation buttons 6203, a speaker 6204, a microphone 6205, and the like.

The portable information terminal 6200 further includes a fingerprint sensor 6209 in a region overlapping with the display portion 6202. The fingerprint sensor 6209 may be an organic optical sensor. Since a fingerprint differs between individuals, the fingerprint sensor 6209 can perform personal authentication when acquiring fingerprint patterns. As a light source for acquiring fingerprint patterns with the fingerprint sensor 6209, light emitted from the display portion 6202 can be used.

The portable information terminal 6200 further includes a secondary battery and the semiconductor device of one embodiment of the present invention or the electronic component. The portable information terminal 6200 including the semiconductor device of one embodiment of the present invention or the electronic component can function as an IoT device.

Figure 25C:
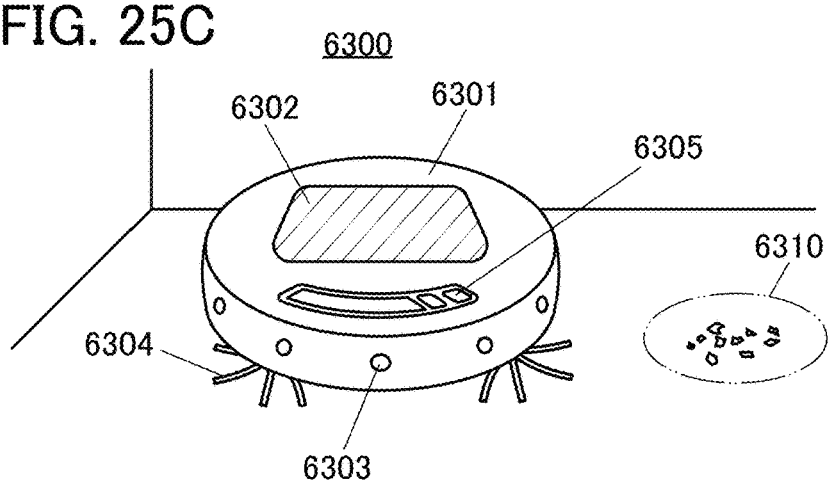

FIG. 25C illustrates an example of a cleaning robot. A cleaning robot 6300 includes a display portion 6302 placed on the top surface of a housing 6301, a plurality of cameras 6303 placed on the side surface of the housing 6301, a brush 6304, operation buttons 6305, a variety of sensors, and the like. Although not illustrated, the cleaning robot 6300 is provided with a tire, an inlet, and the like. The cleaning robot 6300 is self-propelled, detects dust 6310, and sucks up the dust through the inlet provided on the bottom surface.

For example, the cleaning robot 6300 can determine whether there is an obstacle such as a wall, furniture, or a step by analyzing images taken by the cameras 6303. In the case where the cleaning robot 6300 detects an object, e.g. wiring, that is likely to be caught in the brush 6304 by image analysis, the rotation of the brush 6304 can be stopped. The cleaning robot 6300 further includes a secondary battery and the semiconductor device of one embodiment of the present invention or the electronic component. The cleaning robot 6300 including the semiconductor device of one embodiment of the present invention or the electronic component can function as an IoT device.

Figure 25D:
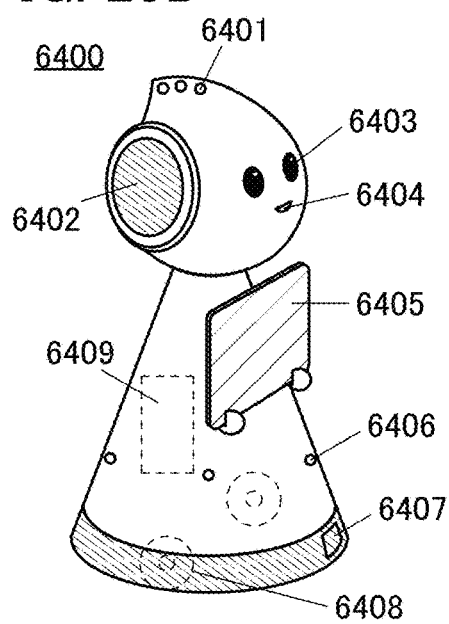

FIG. 25D illustrates an example of a robot. A robot 6400 illustrated in FIG. 25D includes an arithmetic unit 6409, an illuminance sensor 6401, a microphone 6402, an upper camera 6403, a speaker 6404, a display portion 6405, a lower camera 6406, an obstacle sensor 6407, and a moving mechanism 6408.

The microphone 6402 has a function of detecting a speaking voice of a user, an environmental sound, and the like. The speaker 6404 has a function of outputting sound. The robot 6400 can communicate with a user using the microphone 6402 and the speaker 6404.

The display portion 6405 has a function of displaying various kinds of information. The robot 6400 can display information desired by a user on the display portion 6405. The display portion 6405 may be provided with a touch panel. Moreover, the display portion 6405 may be a detachable information terminal, in which case charging and data communication can be performed when the display portion 6405 is set at the home position of the robot 6400.

The upper camera 6403 and the lower camera 6406 have a function of taking an image of the surroundings of the robot 6400. The obstacle sensor 6407 can detect an obstacle in the direction where the robot 6400 advances with the moving mechanism 6408. The robot 6400 can move safely by recognizing the surroundings with the upper camera 6403, the lower camera 6406, and the obstacle sensor 6407. The light-emitting device of one embodiment of the present invention can be used for the display portion 6405.

The robot 6400 further includes a secondary battery and the semiconductor device of one embodiment of the present invention or the electronic component. The robot 6400 including the semiconductor device of one embodiment of the present invention or the electronic component can function as an IoT device.

Figure 25E:
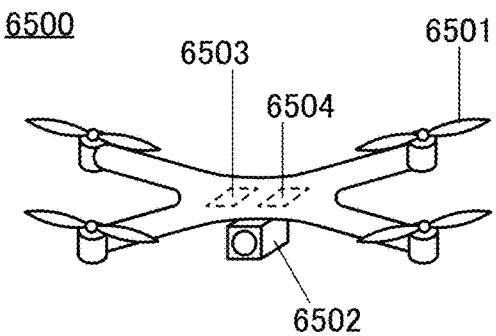

FIG. 25E illustrates an example of a flying object. A flying object 6500 illustrated in FIG. 25E includes propellers 6501, a camera 6502, a battery 6503, and the like and has a function of flying autonomously.

For example, image data taken by the camera 6502 is stored in an electronic component 6504. The electronic component 6504 can analyze the image data to detect whether there is an obstacle in the way of the movement. Moreover, the electronic component 6504 can estimate the remaining battery level from a change in the power storage capacity of the battery 6503. The flying object 6500 further includes the semiconductor device of one embodiment of the present invention or the electronic component. The flying object 6500 including the semiconductor device of one embodiment of the present invention or the electronic component can function as an IoT device.

Figure 25F:
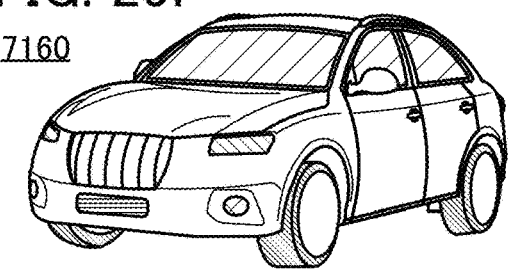

FIG. 25F illustrates an example of an automobile. An automobile 7160 includes an engine, tires, a brake, a steering gear, a camera, and the like. The automobile 7160 further includes the semiconductor device of one embodiment of the present invention or the electronic component. The automobile 7160 including the semiconductor device of one embodiment of the present invention or the electronic component can function as an IoT device.

The composition, structure, method, and the like described in this example can be used in combination as appropriate with the compositions, structures, methods, and the like described in the other embodiments and the example.

Embodiment 6

The use of the OS transistor described in this specification and the like enables a normally-off CPU (also referred to as "Noff-CPU") to be obtained. Note that the Noff-CPU is an integrated circuit including a normally-off transistor, which is in a non-conduction state (also referred to as off state) even when a gate voltage is 0 V.

In the Noff-CPU, power supply to a circuit that does not need to operate can be stopped so that the circuit can be brought into a standby state. The circuit brought into the standby state because of the stop of power supply does not consume power. Thus, the power usage of the Noff-CPU can be minimized. Moreover, the Noff-CPU can retain data necessary for operation, such as setting conditions, for a long time even when power supply is stopped. The return from the standby state requires only restart of power supply to the circuit and does not require rewriting of setting conditions or the like. In other words, high-speed return from the standby state is possible. As described here, the power consumption of the Noff-CPU can be reduced without a significant decrease in operation speed.

The Noff-CPU can be suitably used for a small-scale system such as an IoT (Internet of Things) end device (also referred to as endpoint microcomputer) 803 in the IoT field, for example.

Figure 26:
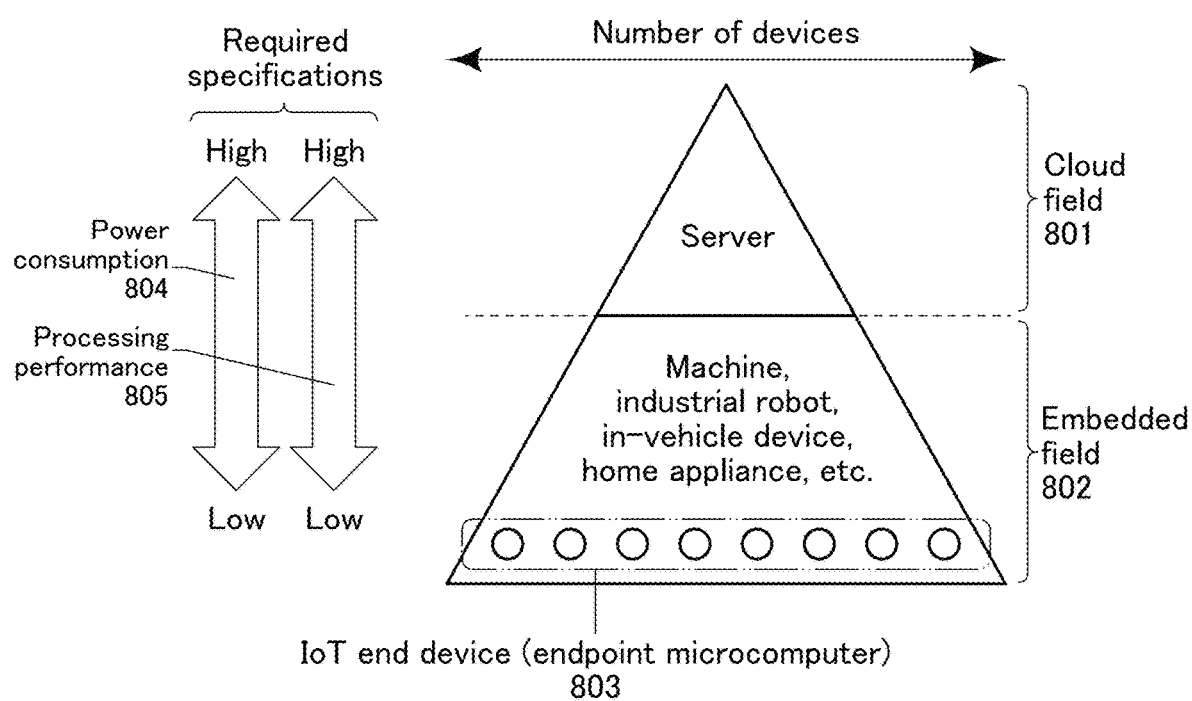
FIG. 26 is a diagram illustrating a hierarchical structure of an IoT network and tendencies of required specifications.

FIG. 26 illustrates a hierarchical structure of an IoT network and tendencies of required specifications. FIG. 26 illustrates power consumption 804 and processing performance 805 as the required specifications. The hierarchical structure of the IoT network is roughly divided into a cloud field 801 at the upper level and an embedded field 802 at the lower level. The cloud field 801 includes a server, for example. The embedded field 802 includes a machine, an industrial robot, an in-vehicle device, and a home appliance, for example.

At the upper level, higher processing performance is required rather than lower power consumption. Thus, a high-performance CPU, a high-performance GPU, a large-scale SoC, and the like are used in the cloud field 801. Furthermore, at the lower level, lower power consumption is required rather than higher processing performance, and the number of devices is explosively increased. The semiconductor device of one embodiment of the present invention can be suitably used for a communication device in the IoT end device that needs to have low power consumption.

Note that an "endpoint" refers to an end region of the embedded field 802. Examples of a device used in the endpoint include microcomputers used in a factory, a home appliance, infrastructure, agriculture, and the like.

Figure 27:
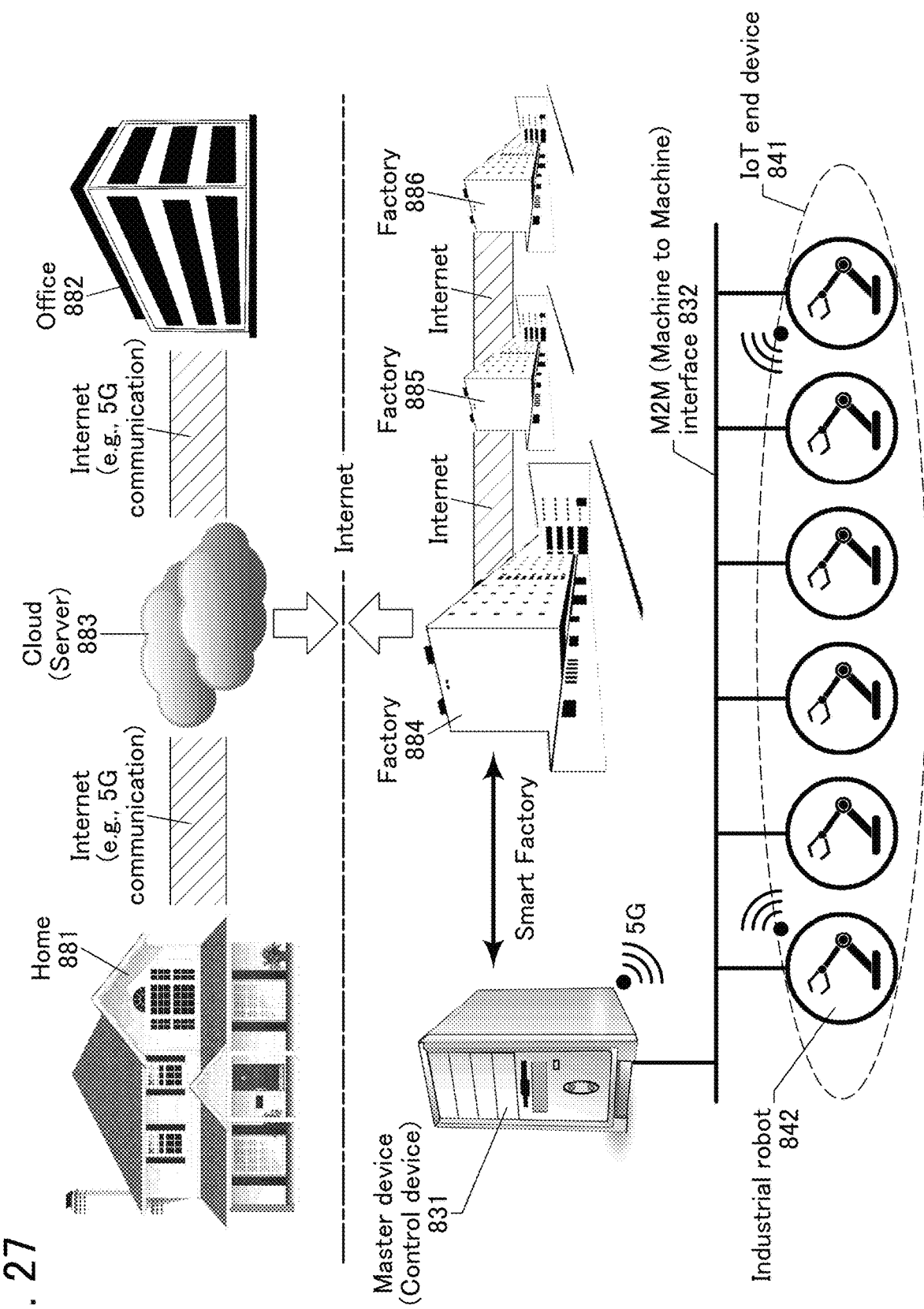
FIG. 27 is a conceptual diagram of factory automation.

FIG. 27 is a conceptual diagram of factory automation as an application example of the endpoint microcomputer. A factory 884 is connected to a cloud 883 through Internet connection. The cloud 883 is connected to a home 881 and an office 882 through Internet connection. The Internet connection may be wired communication or wireless communication. In the case of wireless communication, for example, wireless communication based on a communication standard such as the fourth-generation mobile communication system (4G) or the fifth-generation mobile communication system (5G) can be performed using the semiconductor device of one embodiment of the present invention for a communication device. The factory 884 may be connected to a factory 885 and a factory 886 through Internet connection.

The factory 884 includes a master device (control device) 831. The master device 831 is connected to the cloud 883 and has a function of transmitting and receiving data. The master device 831 is connected to a plurality of industrial robots 842 included in an IoT end device 841 through an M2M (Machine to Machine) interface 832. As the M2M interface 832, for example, industrial Ethernet ("Ethernet" is a registered trademark), which is a kind of wired communication, or local 5G, which is a kind of wireless communication, may be used.

A manager of the factory can check the operational status or the like from the home 881 or the office 882 connected to the factory 884 through the cloud 883. In addition, the manager can check wrong items and part shortage, instruct a storage space, and measure takt time, for example.

In recent years, IoT has been globally introduced into factories, under the name "Smart Factory". Smart Factory has been reported to enable not only simple examination and inspection by an endpoint microcomputer but also detection of failures and prediction of abnormality, for example.

The total power consumption of a small-scale system such as an endpoint microcomputer during operation is often small, which enhances the power reduction effect in a standby state by the Noff-CPU. Although the embedded field of IoT sometimes requires quick response, the use of the Noff-CPU achieves high-speed return from a standby state.

The composition, structure, method, and the like described in this embodiment can be used in combination as appropriate with the compositions, structures, methods, and the like described in the other embodiments, the example, and the like.

Example

In this example, simulation results of the cutoff frequency of an OS-FET which can be used for the semiconductor device of one embodiment of the present invention are described.

The cutoff frequency (fr) of the OS-FET is obtained by Formula 1 below.

[Formula 1]

$$f_T = \frac{g_m}{2\pi C_g} \quad (1)$$

Here, $C_g$ denotes a gate capacitance of the OS-FET and $g_m$ denotes a mutual conductance of the OS-FET. The mutual conductance $g_m$ at a particular drain voltage can be obtained with the use of Formula 2 below.

[Formula 2]

$$g_m = \left(\frac{\partial I_d}{\partial V_g}\right)_{V_d} \quad (2)$$

In Formula 2 above, Vg, Id, and Vd denote a gate voltage, a drain current, and a drain voltage, respectively, of an OS-FET.

Figure 28A:
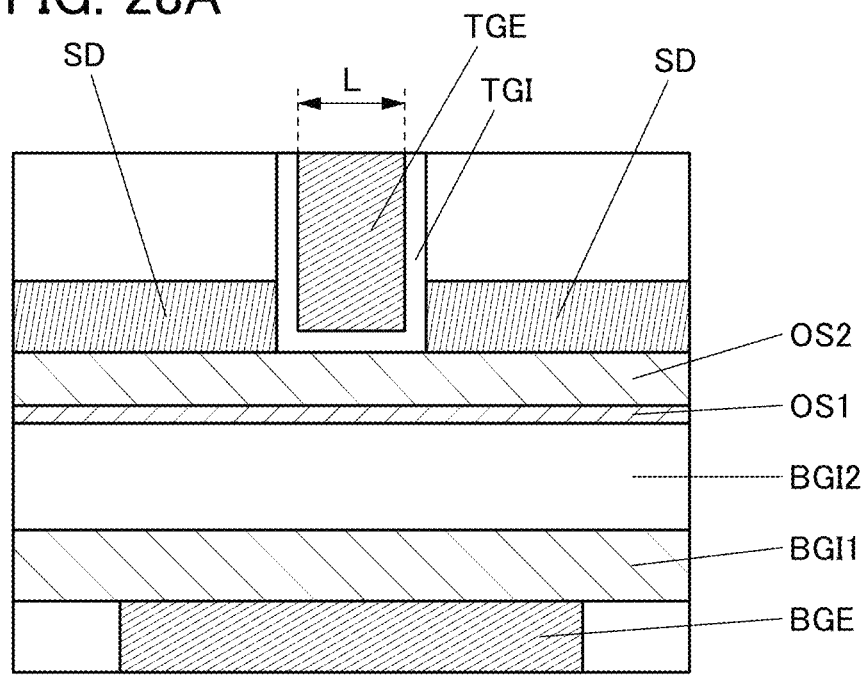
FIG. 28A to FIG. 28C are diagrams illustrating a structure of an OS-FET used for calculation of a cutoff frequency.
Figure 28B:
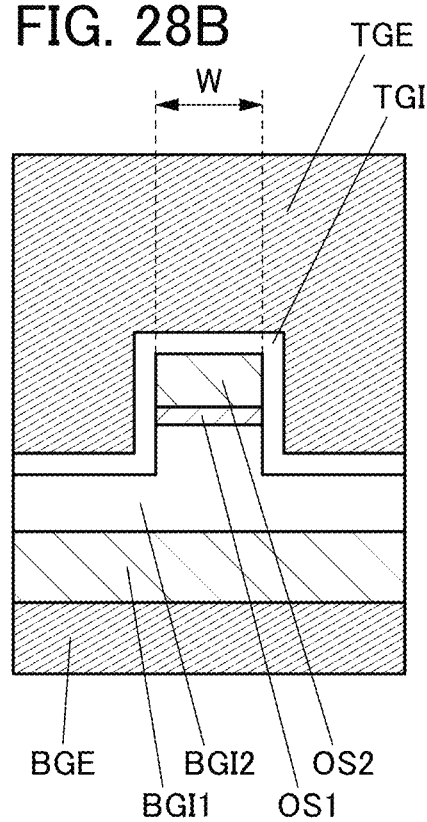
Figure 28C:
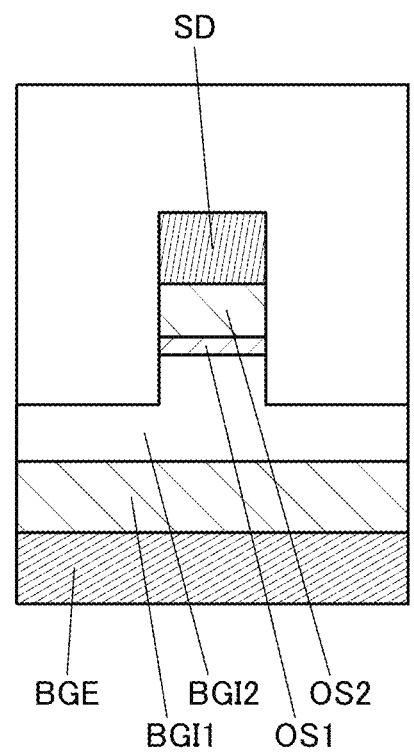

For the calculation of the cutoff frequency, Atlas 3D, a device simulator from Silvaco Inc., was used. FIG. 28A to FIG. 28C illustrate a structure of the OS-FET used for the calculation. FIG. 28A is a schematic cross-sectional view in the L-length direction of a channel center portion of the OS-FET. FIG. 28B is a schematic cross-sectional view in the W-width direction of the channel center portion of the OS-FET. FIG. 28C is a schematic cross-sectional view in the W-width direction of the source region or the drain region of the OS-FET.

In FIG. 28A to FIG. 28C, the OS-FET includes BGE, BGI1, BGI2, OS1, OS2, SD, TGI, and TGE. BGE functions as a back gate electrode and TGE functions as a gate electrode (also referred to as a top gate electrode). OS1 and OS2 are stacked metal oxides. SD functions as one of the source electrode and the drain electrode or the other of the source electrode and the drain electrode. BGI1 and BGI2 function as stacked gate insulating films which are provided between BGE and OS1, and TGI functions as a gate insulating film which is provided between OS2 and TGE.

As OS1, a metal oxide with In:Ga:Zn=1:3:4 [atomic ratio] was used. Furthermore, as OS2, a metal oxide with In:Ga:Zn=4:2:3 [atomic ratio] was used.

In FIG. 28A, L that is a width of TGE denotes a channel length, and in FIG. 28B, W that is a width of OS1 and OS2 denotes a channel width.

Table 1 shows the calculation conditions.

TABLE 1

| Software | Atlas 3D from Silvaco Inc. | | | |
|---|---|---|---|---|
| Structure | L | | 30 | nm |
| | W | | 30 | nm |
| BGE | Work function | | 5.0 | eV |
| | Film thickness | | 20 | nm |
| BGI1 | Dielectric constant | | 16.4 | |
| | Film thickness | | 20 | nm |
| BGI2 | Dielectric constant | | 4.1 | |
| | Film thickness | | 30 | nm |
| TGI | Dielectric constant | | 4.1 | nm |
| | Film thickness | | 6 | nm |
| TGE | Work function | | 4.7 | eV |
| | Film thickness | | 50 | nm |
| SD | Work function | | 4.5 | eV |
| | Film thickness | | 20 | nm |
| OS1 | Electron affinity | | 4.5 | eV |
| IGZO(134) | Eg | | 3.4 | eV |
| | Dielectric constant | | 15 | |
| | Electron mobility | | 1.5 | cm$^2$/Vs |
| | Hole mobility | | 0.01 | cm$^2$/Vs |
| | Nc | | 5E+18 | /cm$^3$ |
| | Nv | | 5E+18 | /cm$^3$ |
| | Film thickness | | 5 | nm |
| OS2 | Electron affinity | | 4.6 | eV |
| IGZO(423) | Eg | | 3.0 | eV |
| | Dielectric constant | | 15 | |
| | Electron mobility | | 8 | cm$^2$/Vs |
| | Hole mobility | | 0.01 | cm$^2$/Vs |
| | Nc | | 5E+18 | /cm$^3$ |

TABLE 1-continued

| Software | Atlas 3D from Silvaco Inc. | | |
|---|---|---|---|
| | Nv | 5E+18 | /cm$^3$ |
| | Film thickness | 15 | nm |
| | Nd in n+ region | 1E+20 | /cm$^3$ |

Figure 29:
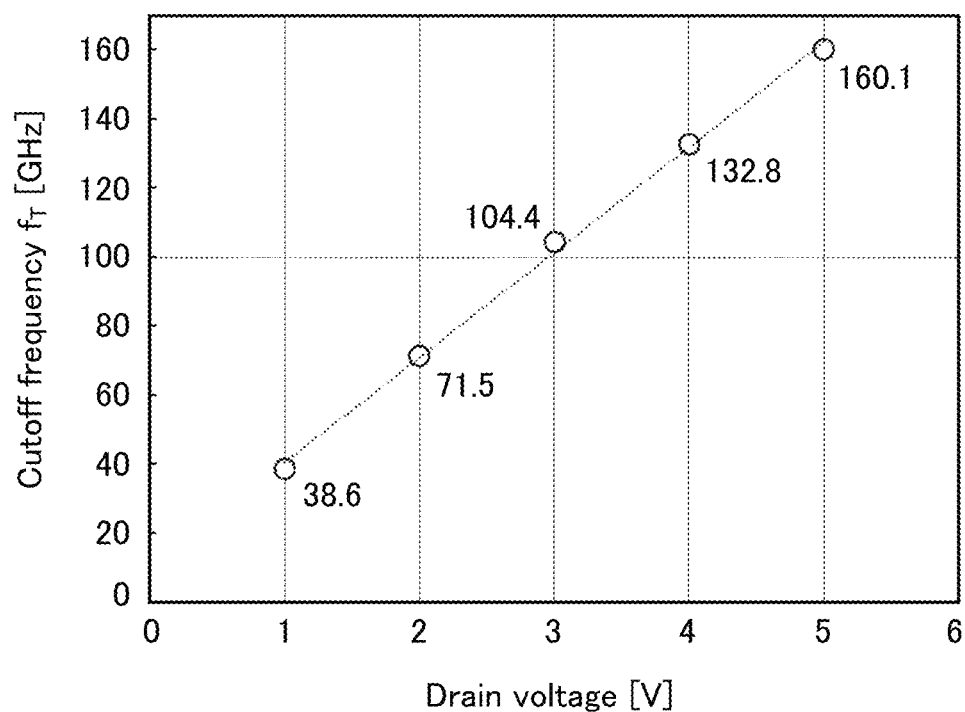
FIG. 29 is a diagram showing calculation results of the cutoff frequency of the OS-FET.

FIG. 29 shows calculation results of the cutoff frequency of the OS-FET obtained under the above conditions. In FIG. 29, the horizontal axis represents the drain voltage (unit: V) of the OS-FET and the vertical axis represents the cutoff frequency $f_T$ (unit: GHz). In the above calculation, the gate voltage and the drain voltage are the same value. The channel length and channel width of the OS-FET were 30 nm and 30 nm, respectively.

From the result of FIG. 29, it is found that the cutoff frequency of the OS-FET at the drain voltage of 1 V is 38.6 GHz; the cutoff frequency of the OS-FET at the drain voltage of 2 V is 71.5 GHz; the cutoff frequency of the OS-FET at the drain voltage of 3 V is 104.4 GHz; the cutoff frequency of the OS-FET at the drain voltage of 4 V is 132.8 GHz; and the cutoff frequency of the OS-FET at the drain voltage of 5 V is 160.1 GHz. The calculation confirms that when the drain voltage is set higher than or equal to 3 V, a cutoff frequency of higher than or equal to 100 GHz can be obtained.

The above calculation result shows that the OS-FET can be favorably used in a semiconductor device of one embodiment of the present invention.

The composition, structure, method, and the like described in this example can be used in combination as appropriate with the compositions, structures, methods, and the like described in the other embodiments and the like.

REFERENCE NUMERALS

C1: capacitor, C2: capacitor, C3: capacitor, CC1: coupling capacitance, CC2: coupling capacitance, CC3: coupling capacitance, CC4: coupling capacitance, CPW2: coplanar waveguide, CPW3: coplanar waveguide, CPW3a: coplanar waveguide, CPW3b: coplanar waveguide, CPW3c: coplanar waveguide, CPW3d: coplanar waveguide, In1: inductor, In2: inductor, In3: inductor, In4: inductor, Tr1: transistor, Tr2: transistor, V1: wiring, V2: wiring, V3: wiring, Z1: impedance matching circuit, Z2: impedance matching circuit, Z2a: impedance matching circuit, Z3: impedance matching circuit, 10: semiconductor device, 10A: semiconductor device, 10B: semiconductor device, 11: antenna array, 11A: antenna, 12: transmission/reception control unit, 12A: transmission/reception control unit, 12B: transmission/reception control unit, 12C: inductor, 13: signal processing unit, 14: processor, 15: GPU, 16: power source control unit, 16A: power source control unit, 16B: power source control unit, 17: PLD, 18: memory device, 18A: memory device, 18B: memory device, 18C: memory device, 18D: memory device, 18E: memory device, 18F: memory device, 18G: memory device, 18H: memory device, 19: display device, 19A: gate driver, 19B: display region, 20: sensor module, 24: capacitor, 111: memory element, 112: transistor, 113: capacitor, 114: node, 115: transistor, 116: transistor, 123: terminal, 124: terminal, 126: wiring, 201: inner conductor, 202a: outer conductor, 202b: outer conductor, 202c: outer conductor, 203a: terminal, 203b: terminal, 203c: terminal, 203d: terminal, 311: substrate, 313: semiconductor region, 314a: low-resistance region, 314b: low-resistance region, 315: insulator, 316: conductor, 320: insulator, 322: insulator, 324: insulator, 326: insulator, 328: conductor, 330: conductor, 350: insulator, 352: insulator, 354: insulator, 356: conductor, 360: insulator, 362: insulator, 364: insulator, 366: conductor, 370: insulator, 372: insulator, 374: insulator, 376: conductor, 380: insulator, 382: insulator, 384: insulator, 386: conductor, 404: insulator, 500: transistor, 500A: transistor, 500B: transistor, 503: conductor, 503a: conductor, 503b: conductor, 510: insulator, 512: insulator, 513: insulator, 514: insulator, 516: insulator, 518: conductor, 520: insulator, 522: insulator, 524: insulator, 530: oxide, 530a: oxide, 530b: oxide, 540a: conductor, 540b: conductor, 542: conductor, 542a: conductor, 542b: conductor, 543a: region, 543b: region, 544: insulator, 545: insulator, 546: conductor, 548: conductor, 550: transistor, 552: insulator, 560: conductor, 560a: conductor, 560b: conductor, 574: insulator, 580: insulator, 581: insulator, 582: insulator, 586: insulator, 600: capacitor, 610: conductor, 612: conductor, 620: conductor, 630: insulator, 640: insulator, 650: transistor, 652: low-temperature buffer layer, 654: semiconductor layer, 656: semiconductor layer, 658: conductor, 711: substrate, 712: circuit region, 713: separation region, 714: separation line, 715: chip, 750: electrical component, 752: printed circuit board, 753: semiconductor device, 754: circuit board, 755: lead, 801: cloud field, 802: field, 804: power consumption, 805: processing performance, 831: master device, 832: interface, 841: IoT end device, 842: industrial robot, 881: home, 882: office, 883: cloud, 884: factory, 885: factory, 886: factory, 900: wireless transceiver, 900A: wireless transceiver, 901: low-noise amplifier, 902: band pass filter, 903: mixer, 904: band pass filter, 905: demodulator, 906: decoder circuit, 911: power amplifier, 911A: power amplifier, 911B: power amplifier, 912: band pass filter, 913: mixer, 914: band pass filter, 915: modulator, 916: decoder circuit, 921: duplexer, 922: local oscillator, 931: antenna, 941: signal, 942: signal, 943: signal, 944: signal, 2001: wiring, 2005: wiring, 2006: wiring, 6100: portable information terminal, 6101: housing, 6102: display portion, 6103: band, 6105: operation button, 6200: portable information terminal, 6201: housing, 6202: display portion, 6203: operation button, 6204: speaker, 6205: microphone, 6209: fingerprint sensor, 6300: cleaning robot, 6301: housing, 6302: display portion, 6303: camera, 6304: brush, 6305: operation button, 6310: dust, 6400: robot, 6401: illuminance sensor, 6402: microphone, 6403: upper camera, 6404: speaker, 6405: display portion, 6406: lower camera, 6407: obstacle sensor, 6408: moving mechanism, 6409: arithmetic device, 6500: flying object, 6501: propeller, 6502: camera, 6503: battery, 6504: electrical component, 7160: automobile, 8000: display device, 8001: housing, 8002: display portion, 8003: speaker portion, 8004: semiconductor device, 8005: power storage device, 8100: lighting device, 8101: housing, 8102: light source, 8103: semiconductor device, 8104: ceiling, 8105: power storage device, 8200: indoor unit, 8201: housing, 8202: air outlet, 8203: semiconductor device, 8204: outdoor unit, 8205: power storage device, 8300: electric refrigerator-freezer, 8301: housing, 8302: refrigerator door, 8303: freezer door, 8304: semiconductor device, 8305: power storage device, 8405: wall, 8406: floor, 8407: window

The invention claimed is:

1. A semiconductor device comprising:
a first layer;
a metal oxide over the first layer; and
a second layer over the metal oxide,
wherein the first layer comprises a first transistor comprising a first semiconductor layer containing silicon,
wherein the second layer comprises an impedance matching circuit, wherein the impedance matching circuit comprises a second transistor comprising a second semiconductor layer containing gallium, wherein the first transistor forms a first coupling capacitance between the first transistor and the metal oxide, wherein the impedance matching circuit forms a second coupling capacitance between the impedance matching circuit and the metal oxide, and wherein the impedance matching circuit is electrically connected to the metal oxide through the second coupling capacitance.

2. The semiconductor device according to claim 1, wherein the metal oxide contains oxygen and at least one of hafnium, aluminum, and tantalum.

3. The semiconductor device according to claim 1, wherein the impedance matching circuit comprises a transmission path, and wherein the transmission path comprises a coplanar waveguide.

4. The semiconductor device according to claim 1, wherein an inductor is above the second transistor, and wherein an antenna is further above the inductor.

5. The semiconductor device according to claim 1, wherein the second transistor is in a position not overlapping with the first transistor.

6. The semiconductor device according to claim 1, wherein a sensor module is on an opposite side of the metal oxide with the first layer therebetween.

* * * * *